United States Patent
Abe et al.

(10) Patent No.: US 11,353,801 B2
(45) Date of Patent: Jun. 7, 2022

(54) MAINTENANCE MANAGEMENT METHOD FOR LITHOGRAPHY SYSTEM, MAINTENANCE MANAGEMENT APPARATUS, AND COMPUTER READABLE MEDIUM

(71) Applicant: Gigaphoton Inc., Tochigi (JP)

(72) Inventors: Kunihiko Abe, Oyama (JP); Yuji Minegishi, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/134,944

(22) Filed: Dec. 28, 2020

(65) Prior Publication Data

US 2021/0117931 A1    Apr. 22, 2021

Related U.S. Application Data

(63) Continuation of application No. PCT/JP2018/029808, filed on Aug. 8, 2018.

(51) Int. Cl.
*G03F 7/20* (2006.01)
*G06Q 10/06* (2012.01)
(Continued)

(52) U.S. Cl.
CPC ...... *G03F 7/70975* (2013.01); *G03F 7/70491* (2013.01); *G03F 7/70508* (2013.01);
(Continued)

(58) Field of Classification Search
CPC .... G03F 7/20; G03F 7/70491; G03F 7/70508; G03F 7/70975; G03F 7/70483–70541;
(Continued)

(56) References Cited

U.S. PATENT DOCUMENTS

| | | | | |
|---|---|---|---|---|
| 5,243,377 A | * | 9/1993 | Umatate | ........... G03F 7/20 355/46 |
| 6,287,023 B1 | * | 9/2001 | Yaegashi | ........... G03D 5/06 396/565 |

(Continued)

FOREIGN PATENT DOCUMENTS

| | | |
|---|---|---|
| JP | 2003-022962 A | 1/2003 |
| JP | 2009-076580 A | 4/2009 |

(Continued)

OTHER PUBLICATIONS

International Search Report issued in PCT/JP2018/029808; dated Oct. 23, 2018.

(Continued)

*Primary Examiner* — Christina A Riddle

(74) *Attorney, Agent, or Firm* — Studebaker & Brackett PC

(57) ABSTRACT

A maintenance management method for a lithography system according to a viewpoint of the present disclosure includes organizing and saving operating information for each of lithography cells that are each an apparatus group formed of a set of apparatuses and form the lithography system, organizing and saving maintenance information on consumables for each of the lithography cells, calculating a standard maintenance timing for each of the consumables for each of the lithography cells based on the operating information and the maintenance information on the consumable for each of the lithography cells, creating a maintenance schedule plan for each of the lithography cells or for each of manufacturing lines based on the standard maintenance timing, information on a downtime, and information on a loss cost due to the downtime for each of the lithography cells or for each of the manufacturing lines, and (Continued)

outputting the result of the creation of the maintenance schedule plan.

20 Claims, 54 Drawing Sheets

(51) Int. Cl.
*G06Q 10/00* (2012.01)
*G06Q 50/04* (2012.01)
*B23K 103/00* (2006.01)
*B23K 26/06* (2014.01)

(52) U.S. Cl.
CPC ....... *G06Q 10/06312* (2013.01); *G06Q 10/20* (2013.01); *G06Q 50/04* (2013.01); *B23K 26/0661* (2013.01); *B23K 2103/56* (2018.08)

(58) Field of Classification Search
CPC ... G03F 7/7055–70583; G03F 7/70591; G03F 7/70991; G03F 7/708; G03F 7/70841; G03F 7/70858; G03F 7/70908–70941; G03F 7/7095; G03F 7/70958; G03F 7/70983; G06Q 10/20; G06Q 10/063; G06Q 10/0631–06311; G06Q 10/06312–06316; G06Q 10/0633; G06Q 10/0637; G06Q 10/0639; G06Q 10/06393; G06Q 50/04; B23K 26/0661; B23K 2103/56
USPC ................... 355/18, 30, 52–55, 67–77, 133; 705/7.22, 7.11–7.21, 7.23, 7.26
See application file for complete search history.

(56) References Cited

U.S. PATENT DOCUMENTS

| | | |
|---|---|---|
| 6,697,695 B1 | 2/2004 | Kurihara et al. |
| 2003/0013213 A1 | 1/2003 | Takano |
| 2003/0049034 A1* | 3/2003 | Inui ........................ B41J 29/393 399/11 |
| 2004/0186609 A1* | 9/2004 | Patel ................... G03F 7/70525 700/121 |
| 2007/0252966 A1 | 11/2007 | Shirata |
| 2009/0185151 A1* | 7/2009 | Yamamoto ........ H01L 21/67733 355/53 |
| 2009/0210278 A1 | 8/2009 | Kamisuwa et al. |
| 2014/0185026 A1* | 7/2014 | Sasaki ................ G03F 7/70558 355/67 |
| 2016/0254634 A1 | 9/2016 | Asayama et al. |

FOREIGN PATENT DOCUMENTS

| | | |
|---|---|---|
| JP | 2009-199596 A | 9/2009 |
| JP | 2009-217718 A | 9/2009 |
| JP | 2011-197894 A | 10/2011 |
| JP | 2012-253383 A | 12/2012 |
| JP | 2013-179109 A | 9/2013 |
| WO | 2006-025302 A1 | 3/2006 |

OTHER PUBLICATIONS

International Preliminary Report on Patentability and Written Opinion issued in PCT/JP2018/029808; dated Feb. 9, 2021.

* cited by examiner

FIG. 8

EXAMPLE OF TABLE DATA IN FILE A

| No. | DATE AND TIME D WHEN DATA ARE ACQUIRED | LITHO CELL #k | | | | | | |
|---|---|---|---|---|---|---|---|---|
| | | NUMBER OF PROCESSED WAFERS Wn IN LITHO CELL #k | NUMBER OF PROCESSED WAFERS PER DAY Wnday IN LITHO CELL #k | EXPOSURE APPARATUS (k) | | LASER APPARATUS (k) | | |
| | | | | NUMBER OF EXPOSURE PULSES Nex | NUMBER OF EXPOSURE PULSES PER DAY Nexday | NUMBER OF OSCILLATION PULSES Np | NUMBER OF OSCILLATION PULSES PER DAY Npday | PULSE ENERGY Ep |
| 1 | D(k,1) | Wn(k,1) | — | Nex(k,1) | — | Np(k,1) | — | Ep(k,1) |
| 2 | D(k,2) | Wn(k,2) | Wnday(k,2) | Nex(k,2) | Nexday(k,1) | Np(k,2) | Npday(k,1) | Ep(k,2) |
| 3 | D(k,3) | Wn(k,3) | Wnday(k,3) | Nex(k,3) | Nexday(k,2) | Np(k,3) | Npday(k,2) | Ep(k,3) |
| . | . | . | . | . | . | . | . | . |
| . | . | . | . | . | . | . | . | . |
| i | D(k,i) | Wn(k,i) | Wnday(k,i-1) | Nex(k,i) | Nexday(k,i-1) | Np(k,i) | Npday(k,i-1) | Ep(k,i) |
| . | . | . | . | . | . | . | . | . |
| j | D(k,j) | Wn(k,j) | Wnday(k,j-1) | Nex(k,j) | Nexday(k,j-1) | Np(k,j) | Npday(k,j-1) | Ep(k,j) |
| | | | Wnday(k) | | Nexday(k) | | Npday(k) | Ep(k) |

FIG. 12

EXAMPLE OF TABLE DATA(1) IN FILE B

| APPARATUS | | EXCHANGE MODULE OR EXCHANGE PART | LIFE PARAMETER | LIFE VALUE Life(k,l,m) | STANDARD MAINTENANCE PERIOD Tmhs(k,l,m) | EXCHANGE COST Cexc(k,l,m) | EXCHANGE COST PER UNIT LIFE Cplife(k,l,m) | LIFE PARAMETER VALUE Pra(k,l,m) | DATE AND TIME WHEN LIFE PARAMETER IS MEASURED Dme(k,l,m) | REMAINING LIFE PARAMETER VALUE Prarl(k,l,m) |
|---|---|---|---|---|---|---|---|---|---|---|
| LITHO CELL #k | C/D APPARATUS (k) l=1 | CHEMICAL FILTER m=1 | OPERATION PERIOD AFTER EXCHANGE | Life(k,1,1) | Tmhs(k,1,1) | Cexc(k,1,1) | Cplife(k,1,1) | Pra(k,1,1) | Dme(k,1,1) | Prarl(k,1,1) |
| | | SUBSTRATE ROTATING MODULE m=2 | NUMBER OF PROCESSED WAFERS AFTER EXCHANGE | Life(k,1,2) | Tmhs(k,1,2) | Cexc(k,1,2) | Cplife(k,1,2) | Pra(k,1,2) | Dme(k,1,2) | Prarl(k,1,2) |
| | | DRAIN RECOVERY MODULE m=3 | NUMBER OF PROCESSED WAFERS AFTER EXCHANGE | Life(k,1,3) | Tmhs(k,1,3) | Cexc(k,1,3) | Cplife(k,1,3) | Pra(k,1,3) | Dme(k,1,3) | Prarl(k,1,3) |
| | | EXCHANGE PART IN WAFER TRANSPORTING LINE m=4 | NUMBER OF PROCESSED WAFERS AFTER EXCHANGE | Life(k,1,4) | Tmhs(k,1,4) | Cexc(k,1,4) | Cplife(k,1,4) | Pra(k,1,4) | Dme(k,1,4) | Prarl(k,1,4) |
| | EXPOSURE APPARATUS (k) l=2 | CHEMICAL FILTER m=1 | OPERATION PERIOD AFTER EXCHANGE | Life(k,2,1) | Tmhs(k,2,1) | Cexc(k,2,1) | Cplife(k,2,1) | Pra(k,2,1) | Dme(k,2,1) | Prarl(k,2,1) |
| | | EXCHANGE PART IN ILLUMINATION OPTICAL SYSTEM m=2 | NUMBER OF EXPOSURE PULSES AFTER EXCHANGE | Life(k,2,2) | Tmhs(k,2,2) | Cexc(k,2,2) | Cplife(k,2,2) | Pra(k,2,2) | Dme(k,2,2) | Prarl(k,2,2) |
| | | EXCHANGE PART IN PROJECTION OPTICAL SYSTEM m=3 | NUMBER OF EXPOSURE PULSES AFTER EXCHANGE | Life(k,2,3) | Tmhs(k,2,3) | Cexc(k,2,3) | Cplife(k,2,3) | Pra(k,2,3) | Dme(k,2,3) | Prarl(k,2,3) |
| | | EXCHANGE PART IN WAFER TRANSPORTING SYSTEM m=4 | NUMBER OF PROCESSED WAFERS AFTER EXCHANGE | Life(k,2,4) | Tmhs(k,2,4) | Cexc(k,2,4) | Cplife(k,2,4) | Pra(k,2,4) | Dme(k,2,4) | Prarl(k,2,4) |
| | LASER APPARATUS (k) l=3 | LINE NARROWING MODULE (LNM) m=1 | NUMBER OF OSCILLATION PULSES AFTER EXCHANGE | Life(k,3,1) | Tmhs(k,3,1) | Cexc(k,3,1) | Cplife(k,3,1) | Pra(k,3,1) | Dme(k,3,1) | Prarl(k,3,1) |
| | | LASER CHAMBER (CH) m=2 | NUMBER OF OSCILLATION PULSES AFTER EXCHANGE | Life(k,3,2) | Tmhs(k,3,2) | Cexc(k,3,2) | Cplife(k,3,2) | Pra(k,3,2) | Dme(k,3,2) | Prarl(k,3,2) |
| | | MONITORING MODULE (MM) m=3 | NUMBER OF OSCILLATION PULSES AFTER EXCHANGE | Life(k,3,3) | Tmhs(k,3,3) | Cexc(k,3,3) | Cplife(k,3,3) | Pra(k,3,3) | Dme(k,3,3) | Prarl(k,3,3) |
| | | FRONT MIRROR m=4 | NUMBER OF OSCILLATION PULSES AFTER EXCHANGE | Life(k,3,4) | Tmhs(k,3,4) | Cexc(k,3,4) | Cplife(k,3,4) | Pra(k,3,4) | Dme(k,3,4) | Prarl(k,3,4) | k: LITHO CELL NUMBER
l: APPARATUS NUMBER
m: EXCHANGE MODULE OR EXCHANGE PART NUMBER

FIG. 13

EXAMPLE OF TABLE DATA(2) IN FILE B

| | APPARATUS | EXCHANGE MODULE OR EXCHANGE PART | SAME-DAY MAINTENANCE PERIOD |
|---|---|---|---|
| LITHO CELL #k | C/D APPARATUS (k) | SAME-DAY MAINTENANCE OF SUBSTRATE ROTATING MODULE AND DRAIN RECOVERY MODULE | Thm_SM_DRM |
| | EXPOSURE APPARATUS (k) | SAME-DAY MAINTENANCE OF EXCHANGE PART OF ILLUMINATION OPTICAL SYSTEM AND PART OF PROJECTION OPTICAL SYSTEM | Thm_ILL_Pro |
| | LASER APPARATUS (k) | SAME-DAY MAINTENANCE OF LNM+CH | Tmh_LNM_CH |
| | | SAME-DAY MAINTENANCE OF LNM+CH+MM | Tmh_LNM_CH_MM |
| | | SAME-DAY MAINTENANCE OF FM+CH+LNM | Tmh_FM_CH_LNM |
| | | SAME-DAY MAINTENANCE OF LNM+MM | Tmh_LNM_MM |

FIG. 14

EXAMPLE OF TABLE DATA(3) IN FILE B

| | | EXCHANGE MODULE OR EXCHANGE PART | PULSE ENERGY (mJ) | LIFE VALUE Life(k,l,m) |
|---|---|---|---|---|
| LITHO CELL #k | EXPOSURE APPARATUS (k) | EXCHANGE PART OF ILLUMINATION OPTICAL SYSTEM | 10 | Life_IL_10 |
| | | EXCHANGE PART OF ILLUMINATION OPTICAL SYSTEM | 15 | Life_IL_15 |
| | | EXCHANGE PART OF PROJECTION OPTICAL SYSTEM | 10 | Life_Pro_10 |
| | | EXCHANGE PART OF PROJECTION OPTICAL SYSTEM | 15 | Life_Pro_15 |
| | LASER APPARATUS (k) | LINE NARROWING MODULE (LNM) | 10 | Life_LNM_10 |
| | | LINE NARROWING MODULE (LNM) | 15 | Life_LNM_15 |
| | | LASER CHAMBER (CH) | 10 | Life_CH_10 |
| | | LASER CHAMBER (CH) | 15 | Life_CH_15 |
| | | MONITORING MODULE (MM) | 10 | Life_MM_10 |
| | | MONITORING MODULE (MM) | 15 | Life_MM_15 |

FIG. 16

EXAMPLE OF TABLE DATA IN FILE C

| APPARATUS | | EXCHANGE MODULE OR EXCHANGE PART | LIFE PARAMETER | STANDARD MAINTENANCE PERIOD Tmhs(k,l,m) | STANDARD MAINTENANCE DATE Dmds(k,l,m) | EXCHANGE COST PER UNIT LIFE Cplife(k,l,m) |
|---|---|---|---|---|---|---|
| LITHO CELL #k | C/D APPARATUS l=1 | CHEMICAL FILTER m=1 | OPERATION PERIOD AFTER EXCHANGE | Tmhs(k,1,1) | Dmds(k,1,1) | Cplife(k,1,1) |
| | | SUBSTRATE ROTATING MODULE m=2 | NUMBER OF PROCESSED WAFERS AFTER EXCHANGE | Tmhs(k,1,2) | Dmds(k,1,2) | Cplife(k,1,2) |
| | | DRAIN RECOVERY MODULE m=3 | NUMBER OF PROCESSED WAFERS AFTER EXCHANGE | Tmhs(k,1,3) | Dmds(k,1,3) | Cplife(k,1,3) |
| | | EXCHANGE PART IN WAFER TRANSPORTING LINE m=4 | NUMBER OF PROCESSED WAFERS AFTER EXCHANGE | Tmhs(k,1,4) | Dmds(k,1,4) | Cplife(k,1,4) |
| | EXPOSURE APPARATUS l=2 | CHEMICAL FILTER m=1 | OPERATION PERIOD AFTER EXCHANGE | Tmhs(k,2,1) | Dmds(k,2,1) | Cplife(k,2,1) |
| | | EXCHANGE PART IN ILLUMINATION OPTICAL SYSTEM m=2 | NUMBER OF EXPOSURE PULSES AFTER EXCHANGE | Tmhs(k,2,2) | Dmds(k,2,2) | Cplife(k,2,2) |
| | | EXCHANGE PART IN PROJECTION OPTICAL SYSTEM m=3 | NUMBER OF EXPOSURE PULSES AFTER EXCHANGE | Tmhs(k,2,3) | Dmds(k,2,3) | Cplife(k,2,3) |
| | | EXCHANGE PART IN WAFER TRANSPORTING SYSTEM m=4 | NUMBER OF PROCESSED WAFERS AFTER EXCHANGE | Tmhs(k,2,4) | Dmds(k,2,4) | Cplife(k,2,4) |
| | LASER APPARATUS l=3 | LINE NARROWING MODULE (LNM) m=1 | NUMBER OF OSCILLATION PULSES AFTER EXCHANGE | Tmhs(k,3,1) | Dmds(k,3,1) | Cplife(k,3,1) |
| | | LASER CHAMBER (CH) m=2 | NUMBER OF OSCILLATION PULSES AFTER EXCHANGE | Tmhs(k,3,2) | Dmds(k,3,2) | Cplife(k,3,2) |
| | | MONITORING MODULE (MM) m=3 | NUMBER OF OSCILLATION PULSES AFTER EXCHANGE | Tmhs(k,3,3) | Dmds(k,3,3) | Cplife(k,3,3) |
| | | FRONT MIRROR m=4 | NUMBER OF OSCILLATION PULSES AFTER EXCHANGE | Tmhs(k,3,4) | Dmds(k,3,4) | Cplife(k,3,4) | k: LITHO CELL NUMBER
l: APPARATUS NUMBER
m: EXCHANGE MODULE OR EXCHANGE PART NUMBER

FIG. 17

EXAMPLE OF TABLE DATA IN FILE D

| LITHO CELL NUMBER | LOSS COST DUE TO DOWNTIME PER UNIT PERIOD |
|---|---|
| LITHO CELL #1 | $Cdt(1)$ |
| LITHO CELL #2 | $Cdt(2)$ |
| LITHO CELL #3 | $Cdt(3)$ |
| . | . |
| . | . |
| LITHO CELL #k | $Cdt(k)$ |
| . | . |
| LITHO CELL #w | $Cdt(w)$ |

FIG. 20

EXAMPLE OF TABLE DATA IN FILE E

| DESCENDING ORDER u OF STANDARD MAINTENANCE DATE | APPARATUSES IN LITHO CELL #k | EXCHANGE MODULE OR EXCHANGE PART | STANDARD MAINTENANCE DATE Dmds(k,l,m,u) | STANDARD MAINTENANCE PERIOD Tmhs(k,l,m,u) IN STANDALONE EXCHANGE | EXCHANGE COST PER UNIT LIFE Cplife(k,l,m,u) | OPTIMIZED MAINTENANCE DATE Dmop(k,v) | INCREASED COST DUE TO ADVANCEMENT OF EXCHANGE DATE Cexcup(k,v) | MAINTENANCE PERIOD Tmop(k,v) | DOWNTIME-REDUCTION REDUCED COST Cdtd(k,v) | COST BENEFIT Cm(k,v) |
|---|---|---|---|---|---|---|---|---|---|---|
| 1 | C/D APPARATUS(k) | CHEMICAL FILTER | Dmds(k,1,1,1) | Tmhs(k,1,1,1) | Cplife(k,1,1,1) | | | | | |
| 2 | LASER APPARATUS(k) | MONITORING MODULE | Dmds(k,3,3,2) | Tmhs(k,3,3,2) | Cplife(k,3,3,2) | Dmop(k,1) | Cexcup(k,1) | Tmop(k,1) | Cdtd(k,1) | Cm(k,1) |
| 3 | EXPOSURE APPARATUS(k) | EXCHANGE PART IN WAFER TRANSPORT SYSTEM | Dmds(k,2,4,3) | Tmhs(k,1,4,3) | Cplife(k,1,4,3) | | | | | |
| 4 | EXPOSURE APPARATUS(k) | CHEMICAL FILTER | Dmds(k,2,1,4) | Tmhs(k,2,1,4) | Cplife(k,2,1,4) | Dmop(k,2) | Cexcup(k,2) | Tmop(k,2) | Cdtd(k,2) | Cm(k,2) |
| 5 | C/D APPARATUS(k) | SUBSTRATE ROTATING MODULE | Dmds(k,1,2,5) | Tmhs(k,1,2,5) | Cplife(k,1,2,5) | | | | | |
| 6 | LASER APPARATUS(k) | LINE NARROWING MODULE | Dmds(k,3,1,6) | Tmhs(k,3,1,6) | Cplife(k,3,1,6) | | | | | |
| 7 | LASER APPARATUS(k) | LASER CHAMBER | Dmds(k,3,2,7) | Tmhs(k,3,2,7) | Cplife(k,3,2,7) | | | | | |
| 8 | EXPOSURE APPARATUS(k) | EXCHANGE PART IN ILLUMINATION OPTICAL SYSTEM | Dmds(k,2,2,8) | Tmhs(k,2,2,8) | Cplife(k,2,2,8) | Dmop(k,3) | Cexcup(k,3) | Tmop(k,3) | Cdtd(k,3) | Cm(k,3) |
| 9 | EXPOSURE APPARATUS(k) | EXCHANGE PART IN WAFER TRANSPORT LINE | Dmds(k,1,4,9) | Tmhs(k,1,4,9) | Cplife(k,1,4,9) | | | | | |
| 10 | LASER APPARATUS(k) | FRONT MIRROR | Dmds(k,3,4,10) | Tmhs(k,3,4,10) | Cplife(k,3,4,10) | | | | | |
| 11 | EXPOSURE APPARATUS(k) | EXCHANGE PART IN PROJECTION OPTICAL SYSTEM | Dmds(k,2,3,11) | Tmhs(k,2,3,11) | Cplife(k,2,3,11) | Dmop(k,4) | Cexcup(k,4) | Tmop(k,4) | Cdtd(k,4) | Cm(k,4) |
| 12 | C/D APPARATUS(k) | DRAIN RECOVERY MODULE | Dmds(k,1,3,12) | Tmhs(k,1,3,12) | Cplife(k,1,3,12) | | | | | |
| | | | | | | TOTAL | Cexcup(k) | Tmop(k) | Cdtd(k) | Cm(k) | k: LITHO CELL NUMBER
l: APPARATUS NUMBER
m: EXCHANGE MODULE OR EXCHANGE PART NUMBER
u: DESCENDING ORDER OF STANDARD MAINTENANCE DATE
v: DESCENDING ORDER OF OPTIMUM MAINTENANCE DATE

FIG. 23

EXAMPLE OF TABLE DATA IN FILE A(2)

LITHO CELL #k

| No. | DATE AND TIME D WHEN DATA ARE ACQUIRED | NUMBER OF PROCESSED WAFERS Wn IN LITHO CELL #k | NUMBER OF PROCESSED WAFERS PER DAY Wnday IN LITHO CELL #k | EXPOSURE APPARATUS (k) | | LASER APPARATUS (k) | | |
|---|---|---|---|---|---|---|---|---|
| | | | | NUMBER OF EXPOSURE PULSES Nex | NUMBER OF EXPOSURE PULSES PER WAFER Nexwef | NUMBER OF OSCILLATION PULSES Np | NUMBER OF OSCILLATION PULSES PER WAFER Npwef | PULSE ENERGY Ep |
| 1 | D(k,1) | Wn(k,1) | — | Nex(k,1) | — | Np(k,1) | — | Ep(k,1) |
| 2 | D(k,2) | Wn(k,2) | Wnday(k,1) | Nex(k,2) | Nexwef(k,1) | Np(k,2) | Npwef(k,1) | Ep(k,2) |
| 3 | D(k,3) | Wn(k,3) | Wnday(k,2) | Nex(k,3) | Nexwef(k,2) | Np(k,3) | Npwef(k,2) | Ep(k,3) |
| . | . | . | . | . | . | . | . | . |
| . | . | . | . | . | . | . | . | . |
| i | D(k,i) | Wn(k,i) | Wnday(k,i−1) | Nex(k,i) | Nexwef(k,i−1) | Np(k,i) | Npwef(k,i−1) | Ep(k,i) |
| . | . | . | . | . | . | . | . | . |
| j | D(k,j) | Wn(k,j) | Wnday(k,j−1) | Nex(k,j) | Nexwef(k,j−1) | Np(k,j) | Npwef(k,j−1) | Ep(k,j) |
| | | | Wnday(k) | | Nexwef(k) | | Npwef(k) | Ep(k) |

FIG. 24

EXAMPLE OF TABLE DATA IN FILE F

| No. | DATE DATEpl | NUMBER OF PROCESSED WAFERS IN LITHO CELL #k | | Nexwef (k) | | Npwef (k) | |
|---|---|---|---|---|---|---|---|
| | | PLANNED NUMBER OF PROCESSED WAFERS ON EACH DAY Wplpd | PLANNED NUMBER OF PROCESSED WAFERS ON CURRENT DAY AND AFTERWARD Wplpdsu | PLANNED NUMBER OF EXPOSURE PULSES ON EACH DAY Nexplpd | PLANNED NUMBER OF EXPOSURE PULSES ON CURRENT DAY AND AFTERWARD Nexplsu | PLANNED NUMBER OF OSCILLATION PULSES ON EACH DAY Npplpd | PLANNED NUMBER OF OSCILLATION PULSES ON CURRENT DAY AND AFTERWARD Npplsu |
| 1 | DATEpl(k,1) | Wplpd(k,1) | Wplpdsu(k,1) | Nexplpd(k,1) | Nexplsu(k,1) | Npplpd(k,1) | Npplsu(k,1) |
| 2 | DATEpl(k,2) | Wplpd(k,2) | Wplpdsu(k,2) | Nexplpd(k,2) | Nexplsu(k,2) | Npplpd(k,2) | Npplsu(k,2) |
| 3 | DATEpl(k,3) | Wplpd(k,3) | Wplpdsu(k,3) | Nexplpd(k,3) | Nexplsu(k,3) | Npplpd(k,3) | Npplsu(k,3) |
| 4 | DATEpl(k,4) | Wplpd(k,4) | Wplpdsu(k,4) | Nexplpd(k,4) | Nexplsu(k,4) | Npplpd(k,4) | Npplsu(k,4) |
| 5 | DATEpl(k,5) | Wplpd(k,5) | Wplpdsu(k,5) | Nexplpd(k,5) | Nexplsu(k,5) | Npplpd(k,5) | Npplsu(k,5) |
| 6 | DATEpl(k,6) | Wplpd(k,6) | Wplpdsu(k,6) | Nexplpd(k,6) | Nexplsu(k,6) | Npplpd(k,6) | Npplsu(k,6) |
| 7 | DATEpl(k,7) | Wplpd(k,7) | Wplpdsu(k,7) | Nexplpd(k,7) | Nexplsu(k,7) | Npplpd(k,7) | Npplsu(k,7) |
| . . | | | | | | | |
| f | DATEpl(k,f) | Wplpd(k,f) | Wplpdsu(k,f) | Nexplpd(k,f) | Nexplsu(k,f) | Npplpd(k,f) | Npplsu(k,f) |
| . . | | | | | | | |
| g | DATEpl(k,g) | Wplpd(k,g) | Wplpdsu(k,g) | Nexplpd(k,g) | Nexplsu(k,g) | Npplpd(k,g) | Npplsu(k,g) |

FIG. 29

EXAMPLE OF TABLE DATA IN FILE A(3)

| No. | DATE AND TIME D WHEN DATA ARE ACQUIRED | NUMBER OF PROCESSED WAFERS Wn IN LITHO CELL #k | RECIPE Lcip | LITHO CELL #k — NUMBER OF PROCESSED WAFERS PER DAY Wnday IN LITHO CELL #k | LITHO CELL #k — AVERAGE NUMBER OF PROCESSED WAFERS PER DAY CORRESPONDING TO EACH RECIPE Wndayfc | EXPOSURE APPARATUS (k) — NUMBER OF EXPOSURE PULSES Nex | EXPOSURE APPARATUS (k) — NUMBER OF EXPOSURE PULSES PER WAFER Nexwef | EXPOSURE APPARATUS (k) — AVERAGE NUMBER OF OSCILLATION PULSES PER WAFER CORRESPONDING TO EACH RECIPE Npwefc | LASER APPARATUS (k) — NUMBER OF OSCILLATION PULSES Np | LASER APPARATUS (k) — NUMBER OF OSCILLATION PULSES PER WAFER Npwef | LASER APPARATUS (k) — AVERAGE NUMBER OF OSCILLATION PULSES PER WAFER CORRESPONDING TO EACH RECIPE Npweflc | PULSE ENERGY Ep |
|---|---|---|---|---|---|---|---|---|---|---|---|---|
| 1 | D(k,1) | Wn(k,1) | Lcip(k,a) | — | — | Nex(k,1) | — | — | Np(k,1) | — | — | Ep(k,1) |
| 2 | D(k,2) | Wn(k,1) | Lcip(k,a) | Wnday(k,1) | Wndayfc(k,a) | Nex(k,2) | Nexwef(k,1) | Nexweflc(k,a) | Np(k,2) | Npwef(k,1) | Npweflc(k,a) | Ep(k,2) |
| 3 | D(k,3) | Wn(k,3) | Lcip(k,a) | Wnday(k,2) | | Nex(k,3) | Nexwef(k,2) | | Np(k,3) | Npwef(k,2) | | Ep(k,3) |
| 4 | D(k,4) | Wn(k,4) | Lcip(k,b) | Wnday(k,3) | | Nex(k,4) | Nexwef(k,3) | | Np(k,4) | Npwef(k,3) | | Ep(k,4) |
| 5 | D(k,5) | Wn(k,5) | Lcip(k,b) | Wnday(k,4) | | Nex(k,5) | Nexwef(k,4) | Nexweflc(k,b) | Np(k,5) | Npwef(k,4) | Npweflc(k,b) | Ep(k,5) |
| 6 | D(k,6) | Wn(k,6) | Lcip(k,b) | Wnday(k,5) | Wndayfc(k,b) | Nex(k,6) | Nexwef(k,5) | | Np(k,6) | Npwef(k,5) | | Ep(k,6) |
| · | · | · | · | · | · | · | · | · | · | · | · | · |
| i | Nex(k,i) | Wn(k,i) | Lcip(k,b) | Wnday(k,i-1) | | Nex(k,i) | Nexwef(k,i-1) | Nexweflc(k,o) | Np(k,i) | Npwef(k,i-1) | Npweflc(k,c) | Ep(k,i) |
| i+1 | D(k,i+1) | Wn(k,i+1) | Lcip(k,b) | Wnday(k,i) | Wndayfc(k,o) | Nex(k,i+1) | Nexwef(k,i) | | Np(k,i+1) | Npwef(k,i) | | Ep(k,i+1) |
| · | · | · | · | · | · | · | · | · | · | · | · | · |
| j | D(k,j) | Wn(k,j) | Lcip(k,c) | Wnday(k,j-1) | | Nex(k,j) | Nexwef(k,j-1) | | Np(k,j) | Npwef(k,j-1) | | Ep(k,j) |
| | | | | Wnday(k) | | | Nexwef(k) | | | Npwef(k) | | | a, b, and c REPRESENT TYPES OF RECIPE.

FIG. 30

EXAMPLE OF TABLE DATA IN FILE F(2)

| No. | DATE DATEpl | NUMBER OF PROCESSED WAFERS IN LITHO CELL #k | | RECIPE Lcip | Nexwef(k) | | Npwef(k) | |
|---|---|---|---|---|---|---|---|---|
| | | PLANNED NUMBER OF PROCESSED WAFERS ON EACH DAY Wplpd | PLANNED NUMBER OF PROCESSED WAFERS ON CURRENT DAY AND AFTERWARD Wplpdsu | | PLANNED NUMBER OF EXPOSURE PULSES ON EACH DAY Nexplpd | PLANNED NUMBER OF EXPOSURE PULSES ON CURRENT DAY AND AFTERWARD Nexplsu | PLANNED NUMBER OF OSCILLATION PULSES ON EACH DAY Npplpd | PLANNED NUMBER OF OSCILLATION PULSES ON CURRENT DAY AND AFTERWARD Npplsu |
| 1 | DATEpl(k,1) | Wplpd(k,1) | Wplpdsu(k,1) | Lcip(k,b) | Nexplpd(k,1) | Nexplsu(k,1) | Npplpd(k,1) | Npplsu(k,1) |
| 2 | DATEpl(k,2) | Wplpd(k,2) | Wplpdsu(k,2) | Lcip(k,b) | Nexplpd(k,2) | Nexplsu(k,2) | Npplpd(k,2) | Npplsu(k,2) |
| 3 | DATEpl(k,3) | Wplpd(k,3) | Wplpdsu(k,3) | Lcip(k,b) | Nexplpd(k,3) | Nexplsu(k,3) | Npplpd(k,3) | Npplsu(k,3) |
| 4 | DATEpl(k,4) | Wplpd(k,4) | Wplpdsu(k,4) | Lcip(k,b) | Nexplpd(k,4) | Nexplsu(k,4) | Npplpd(k,4) | Npplsu(k,4) |
| 5 | DATEpl(k,5) | Wplpd(k,5) | Wplpdsu(k,5) | Lcip(k,a) | Nexplpd(k,5) | Nexplsu(k,5) | Npplpd(k,5) | Npplsu(k,5) |
| 6 | DATEpl(k,6) | Wplpd(k,6) | Wplpdsu(k,6) | Lcip(k,a) | Nexplpd(k,6) | Nexplsu(k,6) | Npplpd(k,6) | Npplsu(k,6) |
| 7 | DATEpl(k,7) | Wplpd(k,7) | Wplpdsu(k,7) | Lcip(k,a) | Nexplpd(k,7) | Nexplsu(k,7) | Npplpd(k,7) | Npplsu(k,7) |
| . | . | . | . | . | . | . | . | . |
| f | DATEpl(k,f) | Wplpd(k,f) | Wplpdsu(k,f) | Lcip(k,c) | Nexplpd(k,f) | Nexplsu(k,f) | Npplpd(k,f) | Npplsu(k,f) |
| f+1 | DATEpl(k,f+1) | Wplpd(k,f+1) | Wplpdsu(k,f+1) | Lcip(k,c) | Nexplpd(k,f+1) | Nexplsu(k,f+1) | Npplpd(k,f+1) | Npplsu(k,f+1) |
| . | . | . | . | . | . | . | . | . |
| g | DATEpl(k,g) | Wplpd(k,g) | Wplpdsu(k,g) | Lcip(k,c) | Nexplpd(k,g) | Nexplsu(k,g) | Npplpd(k,g) | Npplsu(k,g) | a, b, and c REPRESENT TYPES OF RECIPE.

FIG. 32

EXAMPLE OF LOG DATA IN FILE G

| No. | DATE AND TIME D WHEN DATA ARE ACQUIRED | LITHO CELL #k ||||||| 
|---|---|---|---|---|---|---|---|
| | | C/D APPARATUS(k) l=1 || EXPOSURE APPARATUS(k) l=2 || LASER APPARATUS(k) l=3 ||
| | | CHEMICAL FILTER m=1 || EXCHANGE PART IN ILLUMINATION OPTICAL SYSTEM m=2 || LASER CHAMBER (CH) m=2 ||
| | | OPERATION PERIOD AFTER EXCHANGE | IMPURITY GAS CONCENTRATION | NUMBER OF EXPOSURE PULSES AFTER EXCHANGE | TRANSMITTANCE OF LIGHT PASSING THROUGH ILLUMINATION OPTICAL SYSTEM | NUMBER OF OSCILLATION PULSES AFTER EXCHANGE | GAS PRESSURE IN LASER CHAMBER |
| | | LIFE PARAMETER VALUE Pra | LIFE MONITORING PARAMETER VALUE Cw | LIFE PARAMETER VALUE Pra | LIFE MONITORING PARAMETER VALUE Til | LIFE PARAMETER VALUE Pra | LIFE MONITORING PARAMETER VALUE Pch |
| 1 | D(k,1) | Pra(k,1,1,1) | Cw(k,1,1,1) | Pra(k,2,2,1) | Til(k,2,2,1) | Pra(k,3,2,1) | Pch(k,3,2,1) |
| 2 | D(k,2) | Pra(k,1,1,2) | Cw(k,1,1,2) | Pra(k,2,2,2) | Til(k,2,2,2) | Pra(k,3,2,2) | Pch(k,3,2,2) |
| 3 | D(k,3) | Pra(k,1,1,3) | Cw(k,1,1,3) | Pra(k,2,2,3) | Til(k,2,2,3) | Pra(k,3,2,3) | Pch(k,3,2,3) |
| 4 | D(k,4) | Pra(k,1,1,4) | Cw(k,1,1,4) | Pra(k,2,2,4) | Til(k,2,2,4) | Pra(k,3,2,4) | Pch(k,3,2,4) |
| 5 | D(k,5) | Pra(k,1,1,5) | Cw(k,1,1,5) | Pra(k,2,2,5) | Til(k,2,2,5) | Pra(k,3,2,5) | Pch(k,3,2,5) |
| 6 | D(k,6) | Pra(k,1,1,6) | Cw(k,1,1,6) | Pra(k,2,2,6) | Til(k,2,2,6) | Pra(k,3,2,6) | Pch(k,3,2,6) |
| . | . | . | . | . | . | . | . |
| . | . | . | . | . | . | . | . |
| i | D(k,i) | Pra(k,1,1,i) | Cw(k,1,1,i) | Pra(k,2,2,i) | Til(k,2,2,i) | Pra(k,3,2,i) | Pch(k,3,2,i) |
| i+1 | D(k,i+1) | Pra(k,1,1,i+1) | Cw(k,1,1,i+1) | Pra(k,2,2,i+1) | Til(k,2,2,i+1) | Pra(k,3,2,i+1) | Pch(k,3,2,i+1) |
| . | . | . | . | . | . | . | . |
| . | . | . | . | . | . | . | . |
| j | D(k,j) | Pra(k,1,1,j) | Cw(k,1,1,j) | Pra(k,2,2,j) | Til(k,2,2,j) | Pra(k,3,2,j) | Pch(k,3,2,j) |
| | THRESHOLD OF MONITORING PARAMETER | | Cwth(k,1,1) | — | Tilth(k,2,2) | — | Pchth(k,3,2) | k: LITHO CELL NUMBER
l: APPARATUS NUMBER
m: EXCHANGE MODULE OR EXCHANGE PART NUMBER

FIG. 40

EXAMPLE OF TABLE DATA IN FILE H

| DESCENDING ORDER q OF STANDARD MAINTENANCE DATE | APPARATUSES IN LITHO CELL #k | EXCHANGE MODULE OR EXCHANGE PART | STANDARD MAINTENANCE DATE Dmds(k,l,m,u) | STANDARD MAINTENANCE PERIOD Tmhs(k,l,m,u) IN STANDALONE EXCHANGE | EXCHANGE COST PER UNIT LIFE Cplife(k,l,m,u) | MAINTENANCE CANDIDATE DATE Dmop | INCREASED COST DUE TO ADVANCEMENT OF EXCHANGE DATE Cexcup | MAINTENANCE PERIOD Tmop | DOWNTIME-REDUCTION REDUCED COST Cdtd | COST BENEFIT Cm |
|---|---|---|---|---|---|---|---|---|---|---|
| 1 | EXPOSURE APPARATUS(k) | CHEMICAL FILTER | Dmds(k,2,1,4) | Tmhs(k,2,1,4) | Cplife(k,2,1,4) | | | | | |
| 2 | C/D APPARATUS(k) | SUBSTRATE ROTATING MODULE | Dmds(k,1,2,5) | Tmhs(k,1,2,5) | Cplife(k,1,2,5) | | | | | |
| 3 | LASER APPARATUS(k) | LINE NARROWING MODULE | Dmds(k,3,1,6) | Tmhs(k,3,1,6) | Cplife(k,3,1,6) | Dmop(k,1) | Oexcup(k,1) | Tmop(k,1) | Cdtd(k,1) | Cm(k,1) |
| 4 | LASER APPARATUS(k) | LASER CHAMBER | Dmds(k,3,2,7) | Tmhs(k,3,2,7) | Cplife(k,3,2,7) | | | | | |
| 5 | EXPOSURE APPARATUS(k) | EXCHANGE PART IN ILLUMINATION OPTICAL SYSTEM | Dmds(k,2,2,8) | Tmhs(k,2,2,8) | Cplife(k,2,2,8) | | | | | |
| 6 | C/D APPARATUS(k) | EXCHANGE PART IN WAFER TRANSPORT LINE | Dmds(k,1,4,9) | Tmhs(k,1,4,9) | Cplife(k,1,4,9) | | | | | |
| 7 | LASER APPARATUS(k) | FRONT MIRROR | Dmds(k,3,4,10) | Tmhs(k,3,4,10) | Cplife(k,3,4,10) | | | | | |
| 8 | EXPOSURE APPARATUS(k) | EXCHANGE PART IN PROJECTION OPTICAL SYSTEM | Dmds(k,2,3,11) | Tmhs(k,2,3,11) | Cplife(k,2,3,11) | | | | | |
| 9 | C/D APPARATUS(k) | DRAIN RECOVERY MODULE | Dmds(k,1,3,12) | Tmhs(k,1,3,12) | Cplife(k,1,3,12) | | | | | | k: LITHO CELL NUMBER
l: APPARATUS NUMBER
m: EXCHANGE MODULE OR EXCHANGE PART NUMBER
q: DESCENDING ORDER OF STANDARD MAINTENANCE DATE LATER THAN MAINTENANCE CANDIDATE DATE

FIG. 44

EXAMPLE OF TABLE DATA IN FILE E(2)

| DESCENDING ORDER u OF MAINTENANCE DATE | APPARATUSES IN LITHO CELL #k | EXCHANGE MODULE OR EXCHANGE PART | STANDARD MAINTENANCE DATE Dmds(k,l,m,u) | STANDARD MAINTENANCE PERIOD Tmhs(k,l,m,u) IN STANDALONE EXCHANGE | EXCHANGE COST PER UNIT LIFE Cplife(k,l,m,u) | OPTIMUM MAINTENANCE DATE Dmop(k,v) | INCREASED COST DUE TO ADVANCEMENT OF EXCHANGE DATE Cexcup(k,v) | MAINTENANCE PERIOD Tmop(k,v) | DOWNTIME-REDUCTION REDUCED COST Cdtd(k,v) | COST BENEFIT Cm(k,v) |
|---|---|---|---|---|---|---|---|---|---|---|
| ud=1 | C/D APPARATUS(k) | CHEMICAL FILTER | Dmds(k,1,1,1) | Tmhs(k,1,1,1) | Cplife(k,1,1,1) | | | | | |
| ud=2 | LASER APPARATUS(k) | MONITORING MODULE | Dmds(k,3,3,2) | Tmhs(k,3,3,2) | Cplife(k,3,3,2) | Dmopd(k,1) | Cexcupd(k,1) | Tmopd(k,1) | Cdtdd(k,1) | Cmd(k,1) |
| ud=3 | EXPOSURE APPARATUS(k) | EXCHANGE PART IN WAFER TRANSPORT SYSTEM | Dmds(k,2,4,3) | Tmhs(k,2,4,3) | Cplife(k,2,4,3) | | | | | |
| 1 | EXPOSURE APPARATUS(k) | CHEMICAL FILTER | Dmds(k,2,1,4) | Tmhs(k,2,1,4) | Cplife(k,2,1,4) | Dmop(k,1) | Cexcup(k,1) | Tmop(k,1) | Cdtd(k,1) | Cm(k,1) |
| 2 | C/D APPARATUS(k) | SUBSTRATE ROTATING MODULE | Dmds(k,1,2,5) | Tmhs(k,1,2,5) | Cplife(k,1,2,5) | | | | | |
| 3 | LASER APPARATUS(k) | LINE NARROWING MODULE | Dmds(k,3,1,6) | Tmhs(k,3,1,6) | Cplife(k,3,1,6) | | | | | |
| 4 | LASER APPARATUS(k) | LASER CHAMBER | Dmds(k,3,2,7) | Tmhs(k,3,2,7) | Cplife(k,3,2,7) | | | | | |
| 5 | EXPOSURE APPARATUS(k) | EXCHANGE PART IN ILLUMINATION OPTICAL SYSTEM | Dmds(k,2,2,8) | Tmhs(k,2,2,8) | Cplife(k,2,2,8) | Dmop(k,2) | Cexcup(k,2) | Tmop(k,2) | Cdtd(k,2) | Cm(k,2) |
| 6 | C/D APPARATUS(k) | EXCHANGE PART IN WAFER TRANSPORT LINE | Dmds(k,1,4,9) | Tmhs(k,1,4,9) | Cplife(k,1,4,9) | | | | | |
| 7 | LASER APPARATUS(k) | FRONT MIRROR | Dmds(k,3,4,10) | Tmhs(k,3,4,10) | Cplife(k,3,4,10) | | | | | |
| 8 | EXPOSURE APPARATUS(k) | EXCHANGE PART IN PROJECTION OPTICAL SYSTEM | Dmds(k,2,3,11) | Tmhs(k,2,3,11) | Cplife(k,2,3,11) | | | | | |
| 9 | C/D APPARATUS(k) | DRAIN RECOVERY MODULE | Dmds(k,1,3,12) | Tmhs(k,1,3,12) | Cplife(k,1,3,12) | Dmop(k,3) | Cexcup(k,3) | Tmop(k,3) | Cdtd(k,3) | Cm(k,3) |
| 10 | C/D APPARATUS(k) | CHEMICAL FILTER | Dmds(k,1,1,1) | 0 | Cplife(k,1,1,1) | | | | | |
| 11 | LASER APPARATUS(k) | MONITORING MODULE | Dmds(k,3,3,2) | 0 | Cplife(k,3,3,2) | | | | | |
| 12 | EXPOSURE APPARATUS(k) | LINE NARROWING MODULE | Dmds(k,2,4,3) | 0 | Cplife(k,2,4,3) | | | | | |
| | | | | | | TOTAL | Cexcup(k) | Tmop(k) | Cdtd(k) | Cmt(k) | k: LITHO CELL NUMBER
l: APPARATUS NUMBER
m: EXCHANGE MODULE OR EXCHANGE PART NUMBER
u: DESCENDING ORDER OF STANDARD MAINTENANCE DATE
v: DESCENDING ORDER OF OPTIMUM MAINTENANCE DATE
ud: PART TO BE MAINTAINED ON DETERMINED MAINTENANCE DATE

FIG. 47

EXAMPLES OF MONITORING PARAMETER

| APPARATUS | | EXCHANGE MODULE OR EXCHANGE PART | LIFE PARAMETER | EXAMPLES OF MONITORING PARAMETER |
|---|---|---|---|---|
| LITHO CELL #k | C/D APPARATUS(k) l=1 | CHEMICAL FILTER m=1 | OPERATION PERIOD AFTER EXCHANGE | IMPURITY CONCENTRATION |
| | | SUBSTRATE ROTATING MODULE m=2 | NUMBER OF PROCESSED WAFERS AFTER EXCHANGE | ROTATIONAL SPEED OF SUBSTRATE |
| | | DRAIN RECOVERY MODULE m=3 | NUMBER OF PROCESSED WAFERS AFTER EXCHANGE | AMOUNT OF CONSUMED RESIST |
| | | EXCHANGE PART IN WAFER TRANSPORTING LINE m=4 | | NUMBER OF TRANSPORTED WAFERS |
| | EXPOSURE APPARATUS(k) l=2 | CHEMICAL FILTER m=1 | OPERATION PERIOD AFTER EXCHANGE | IMPURITY CONCENTRATION |
| | | EXCHANGE PART IN ILLUMINATION OPTICAL SYSTEM m=2 | NUMBER OF EXPOSURE PULSES AFTER EXCHANGE | TRANSMITTANCE OF LIGHT PASSING THROUGH ILLUMINATION OPTICAL SYSTEM |
| | | EXCHANGE PART IN PROJECTION OPTICAL SYSTEM m=3 | NUMBER OF EXPOSURE PULSES AFTER EXCHANGE | TRANSMITTANCE OF LIGHT PASSING THROUGH PROJECTION OPTICAL SYSTEM |
| | | EXCHANGE PART IN WAFER TRANSPORTING SYSTEM m=4 | NUMBER OF PROCESSED WAFERS AFTER EXCHANGE | NUMBER OF TRANSPORTED WAFERS |
| | LASER APPARATUS(k) l=3 | LINE NARROWING MODULE (LNM) m=1 | NUMBER OF OSCILLATION PULSES AFTER EXCHANGE | SPECTRUM LINEWIDTH, WAVELENGTH STABILITY |
| | | LASER CHAMBER (CH) m=2 | NUMBER OF OSCILLATION PULSES AFTER EXCHANGE | GAS PRESSURE IN CHAMBER, CHARGING VOLTAGE, ENERGY STABILITY |
| | | MONITORING MODULE (MM) m=3 | NUMBER OF OSCILLATION PULSES AFTER EXCHANGE | DEGREE OF DEGRADATION IN SENSITIVITY OF OPTICAL SENSORS |
| | | FRONT MIRROR m=4 | NUMBER OF OSCILLATION PULSES AFTER EXCHANGE | AREA OF DEGRADED BEAM PROFILE | k: LITHO CELL NUMBER
l: APPARATUS NUMBER
m: EXCHANGE MODULE OR EXCHANGE PART NUMBER

FIG. 52

EXAMPLE OF TABLE DATA IN FILE D(2)

| LINE NUMBER | LITHO CELL NUMBER | LOSS COST DUE TO DOWNTIME PER UNIT PERIOD |
|---|---|---|
| LINE #1 | LITHO CELL #1 | $Cdt(1)$ |
|  | LITHO CELL #2 | $Cdt(2)$ |
|  | LITHO CELL #3 | $Cdt(3)$ |
| LINE #2 | LITHO CELL #4 | $Cdt(4)$ |
|  | LITHO CELL #5 | $Cdt(5)$ |
| ⋮ | ⋮ | ⋮ |
| LINE #α | LITHO CELL #k-1 | $Cdt(k-1)$ |
|  | LITHO CELL #k | $Cdt(k)$ |
|  | LITHO CELL #k+1 | $Cdt(k+1)$ |
| ⋮ | ⋮ | ⋮ |
| LINE #β | LITHO CELL #m-1 | $Cdt(m-1)$ |
|  | LITHO CELL #m | $Cdt(m)$ |

FIG. 55

EXAMPLE OF TABLE DATA IN FILE J

| APPARATUS | | SERVICE ENGINEER | MAINTENANCE PERIOD COEFFICIENT | MAINTENANCE POSSIBLE REGION RANGE |
|---|---|---|---|---|
| C/D APPARATUS | | SERVICE ENGINEER #1 | $\gamma(1)$ | $L(1)$ |
| | | SERVICE ENGINEER #2 | $\gamma(2)$ | $L(2)$ |
| | | SERVICE ENGINEER #3 | $\gamma(3)$ | $L(3)$ |
| | | SERVICE ENGINEER #4 | $\gamma(4)$ | $L(4)$ |
| EXPOSURE APPARATUS | | SERVICE ENGINEER #5 | $\gamma(5)$ | $L(1)$ |
| | | SERVICE ENGINEER #6 | $\gamma(6)$ | $L(2)$ |
| | | SERVICE ENGINEER #7 | $\gamma(7)$ | $L(3)$ |
| | | SERVICE ENGINEER #8 | $\gamma(8)$ | $L(4)$ |
| LASER APPARATUS | | SERVICE ENGINEER #9 | $\gamma(9)$ | $L(1)$ |
| | | SERVICE ENGINEER #10 | $\gamma(10)$ | $L(2)$ |
| | | SERVICE ENGINEER #11 | $\gamma(11)$ | $L(3)$ |
| | | SERVICE ENGINEER #12 | $\gamma(12)$ | $L(4)$ |

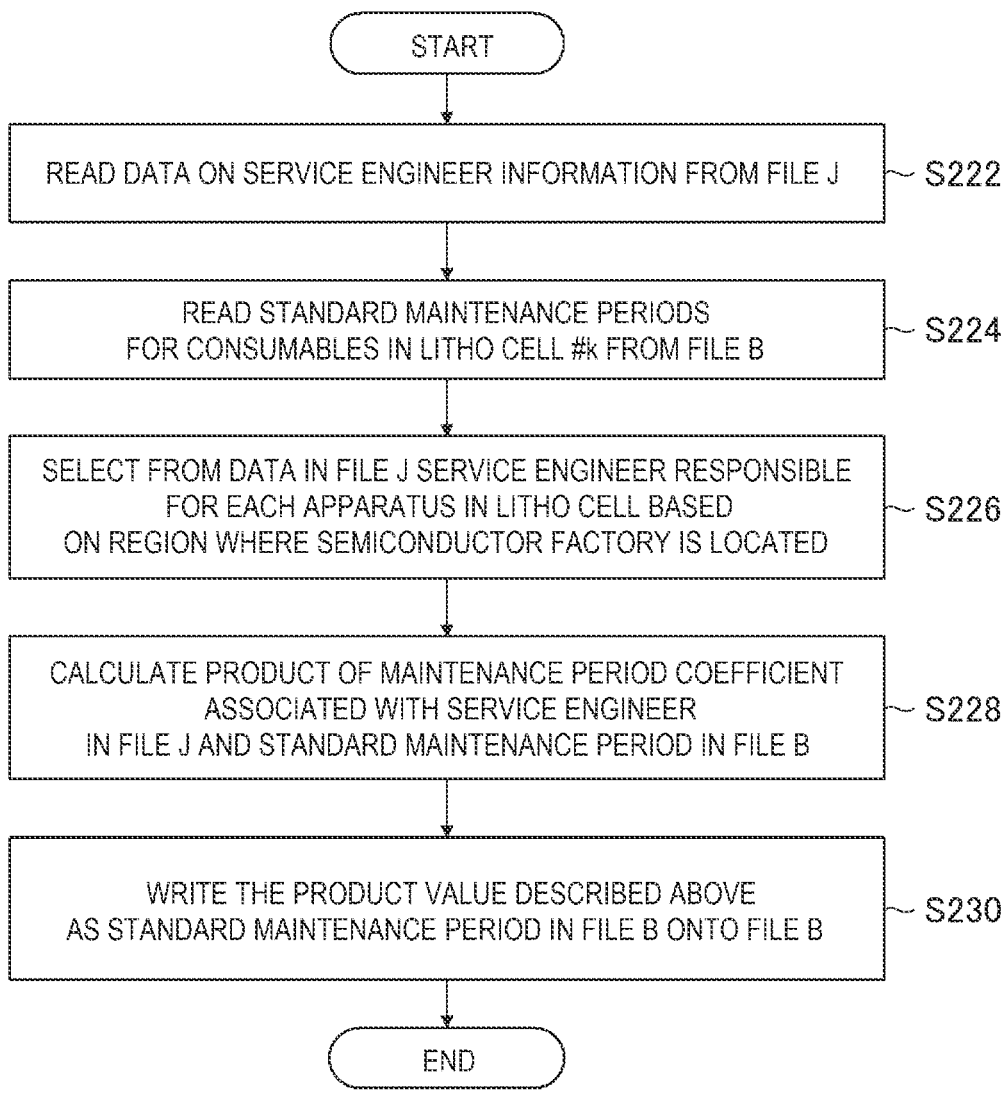

MAINTENANCE MANAGEMENT METHOD FOR LITHOGRAPHY SYSTEM, MAINTENANCE MANAGEMENT APPARATUS, AND COMPUTER READABLE MEDIUM

CROSS-REFERENCE TO RELATED APPLICATIONS

The present application is a continuation application of International Application No. PCT/JP2018/029808, filed on Aug. 8, 2018, the entire contents of which are hereby incorporated by reference.

BACKGROUND

1. Technical Field

The present disclosure relates to a maintenance management method for a lithography system, a maintenance management apparatus, and a computer readable medium.

2. Related Art

A semiconductor exposure apparatus is required to improve the resolution thereof as a semiconductor integrated circuit is increasingly miniaturized and highly integrated. The semiconductor exposure apparatus is hereinafter simply referred to as an "exposure apparatus." To this end, reduction in the wavelength of the light outputted from a light source for exposure is underway. A gas laser apparatus is used as the light source for exposure in place of a mercury lamp in related art. At present, a KrF excimer laser apparatus, which outputs ultraviolet light having a wavelength of 248 nm, and an ArF excimer laser apparatus, which outputs ultraviolet light having a wavelength of 193 nm, are used as the gas laser apparatus for exposure.

As a current exposure technology, liquid-immersion exposure, in which the gap between the projection lens of the exposure apparatus and a wafer is filled with a liquid, has been put into use. In the liquid-immersion exposure, since the refractive index of the gap between the projection lens and the wafer changes, the apparent wavelength of the light from the light source for exposure shortens. In the liquid-immersion exposure using an ArF excimer laser apparatus as the light source for exposure, the wafer is irradiated with ultraviolet light having an in-liquid wavelength of 134 nm. The technology described above is called ArF liquid-immersion exposure. The ArF liquid-immersion exposure is also called ArF liquid-immersion lithography.

Since KrF and ArF excimer laser apparatuses each provide a wide spectral linewidth ranging from about 350 to 400 pm in spontaneous oscillation, the chromatic aberrations occur in association with the laser light (ultraviolet light) projected with the size thereof reduced onto the wafer via the projection lens of the exposure apparatus, resulting in a decrease in the resolution. To avoid the decrease in the resolution, the spectral linewidth of the laser light outputted from the gas laser apparatus needs to be narrow enough to make the chromatic aberrations negligible. The spectral linewidth is also called a spectral width. To this end, a line narrowing module including a line narrowing element is provided in the laser resonator of the gas laser apparatus, and the line narrowing module narrows the spectral width. The line narrowing element may, for example, be an etalon or a grating. A laser apparatus having a narrowed spectral width described above is called a narrowed-line laser apparatus.

CITATION LIST

Patent Literature

[PTL 1] US Patent application Publication No. 2007/0252966
[PTL 2] JP-A-2013-179109
[PTL 3] JP-A-2009-217718
[PTL 4] JP-A-2011-197894
[PTL 5] U.S. Pat. No. 6,697,695
[PTL 6] US Patent application Publication No. 2016/0254634
[PTL 7] US Patent application Publication No. 2003/0013213

SUMMARY

A maintenance management method for a lithography system according to a viewpoint of the present disclosure includes organizing operating information for each of lithography cells that are each an apparatus group formed of a set of apparatuses and form the lithography system configured to perform resist coating, exposure, and development and saving the operating information for each of the lithography cells, organizing maintenance information on consumables that are each a maintenance target in each of the apparatuses in the apparatus group for each of the lithography cells and saving the maintenance information on each of the consumables for each of the lithography cells, calculating a standard maintenance timing for each of the consumables for each of the lithography cells based on the operating information for each of the lithography cells and the maintenance information on the consumable for each of the lithography cells, creating a maintenance schedule plan for each of the lithography cells or for each of manufacturing lines, the manufacturing lines each including at least two of the lithography cells, based on the standard maintenance timing for each of the consumables for each of the lithography cells, information on a downtime due to exchange of the consumable for each of the lithography cells, and information on a loss cost due to the downtime for each of the lithography cells or for each of the manufacturing lines, and outputting a result of the creation of the maintenance schedule plan.

A maintenance management apparatus for a lithography system according to another viewpoint of the present disclosure includes an operating information processing section configured to organize operating information for each of lithography cells that are each an apparatus group formed of a set of apparatuses and form the lithography system configured to perform resist coating, exposure, and development, and the operating information processing section further configured to save the operating information for each of the lithography cells, a maintenance information processing section configured to organize maintenance information on consumables that are each a maintenance target in each of the apparatuses in the apparatus group for each of the lithography cells and save the maintenance information on each of the consumables for each of the lithography cells, a standard maintenance timing calculating section configured to calculate a standard maintenance timing for each of the consumables for each of the lithography cells based on the operating information for each of the lithography cells and the maintenance information on the consumable for each of the lithography cells, a maintenance schedule planning section configured to create a maintenance schedule plan for each of the lithography cells or for each of manufacturing lines, the manufacturing lines each including at least two of the lithography cells, based on the standard maintenance timing for each of the consumables for each of the lithography cells, information on a downtime due to exchange of the consumable for each of the lithography cells, and information on a loss cost due to the downtime for each of the lithography cells or for each of the manufacturing lines, and a data output section configured to output a result of the creation of the maintenance schedule plan.

A non-transitory computer readable medium according to another viewpoint of the present disclosure on which a program including instructions is recorded causes a processor, when the processor executes the instructions in the program, to achieve the function of organizing operating information for each of lithography cells that are each an apparatus group formed of a set of apparatuses and form a lithography system configured to perform resist coating, exposure, and development and saving the operating information for each of the lithography cells, the function of organizing maintenance information on consumables that are each a maintenance target in each of the apparatuses in the apparatus group for each of the lithography cells and saving the maintenance information on each of the consumables for each of the lithography cells, the function of calculating a standard maintenance timing for each of the consumables for each of the lithography cells based on the operating information for each of the lithography cells and the maintenance information on the consumable for each of the lithography cells, the function of creating a maintenance schedule plan for each of the lithography cells or for each of manufacturing lines, the manufacturing lines each including at least two of the lithography cells, based on the standard maintenance timing for each of the consumables for each of the lithography cells, information on a downtime due to exchange of the consumable for each of the lithography cells, and information on a loss cost due to the downtime for each of the lithography cells or for each of the manufacturing lines, and the function of outputting a result of the creation of the maintenance schedule plan.

BRIEF DESCRIPTION OF THE DRAWINGS

Embodiments of the present disclosure will be described below only by way of example with reference to the accompanying drawings.

FIG. 8 is a table showing an example of table data contained in a file A.

FIG. 12 is a table showing an example of table data (1) contained in a file B.

FIG. 13 is a table showing an example of table data (2) contained in the file B.

FIG. 14 is a table showing an example of table data (3) contained in the file B.

FIG. 16 is a table showing an example of table data contained in a file C.

FIG. 17 is a table showing an example of table data contained in a file D.

FIG. 20 is a table showing an example of table data contained in a file E.

FIG. 23 is a table showing an example of table data contained in a file A(2).

FIG. 24 is a table showing an example of table data contained in a file F.

FIG. 29 is a table showing an example of table data contained in a file A(3).

FIG. 30 is a table showing an example of table data contained in a file F(2).

FIG. 32 is a table showing an example of log data contained in a file G.

FIG. 40 is a table showing an example of table data contained in a file H.

FIG. 44 is a table showing an example of table data contained in a file E(2).

FIG. 47 is a table showing an example of a monitoring parameter used to estimate the life of a consumable.

FIG. 52 is a table showings an example of table data contained in a file D(2).

FIG. 55 is a table showing an example of table data contained in a file J.

FIG. 56 is a flowchart showing an example of the contents of the processes carried out by a standard maintenance period calculating section.

DETAILED DESCRIPTION

Contents

Figure 1:
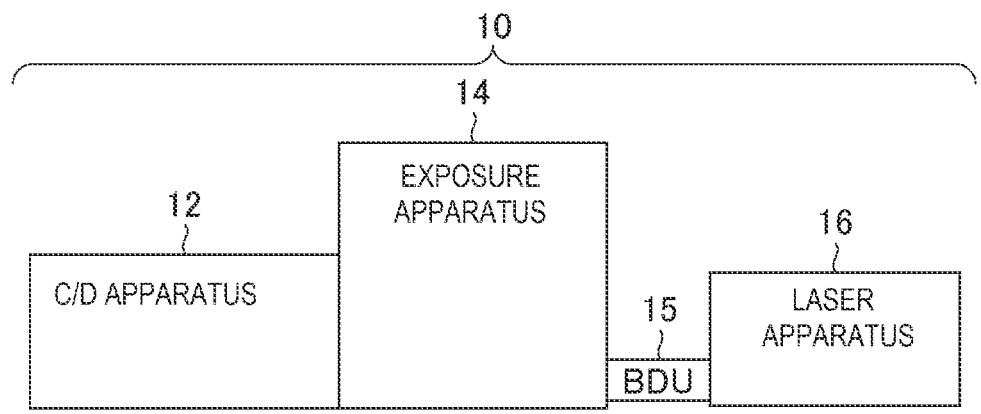
FIG. 1 is a front view schematically showing the configuration of an exemplary litho cell.

1. Description of terms
2. Description of litho cell
2.1 Configuration
2.2 Operation
2.2.1 Wafer movement in C/D apparatus and exposure apparatus and operation of pre-aligner
2.2.2 Maintenance of C/D apparatus
2.2.3 Operation performed in exposure step carried out by exposure apparatus
2.2.4 Maintenance of exposure apparatus
3. Description of laser apparatus
3.1 Configuration
3.2 Operation
3.3 Maintenance of laser apparatus
3.4 Others
4. Description of lithography system
4.1 Configuration
4.2 Operation
5. Problems
6. First Embodiment
6.1 Configuration
6.2 Operation
6.2.1 Operation of litho cell management server
6.2.2 Example of table data contained in file A
6.2.3 Example of table data (1) contained in file B
6.2.4 Example of table data (2) contained in file B
6.2.5 Example of table data (3) contained in file B
6.2.6 Example of processes carried out by standard maintenance date calculating section
6.2.7 Specific examples of files C and D
6.2.8 Example of processes carried out by maintenance schedule planning section
6.2.9 Specific example of file E
6.3 Effects and advantages
6.4 Others
7. Second Embodiment
7.1 Configuration
7.2 Operation
7.2.1 Operation of litho cell management server
7.2.2 Example of table data contained in file A(2)
7.2.3 Example of table data contained in file F
7.2.4 Example of processes carried out by standard maintenance date calculating section
7.2.5 Example of processes carried out by maintenance schedule planning section
7.3 Effects and advantages
8. Third Embodiment
8.1 Configuration
8.2 Operation
8.2.1 Operation of litho cell management server
8.2.2 Example of table data contained in file A(3)
8.2.3 Example of table data contained in file F(2)
8.3 Effects and advantages
9. Fourth Embodiment
9.1 Configuration
9.2 Operation
9.2.1 Operation of litho cell management server
9.2.2 Example of log data contained in file G
9.2.3 Example of processes carried out by estimated life value calculating section
9.3 Effects and advantages
10. Fifth Embodiment
10.1 Configuration
10.2 Operation
10.2.1 Operation of litho cell management server
10.2.2 Example of processes carried out by consumable selector
10.2.3 Example of table data contained in file H
10.3 Effects and advantages
11. Sixth Embodiment
11.1 Configuration
11.2 Operation
11.2.1 Operation of litho cell management server
11.3 Effects and advantages
11.4 Others
12. Example of optimization of maintenance schedule plan
13. Specific example of monitoring parameter 14. Example of reduction in downtime in a case where a plurality of consumables in the same apparatus are exchanged on the same day
14.1 Example of flowchart
14.2 Effects and advantages
14.3 Others
15. Another form of lithography system
15.1 Configuration
15.2 Operation
15.3 Effects and advantages
15.4 Others
16. Seventh Embodiment
16.1 Overview of form in which maintenance schedule plan is optimized on a line basis
16.2 Configuration
16.3 Operation
16.4 Effects and advantages
16.5 Variations
17. Eighth Embodiment
17.1 Configuration
17.2 Operation
17.3 Effects and advantages
17.4 Variation
18. Combination of embodiments
19. Computer readable medium on which program is recorded Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Description of Terms

A "lithography cell" is an apparatus group formed of a set of process apparatuses configured to perform resist coating, exposure, and development. The lithography cell is hereinafter referred to as a litho cell. The litho cell is one unit of a "lithography system." The lithography system includes at least one litho cell.

The litho cell includes, for example, a coating/developing apparatus, an exposure apparatus, and a laser apparatus. The litho cell may be configured to perform alignment after resist coating and then perform exposure.

The "coating/developing apparatus" includes a coater unit configured to coat a substrate with a resist and a developer unit configured to perform development. The coating/developing apparatus is referred to as a "C/D apparatus." The term "C/D" is an abbreviation of a coater/developer. The "C/D apparatus" may further include an in-line interface configured to transport wafers between the "C/D apparatus" and the exposure apparatus.

The "exposure apparatus" may further include a beam delivery unit (BDU) configured to deliver laser light outputted from the laser apparatus to the exposure apparatus.

The term "resist" stands for a photoresist.

"Consumables" are used as a term comprehensively representing articles, such as a part and a module that require regular maintenance. An exchange part or an exchange module is included in the concept of the "consumables." A module may be taken as one form of a part. In the present specification, the term "consumables" is used in some cases as a term synonymous with "an exchange module or an exchange part." The maintenance includes exchange of consumables. The concept of the "exchange" also includes not only exchange of a consumable with a new one but maintenance and/or recovery of the function of the consumable as a part, such as cleaning the consumable, and replacement of the same consumable.

2. Description of Litho Cell 2.1 Configuration

FIG. 1 is a front view schematically showing an example of the configuration of a litho cell. A litho cell 10 shown in FIG. 1 includes a C/D apparatus 12, an exposure apparatus 14, and a laser apparatus 16. The exposure apparatus 14 includes a BDU 15.

Figure 2:
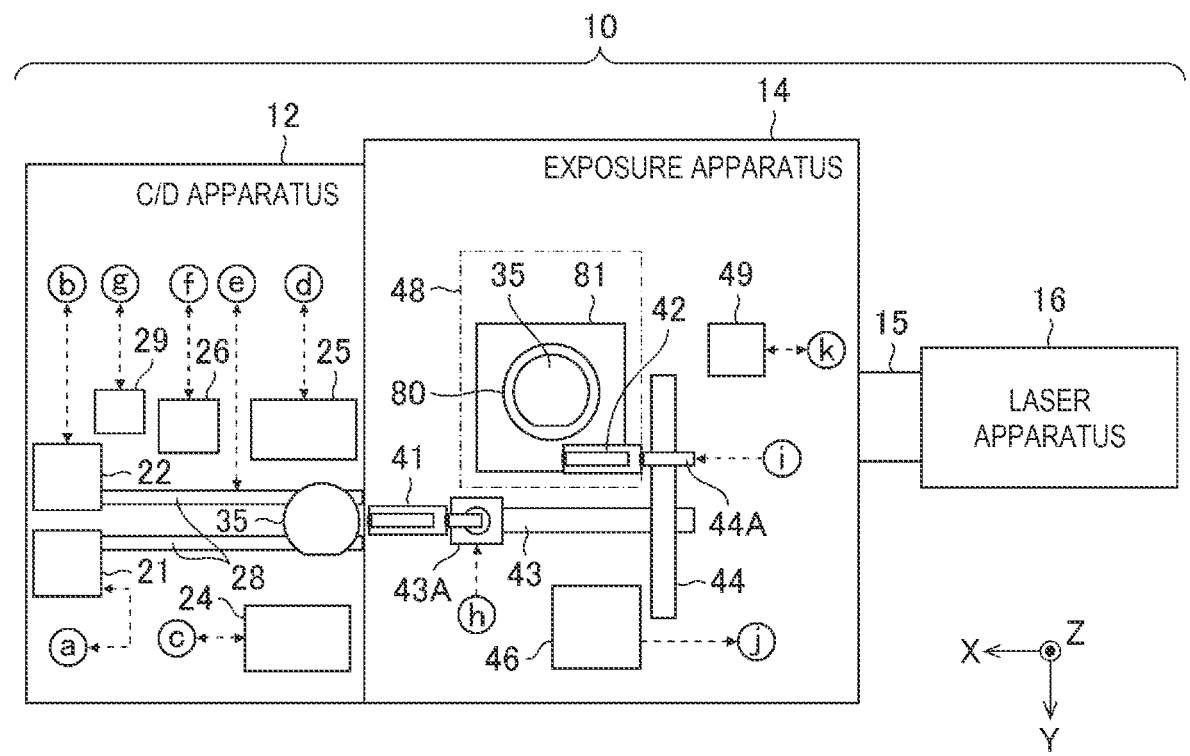
FIG. 2 shows a specific example of the litho cell.
Figure 3:
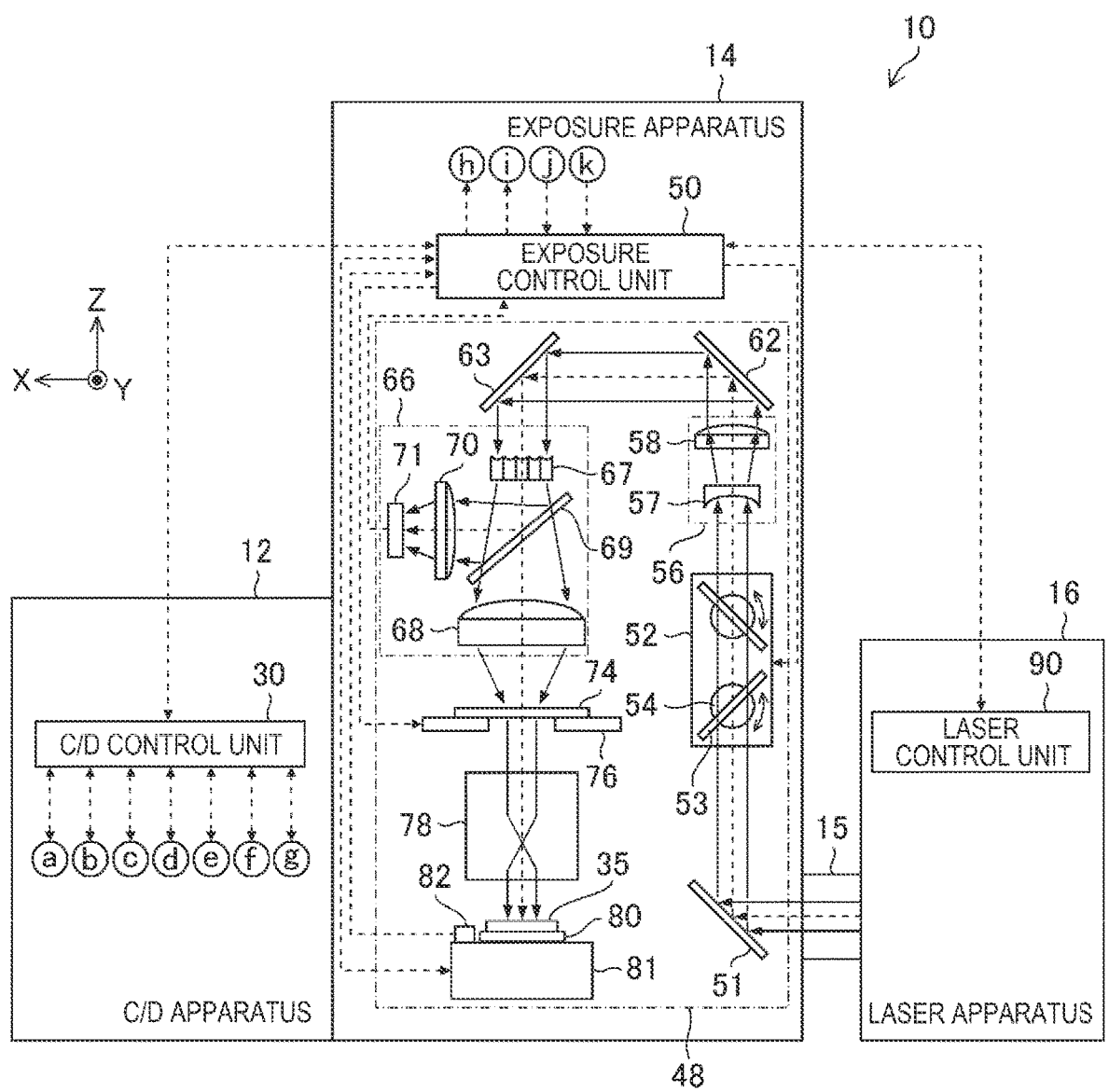
FIG. 3 shows the specific example of the litho cell.

FIGS. 2 and 3 are detailed views of the litho cell 10. FIG. 2 corresponds to a plan view, and FIG. 3 corresponds to a front view. A detailed example of the laser apparatus 16 will be described later with reference to FIG. 4.

The C/D apparatus 12 includes a first wafer carrier 21, a second wafer carrier 22, a coater unit 24, a developer unit 25, a measurement unit 26, a wafer transporting line 28, a filter unit 29, and a C/D control unit 30, as shown in FIGS. 2 and 3.

The first wafer carrier 21 is an apparatus configured to accommodate a large number of wafers 35 before exposure. The second wafer carrier 22 is an apparatus configured to accommodate a large number of wafers 35 after exposure. The coater unit 24 includes a resist coater, a pre-baker, and a cooler, none of which is shown. The coater unit 24 is an apparatus configured to coat the wafer 35 with a resist, pre-bake the resist, and cool the pre-baked wafer.

The developer unit 25 includes a post-baker, a cooler, and a developer, none of which is shown. The developer unit 25 is an apparatus configured to post-bake and cool the exposed wafer 35 and then develop the resist.

The measurement unit 26 is an apparatus configured to measure the shape of a resist pattern formed by the exposure on the wafer 35. The measurement unit 26 may, for example, be an inspection apparatus formed of a scanning electron microscope (SEM), which is configured to irradiate the surface of the wafer with an electron beam and detect secondary electrons or reflected electrons radiated from the surface of the wafer.

The wafer transporting line 28 is so disposed as to extend through between the coater unit 24 and the developer unit 25. The wafer transporting line 28 is configured to be capable of transporting each wafer 35 to the first wafer carrier 21 and the apparatuses in the coater unit 24, the exposure apparatus 14 and the apparatuses in the developer unit 25, the measurement unit 26, and the second wafer carrier 22.

A chemical filter configured to remove impurity gases contained in the air in a clean room is disposed in the filter unit 29. The filter unit 29 includes a gas analyzer that is not shown but is configured to measure the concentration of each impurity gas, such as ammonia, in the C/D apparatus 12. The filter unit 29 includes signal lines along which information on the operation period of the chemical filter and information on the concentration of each impurity gas are sent to the C/D control unit 30.

The C/D control unit 30 is configured to control the operation of each of the first wafer carrier 21, the second wafer carrier 22, the coater unit 24, the developer unit 25, the measurement unit 26, and the wafer transporting line 28. In FIGS. 2 and 3, the signal lines along which signals are transmitted between the C/D control unit 30 and the first wafer carrier 21, the second wafer carrier 22, the coater unit 24, the developer unit 25, the measurement unit 26, the wafer transporting line 28, and the filter unit 29 are indicated by symbols that are reference characters a to g each surrounded by a circle.

The exposure apparatus 14 includes a first arm 41, a second arm 42, a first guide 43, a second guide 44, a pre-aligner 46, an exposure unit 48, a filter unit 49, and an exposure control unit 50.

The first arm 41 is supported by a first slider 43A and is movable via the first slider 43A along the first guide 43. The second arm 42 is supported by a second slider 44A and is movable via the second slider 44A along the second guide 44.

The filter unit 49 includes a chemical filter configured to remove impurity gases contained in the air in the clean room, primarily ammonia, and a gas analyzer that is not shown but is configured to measure the concentration of each impurity gas, such as ammonia, in the exposure apparatus 14, as the filter unit 29 in the C/D apparatus 12 does. The filter unit 49 includes signal lines along which information on the operation period of the chemical filter and information on the concentration of each impurity gas are sent to the exposure control unit 50. The filter unit 49 may be provided in the exposure unit 48.

The exposure unit 48 includes a first high-reflectance mirror 51, an attenuator 52, a beam expander 56, a second high-reflectance mirror 62, a third high-reflectance mirror 63, an illumination optical system 66, a reticle 74, and a reticle stage 76, as shown in FIG. 3.

The exposure apparatus 14 may include the BDU 15. The BDU 15 is an optical system configured to deliver the laser light from the laser apparatus 16 to the exposure apparatus 14 and may include, for example, a plurality of high-reflectance mirrors that are not shown.

The first high-reflectance mirror 51 is so disposed as to cause the laser light having passed through the BDU 15 to be incident on the second high-reflectance mirror 62. The attenuator 52 is disposed in the optical path between the first high-reflectance mirror 51 and the beam expander 56. The attenuator 52 includes two partially reflective mirrors 53 and rotary stages 54 capable of changing the angle of incidence of the light incident on the partially reflective mirrors 53.

The beam expander 56 is disposed in the optical path between the attenuator 52 and the second high-reflectance mirror 62. The beam expander 56 includes a concave lens 57 and a convex lens 58 and is configured to expand the laser light in such a way that the expanded laser light has a predetermined laser light shape.

The second high-reflectance mirror 62 is so disposed that the laser light is incident on the third high-reflectance mirror 63. A collimator optical system that is not shown may be disposed in the optical path between the second high-reflectance mirror 62 and the third high-reflectance mirror 63. The third high-reflectance mirror 63 is so disposed that the laser light enters the illumination optical system 66.

The illumination optical system 66 includes a fly-eye lens 67, a condenser optical system 68, a beam splitter 69, a light collection lens 70, and a first optical sensor 71.

The fly-eye lens 67 and the condenser optical system 68 are so disposed that the reticle 74 is illuminated with the laser light in the form of Koehler illumination. For example, the fly-eye lens 67 and the condenser optical system 68 are so disposed that the focal point of the fly-eye lens 67 coincides with the front focal plane of the condenser optical system 68 and the reticle 74 is disposed in the rear focal plane of the condenser optical system 68.

The beam splitter 69 is disposed in the optical path between the fly-eye lens 67 and the condenser optical system 68. The beam splitter 69 is so disposed that part of the laser light enters the light collection lens 70.

The first optical sensor 71 is disposed in the focal plane of the light collection lens 70. The first optical sensor 71 may, for example, be a two-dimensional image sensor. A signal detected with the first optical sensor 71 is sent to the exposure control unit 50.

The reticle 74 is a mask on which a semiconductor circuit pattern is formed. The reticle 74 is fixed to the reticle stage 76 via a holder that is not shown.

The exposure unit 48 includes a projection optical system 78, a wafer holder 80, a wafer stage 81, and a second optical sensor 82.

The projection optical system 78 is so disposed that an image of the reticle 74 is formed on the resist with which the wafer 35 is coated. The projection optical system 78 is formed of a plurality of lenses that are not shown.

The wafer stage 81 is configured to fix the wafer 35 via the wafer holder 80.

The second optical sensor 82 is so disposed on the wafer stage 81 as to be capable of measuring offline the illuminance on the wafer 35. A signal detected with the second optical sensor 82 is sent to the exposure control unit 50.

The exposure control unit 50 is configured to control the operation of each of the first slider 43A, the second slider 44A, the pre-aligner 46, the attenuator 52, the reticle stage 76, the wafer stage 81, and other portions of the exposure apparatus 14.

In FIGS. 2 and 3, the signal lines along which signals are transmitted between the exposure control unit 50 and the first slider 43A, the second slider 44A, the pre-aligner 46, and the filter unit 49 are indicated by symbols that are reference characters h to k each surrounded by a circle. The exposure control unit 50 is connected to the C/D control unit 30 and the laser control unit 90.

In the present disclosure, a control apparatus that functions as each of the C/D control unit 30, the exposure control unit 50, the laser control unit 90, and other control units can be achieved by the combination of hardware formed of one or more computers and software installed thereon. The software is synonymous with a program. A programmable controller is included in the concept of a computer. The computer can be formed of a CPU (central processing unit) and a memory. The CPU provided in the computer is an example of a processor.

Part or entirety of the processing functions of the control apparatus may be achieved by using an integrated circuit represented by an FPGA (field programmable gate array) and an ASIC (application specific integrated circuit).

The functions of a plurality of control apparatuses can be achieved by a single control apparatus. Further, in the present disclosure, the control apparatuses may be connected to each other via a communication network, such as a local area network and the Internet. In a distributed computing environment, a program unit may be saved in both local and remote memory storage devices.

2.2 Operation
2.2.1 Wafer Movement in C/D Apparatus and Exposure Apparatus and Operation of Pre-Aligner The movement of the wafer 35 in the C/D apparatus 12 and the exposure apparatus 14 shown in FIGS. 2 and 3 will now be described. The first wafer carrier 21 is configured to accommodate a large number of wafers before resist coating.

The wafers 35 accommodated in the first wafer carrier 21 are transported to the coater unit 24 via the wafer transporting line 28.

The coater unit 24 is configured to coat the surface of the wafer 35 with a resist, pre-bake the resist, and cool the pre-baked wafer 35. The cooled wafer 35 is transported to the exposure apparatus 14 via the wafer transporting line 28.

The wafer 35 coated with the resist is taken by the first arm 41 from the wafer transporting line 28, moved along with the first arm 41 along the first guide 43, and placed in the pre-aligner 46.

The pre-aligner 46 is configured to, for example, adjust the position of the center of the wafer 35 with reference to the outer shape thereof and further adjust the angle of rotation of the wafer 35. The wafer 35 is then handed over to the second arm 42, transported along the second guide 44 to a loading position, and loaded on the wafer holder 80 on the wafer stage 81.

Each shot region on the wafer 35 is exposed with the laser light via the predetermined device pattern of the reticle 74.

The wafer 35 entirely exposed to the laser light is transported to the wafer transporting line 28 in the C/D apparatus 12 along the second guide 44 and the first guide 43.

The exposed wafer 35 is transported to the developer unit 25 via the wafer transporting line 28. The developer unit 25 is configured to post-bake the exposed wafer 35, cool the post-baked wafer 35, and then develop the resist. The developed wafer 35 is transported to the measurement unit 26 via the wafer transporting line 28.

The measurement unit 26 is configured to measure the shape of the resist pattern formed by the exposure on the wafer 35. The measurement unit 26 is configured to inspect as required the linewidth of the pattern formed by exposure on the wafer 35, an overlaying error, and other factors, and the wafer 35 is then transported along the wafer transporting line 28 and accommodated in the second wafer carrier 22.

After the lithography step described above is completed, for example, one lot of wafers in the second wafer carrier 22 is transported, for example, to a manufacturing line that is not shown for a pattern formation step, such as etching or ion implantation, a resist stripping step, and other steps.

Figure 5:
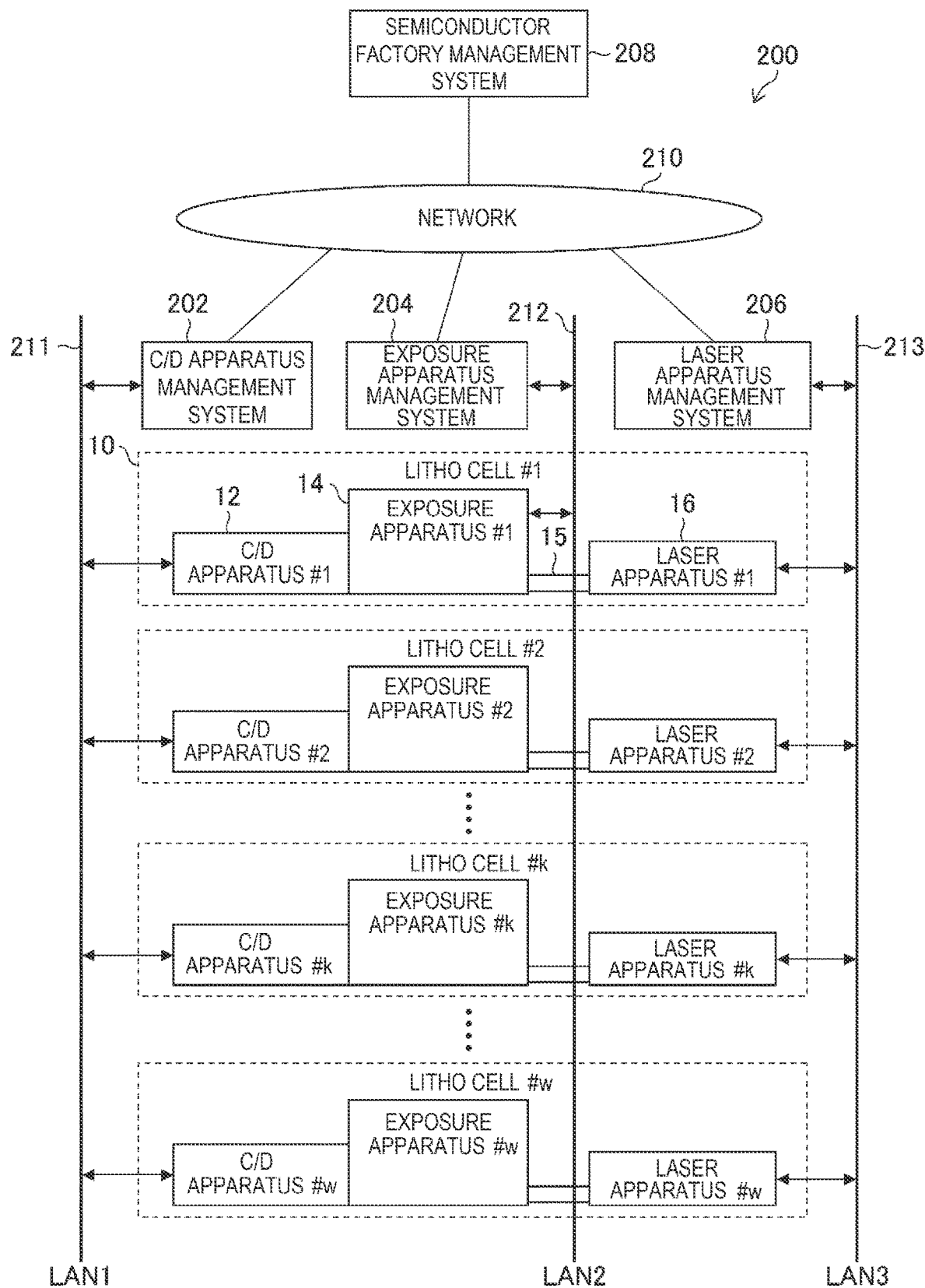
FIG. 5 schematically shows an example of the configuration of a lithography system in a semiconductor factory.

The C/D control unit 30 is configured to cause the gas analyzer of the filter unit 29 to measure the concentration of each impurity gas in the air in the C/D apparatus 12 and transmit data on the measured values to a C/D apparatus management system 202 (see FIG. 5).

2.2.2 Maintenance of C/D Apparatus

Primary maintenance work performed on the C/D apparatus 12 and requiring a service engineer responsible for the C/D apparatus 12 includes exchange or sustention of the chemical filter, a substrate rotating module, a drain recovery module, and a discharge module, none of which is shown. The timing when the consumables described above (modules and parts) are each exchanged is managed by using life parameters, such as the operation period and the number of processed wafers. The maintenance including, for example, exchange of any of the consumables and post-exchange checking takes several hours in some cases.

2.2.3 Operation Performed in Exposure Step Carried Out by Exposure Apparatus

The operation of the exposure step carried out by the exposure apparatus 14 will next be described. The exposure control unit 50 is configured to adjust alignment of the reticle 74 with the wafer 35 by operating the reticle stage 76 and the wafer stage 81 in such a way that regions of the reticle 74 and the wafer 35 that are the regions to be exposed to the laser light are moved to an initial position of the scanning exposure.

The exposure control unit 50 is configured to control the angles of the two partially reflective mirrors 53 via the rotary stages 54 in the attenuator 52 in such a way that the fluence on the wafer 35 has a predetermined value. The exposure control unit 50 is configured to transmit a variety of target values to the laser control unit 90. The variety of target values include, for example, target pulse energy and a target wavelength.

The exposure control unit 50 is configured to transmit a light emission trigger signal to the laser apparatus 16 upon reception of a light emission trigger signal acceptance signal from the laser apparatus 16. Pulsed laser light is outputted from the laser apparatus 16 in synchronization with the light emission trigger signal.

The pulsed laser light outputted from the laser apparatus 16 in accordance with the light emission trigger signal is reflected off the first high-reflectance mirror 51 at high reflectance and enters the attenuator 52.

The pulsed laser light having passed through the attenuator 52 and thus having been attenuated enters the beam expander 56. The pulsed laser light beam passes through the beam expander 56 and is shaped thereby into a predetermined beam shape.

The pulsed laser light having the beam shape achieved by the beam expander 56 enters the illumination optical system 66 via the second high-reflectance mirror 62 and the third high-reflectance mirror 63.

The fly-eye lens 67 produces a plurality of secondary light sources, and the condenser optical system 68 guides the light having passed through the beam splitter 69 to the reticle 74, whereby the reticle 74 placed in the rear focal plane of the condenser optical system 68 is illuminated with the pulsed laser light in the form of Koehler illumination. As a result, the intensity distribution of the pulsed laser light is homogenized on the reticle 74.

Part of the pulsed laser light having passed through the fly-eye lens 67 is reflected off the beam splitter 69 and is incident on the first optical sensor 71 via the light collection lens 70. Since the light receiving surface of the first optical sensor 71 is also illuminated with the reflected pulsed laser light in the form of Koehler illumination, measuring the intensity distribution of the received light with the first optical sensor 71 allows the exposure control unit 50 to monitor the homogeneity of the laser beam on the reticle 74 and the transmittance of the laser light passing through the exposure apparatus 14.

The pulsed laser light having passed through the reticle 74 is focused by the projection optical system 78 on the resist on the wafer 35, whereby the resist is exposed to the pulsed laser light.

The reticle 74 and the wafer 35, while linearly moving at uniform speed in opposite directions, are exposed to the pulsed laser light with the reticle stage 76 and the wafer stage 81 synchronized with the light emission trigger signal. Exposure of one segment of an exposure target area is thus completed.

After the wafer stage 81 is moved to the subsequent exposure position, the exposure control unit 50 transmits the light emission trigger signal to the laser apparatus 16 to repeat the series of scanning exposure described above.

The wafer 35 having entirely been exposed to the pulsed laser light is transported from the wafer stage 81 to the C/D apparatus 12.

The exposure control unit 50 is configured to calculate the transmittance of the pulsed laser light passing through the illumination optical system 66 based on the pulse energy of the pulsed laser light outputted from the laser apparatus 16 and the value detected with the first optical sensor 71 and transmit data on the calculated transmittance to an exposure apparatus management system 204 (see FIG. 5).

2.2.4 Maintenance of Exposure Apparatus

Examples of the primary maintenance work performed on the exposure apparatus 14 and requiring a service engineer responsible for the exposure apparatus 14 include the following types of work.

[Work 1] Exchange of optical elements or optical modules in optical units from BDU 15 to illumination optical system 66

[Work 2] Exchange of modules, such as mechanical parts configured to transport wafer 35 and place wafer 35 on wafer stage 81 and wafer stage 81 in exposure unit 48

[Work 3] Exchange of chemical filter

The timings when the consumables presented in Work 1 to Work 3 by way of example are exchanged are managed by using the life parameters below.

The timings when the consumables involved in Work 1 are exchanged are managed by using the number of exposure pulses. The number of exposure pulses is roughly equal to the number of pulses by which the pulsed laser light has passed through the optical units described above. The timings when the consumables involved in Work 2 are exchanged are managed by using the number of processed wafers. The timings when the consumables involved in Work 3 are exchanged are managed by using the operation period. The maintenance including the exchange of any of the consumables described above takes from 1 to 24 hours in some cases.

3. Description of Laser Apparatus

3.1 Configuration

Figure 4:
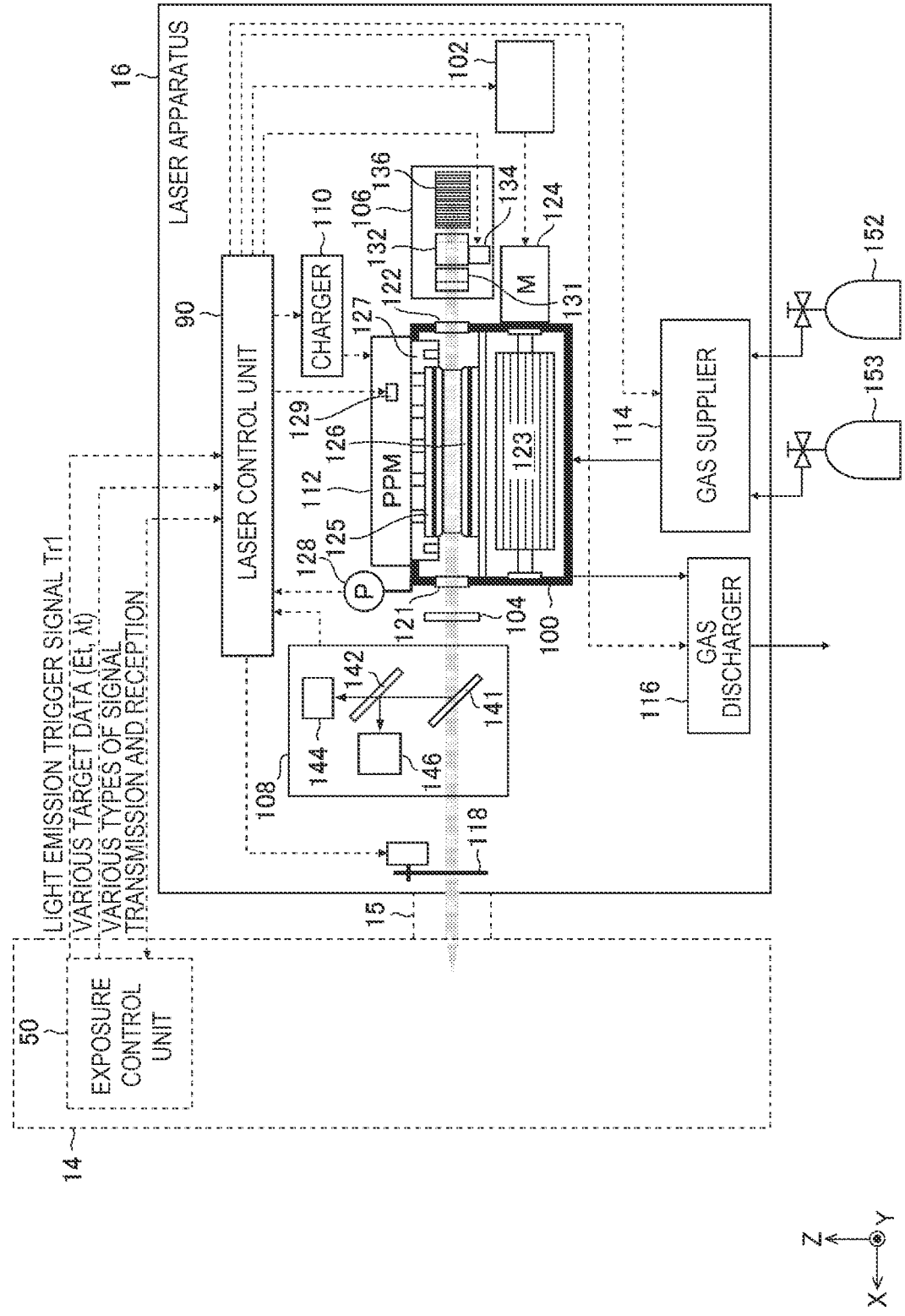
FIG. 4 schematically shows the configuration of an exemplary laser apparatus.

FIG. 4 schematically shows the configuration of an exemplary laser apparatus. The laser apparatus 16 is, for example, a KrF excimer laser apparatus and includes a laser control unit 90, a laser chamber 100, an inverter 102, a front mirror 104, a line narrowing module (LNM) 106, a monitoring module 108, a charger 110, a pulse power module (PPM) 112, a gas supplier 114, a gas discharger 116, and an output port shutter 118.

The laser chamber 100 includes a first window 121, a second window 122, a cross-flow fan (CFF) 123, a motor 124, which rotates the CFF 123, a pair of electrodes 125 and 126, an electric insulator 127, a pressure sensor 128, and a heat exchanger that is not shown.

The inverter 102 is an apparatus configured to supply the motor 124 with electricity. The inverter 102 is configured to receive from the laser control unit 90 an instruction signal configured to identify the frequency of the electric power supplied to the motor 124.

The PPM 112 is connected to the electrode 125 via feed through elements in the electric insulator 127 in the laser chamber 100. The PPM 112 includes a semiconductor switch 129 and the following components: a charging capacitor; a pulse transformer; and a pulse compression circuit, none of which is shown.

The front mirror 104 is a partially reflective mirror and is so disposed that the front mirror 104 and the LNM 106 form an optical resonator. The laser chamber 100 is disposed in the optical path of the optical resonator. The front mirror 104 functions as an output coupling mirror.

The LNM 106 includes a beam expander using a first prism 131 and a second prism 132, a rotary stage 134, and a grating 136. The first prism 131 and the second prism 132 are so disposed as to expand the light beam having exited via the second window 122 of the laser chamber 100 in the axis-Y direction and cause the expanded light beam to be incident on the grating 136.

The grating 136 is disposed in the Littrow arrangement, which causes the angle of incidence of the laser light incident on the grating 136 to be equal to the angle of diffraction of the laser light diffracted by the grating 136. The second prism 132 is so disposed on the rotary stage 134 that rotation of the rotary stage 134 changes the angle of incidence of the laser light incident on the grating 136 and the angle of diffraction of the laser light diffracted by the grating 136.

The monitoring module 108 includes a first beam splitter 141, a second beam splitter 142, a pulse energy detector 144, and a spectrum detector 146. The first beam splitter 141 is disposed in the optical path of the laser light having exited via the front mirror 104 and so disposed that part of the laser light, that is, the laser light reflected off the first beam splitter 141 is incident on the second beam splitter 142.

The pulse energy detector 144 is so disposed that the laser light having passed through the second beam splitter 142 is incident on the pulse energy detector 144. The pulse energy detector 144 may, for example, be a photodiode configured to measure the optical intensity of ultraviolet light. The second beam splitter 142 is so disposed that the laser light reflected off the second beam splitter 142 is incident on the spectrum detector 146.

The spectrum detector 146 is, for example, a monitor etalon measurement apparatus configured to measure interference fringes produced by an etalon with an image sensor. Based on the produced interference fringes, the center wavelength and the spectrum linewidth of the laser light are measured.

The gas supplier 114 in the case where a KrF excimer laser apparatus is employed is connected via pipes to an inert gas supply source 152, which is a source configured to supply an inert laser gas, and a halogen gas supply source 153, which is a source configured to supply a halogen-containing laser gas. The inert laser gas is the mixture of a Kr gas and an Ne gas. The halogen-containing laser gas is the mixture of an $F_2$ gas, a Kr gas, and an Ne gas. The gas supplier 114 is connected to the laser chamber 100 via a pipe.

The gas supplier 114 includes automatic valves and mass flow controllers that are not shown but are configured to supply the inert laser gas or the halogen-containing laser gas to the laser chamber by predetermined amounts.

The gas discharger 116 is connected to the laser chamber 100 via a pipe. The gas discharger 116 includes a halogen filter and a discharge pump that are not shown but are configured to remove the halogen gas and is configured to discharge the laser gas from which the halogen gas has been removed out of the laser apparatus 16.

The output port shutter 118 is disposed in the optical path of the laser light to be outputted from the laser apparatus 16.

3.2 Operation

The operation of the laser apparatus 16 will be described. The laser control unit 90 is configured to discharge the gases in the laser chamber 100 via the gas discharger 116 and then fill the inert laser gas and the halogen-containing laser gas via the gas supplier 114 in such a way that a desired gas composition and total gas pressure are achieved.

The laser control unit 90 is configured to rotate the motor 124 at a predetermined rotational speed via the inverter 102 to rotate the CFF 123. The laser gas thus flows through the space between the electrodes 125 and 126.

The laser control unit 90 is configured to receive target pulse energy Et from the exposure apparatus 14 and transmit data on charging voltage Vhv to the charger 110 in such a way that the pulse energy of the pulsed laser light becomes Et.

The charger 110 is configured to charge the charging capacitor in the PPM 112 in such a way that the charging voltage Vhv is achieved. When a first trigger signal Tr1 is outputted from the exposure apparatus 14, a second trigger signal Tr2 is inputted from the laser control unit 90 in synchronization with the first trigger signal Tr1 to the semiconductor switch 129 in the PPM 112. When the semiconductor switch 129 operates, a pulse compression circuit in the PPM 112 compresses current pulses, and high voltage is applied to the space between the electrodes 125 and 126. As a result, discharge occurs between the electrodes 125 and 126, and the laser gas is excited in the discharge space.

When the state of the excited laser gas in the discharge space transitions to the ground state, excimer light is produced. The excimer light travels back and forth between the front mirror 104 and the LNM 106 and is therefore amplified, resulting in laser oscillation. As a result, the narrowed-line pulsed laser light is outputted via the front mirror 104.

The pulsed laser light outputted via the front mirror 104 enters the monitoring module 108. In the monitoring module 108, the first beam splitter 141 is configured to sample part of the laser light, and the sampled laser light is incident on the pulse energy detector 144 and the spectrum detector 146 via the second beam splitter 142.

Pulse energy E of the pulsed laser light outputted from the laser apparatus 16 is measured with the pulse energy detector 144, and data on the measured pulse energy E is transmitted from the pulse energy detector 144 to the laser control unit 90.

A center wavelength $\lambda$ and a spectrum linewidth $\Delta\lambda$ are measured with the spectrum detector 146, and data on the measured center wavelength $\lambda$ and spectrum linewidth $\Delta\lambda$ are transmitted from the spectrum detector 146 to the laser control unit 90.

The laser control unit 90 is configured to receive the target pulse energy Et and a target wavelength $\lambda t$ from the exposure apparatus 14. The laser control unit 90 is configured to control the pulse energy based on the pulse energy E measured with the pulse energy detector 144 and the target pulse energy Et. The pulse energy control involves controlling the charging voltage Vhv in such a way that the difference $\Delta E = E - Et$ between the pulse energy E measured with the pulse energy detector 144 and the target pulse energy Et approaches zero.

The laser control unit 90 is configured to control the wavelength of the pulsed laser light based on the central wavelength $\lambda$ measured with the spectrum detector 146 and the target wavelength $\lambda t$. The wavelength control involves controlling the angle of rotation of the rotary stage 134 in such a way that the difference $\delta\lambda = \lambda - \lambda t$ between the central wavelength $\lambda$ measured with the spectrum detector 146 and the target wavelength $\lambda t$ approaches zero.

As described above, the laser control unit 90 is configured to receive the target pulse energy Et and the target wavelength $\lambda t$ from the exposure apparatus 14 and cause the laser apparatus 16 to output, whenever the light emission trigger signal Tr1 is inputted to the laser control unit 90, the pulsed laser light in synchronization with the light emission trigger signal Tr1.

When the laser apparatus 16 repeats the discharge, the electrodes 125 and 126 wear, and consumption of the halogen gas in the laser gas and generation of impurity gases are caused. A decrease in the concentration of the halogen gas and an increase in the impurity gases in the laser chamber 100 lower the pulse energy of the pulsed laser light and adversely affect the stability of the pulse energy. The laser control unit 90 is configured to perform, for example, the following gas control to suppress the adverse effects described above.

[1] Halogen Injection Control

The laser control unit 90 is configured to perform halogen injection control. The halogen injection control is gas control in which the halogen gas consumed primarily by the discharge in the laser chamber 100 is replenished in the laser chamber 100 during the laser oscillation by injecting the halogen-containing gas having a concentration higher than that of the halogen gas in the laser chamber 100.

[2] Partial Gas Exchange Control

The laser control unit 90 performs partial gas exchange control. The partial gas exchange control is gas control in which part of the laser gas in the laser chamber 100 is exchanged for a new laser gas during the laser oscillation in such a way that an increase in the concentrations of the impurity gases in the laser chamber 100 is suppressed.

[3] Gas Pressure Control

The laser control unit 90 performs gas pressure control. The gas pressure control is gas control in which the pulse energy is controlled by injecting the laser gas into the laser chamber 100 to change gas pressure Pch of the laser gas against the decrease in the pulse energy of the pulsed laser light outputted from the laser apparatus 16. The pulse energy is typically controlled by controlling the charging voltage Vhv. The gas pressure control is instead performed when full control of the charging voltage Vhv is not effective enough to compensate the decrease in the pulse energy of the pulsed laser light outputted from the laser apparatus 16.

The laser control unit 90 is configured to control the gas discharger 116 to discharge the laser gas out of the laser chamber 100. The halogen gas is removed by a halogen filter that is not shown from the laser gas discharged from the laser chamber 100, and the resultant laser gas is discharged out of the laser apparatus 16.

The laser control unit 90 is configured to transmit data on the number of oscillation pulses, the charging voltage Vhv, the gas pressure Pch in the laser chamber 100, the pulse energy E of the laser light, and other parameters to a laser apparatus management system 206 (see FIG. 5).

3.3 Maintenance of Laser Apparatus

Examples of the primary maintenance work performed on the laser apparatus 16 and requiring a service engineer responsible for the laser apparatus 16 include exchange of the laser chamber 100, exchange of the LNM 106, exchange of the monitoring module 108, and other types of work.

The timings when the primary maintenance target modules (consumables) are exchanged are managed by using the number of oscillation pulses from the laser apparatus 16 as one of the life parameters. The period required to exchange the primary consumables described above takes as long as 3 to 10 hours in some cases. Among the primary consumables described above, the laser chamber 100 requires the longest exchange period.

3.4 Others

The example shown in FIG. 4 has been described with reference to the case where a KrF excimer laser apparatus is employed as the laser apparatus 16, but not necessarily, and another laser apparatus may be employed. For example, the laser apparatus 16 may be an ArF excimer laser apparatus.

The example shown in FIG. 4 has been described with reference to the case where the gas control performed by the laser apparatus 16 includes the halogen injection control, the partial gas exchange control, and the gas pressure control, but not necessarily. For example, the gas pressure control may not necessarily be performed.

4. Description of Lithography System

4.1 Configuration

FIG. 5 schematically shows an example of the configuration of a lithography system in a semiconductor factory. A lithography system 200 in a semiconductor factory includes a plurality of litho cells 10, the C/D apparatus management system 202, the exposure apparatus management system 204, the laser apparatus management system 206, and a semiconductor factory management system 208.

The semiconductor factory management system 208 is connected to the C/D apparatus management system 202, the exposure apparatus management system 204, and the laser apparatus management system 206 via a network 210.

The network 210 is a communication line configured to allow information conveyance based on a wired and/or wireless configuration. The network 210 may be a wide area network or a local area network.

To identify each of the plurality of litho cells 10 provided in the lithography system 200, litho cell identification characters #1, #2, ..., #k, ..., #w are used in the description. Reference character w represents the number of litho cells provided in the lithography system 200. Reference character w is an integer greater than or equal to 1. Reference character k is an integer greater than or equal to 1 but smaller than or equal to w.

The C/D apparatus 12, the exposure apparatus 14, and the laser apparatus 16 provided in the litho cell #k are hereinafter referred to as a C/D apparatus #k, an exposure apparatus #k, and a laser apparatus #k for convenience. In the description, each litho cell #k includes one C/D apparatus #k, one exposure apparatus #k, and one laser apparatus #k for simplicity. Each litho cell #k may have the configuration described with reference to FIGS. 1 to 4.

Part or entirety of the plurality of litho cells #1 to #w may have forms different from one another. The numbers, the arrangement, and other factors of C/D apparatuses #k, exposure apparatuses #k, and laser apparatuses #k provided in the litho cell #k can be designed as appropriate. The litho cell #k includes one or more C/D apparatuses #k, one or more exposure apparatuses #k, and one or more laser apparatuses #k.

The C/D apparatuses #1 to #w and the C/D apparatus management system 202 are connected to a first local area network 211. The exposure apparatuses #1 to #w and the exposure apparatus management system 204 are connected to a second local area network 212. The laser apparatuses #1 to #w and the laser apparatus management system 206 are connected to a third local area network 213.

The first local area network 211, the second local area network 212, and the third local area network 213 are communication lines independent of one another and cannot exchange information with one another. In FIG. 5, the first local area network 211 is expressed by "LAN1," the second local area network 212 is expressed by "LAN2," and the third local area network 213 is expressed by "LAN3."

4.2 Operation

The C/D apparatus management system 202 is configured to manage the timings when the consumables in the C/D apparatuses #1 to #w are exchanged by using the operation period and the number of processed wafers.

The exposure apparatus management system 204 is configured to manage the timings when the consumables in the exposure apparatuses #1 to #w are exchanged by using the operation period, the number of processed wafers, and the number of pulses by which the pulsed laser light has passed through the optical units in the exposure apparatuses #1 to #w.

The laser apparatus management system 206 is configured to manage the timings when the consumables in the laser apparatuses #1 to #w are exchanged by using the number of pulses produced in the laser oscillation.

The C/D apparatus management system 202, the exposure apparatus management system 204, and the laser apparatus management system 206 may be configured to display respective maintenance management information on respective display terminals or transmit the information to the semiconductor factory management system 208 over the network 210.

A management line via which the C/D apparatus management system 202 is configured to manage the C/D apparatuses #1 to #w, a management line via which the exposure apparatus management system 204 is configured to manage the exposure apparatuses #1 to #w, and a management line via which the laser apparatus management system 206 is configured to manage the laser apparatuses #1 to #w are independent of one another, and a manager of the semiconductor factory determines the maintenance timings based on the maintenance management information outputted from each of the apparatuses.

5. Problems

The management line for the C/D apparatuses #1 to #w, the management line for the exposure apparatuses #1 to #w, and the management line for the laser apparatuses #1 to #w are independent of one another and are configured to maintain the respective apparatuses based on the maintenance management information, as shown in FIG. 5, and therefore, the following problems occur in some cases.

[Problem 1] Since the life of each consumable in each apparatus is evaluated based on a parameter specific to the consumable, a first problem is determination of an optimum maintenance timing of the consumable. Examples of the life evaluating parameter include the operation period, the number of processed wafers, the number of exposure pulses in the exposure apparatus, and the number of pulses produced in the laser oscillation.

[Problem 2] When maintenance that requires a service engineer is performed on even only one consumable in an apparatus in the litho cell 10, the wafer processing is suspended at least for several hours in the litho cell 10. A second problem is therefore optimization of the maintenance timing in each of the litho cells.

The maintenance timing may, for example, be the date when the maintenance is performed, that is, a maintenance date. The maintenance timing is not limited to a maintenance date and may instead be maintenance date and time.

6. First Embodiment

6.1 Configuration

Figure 6:
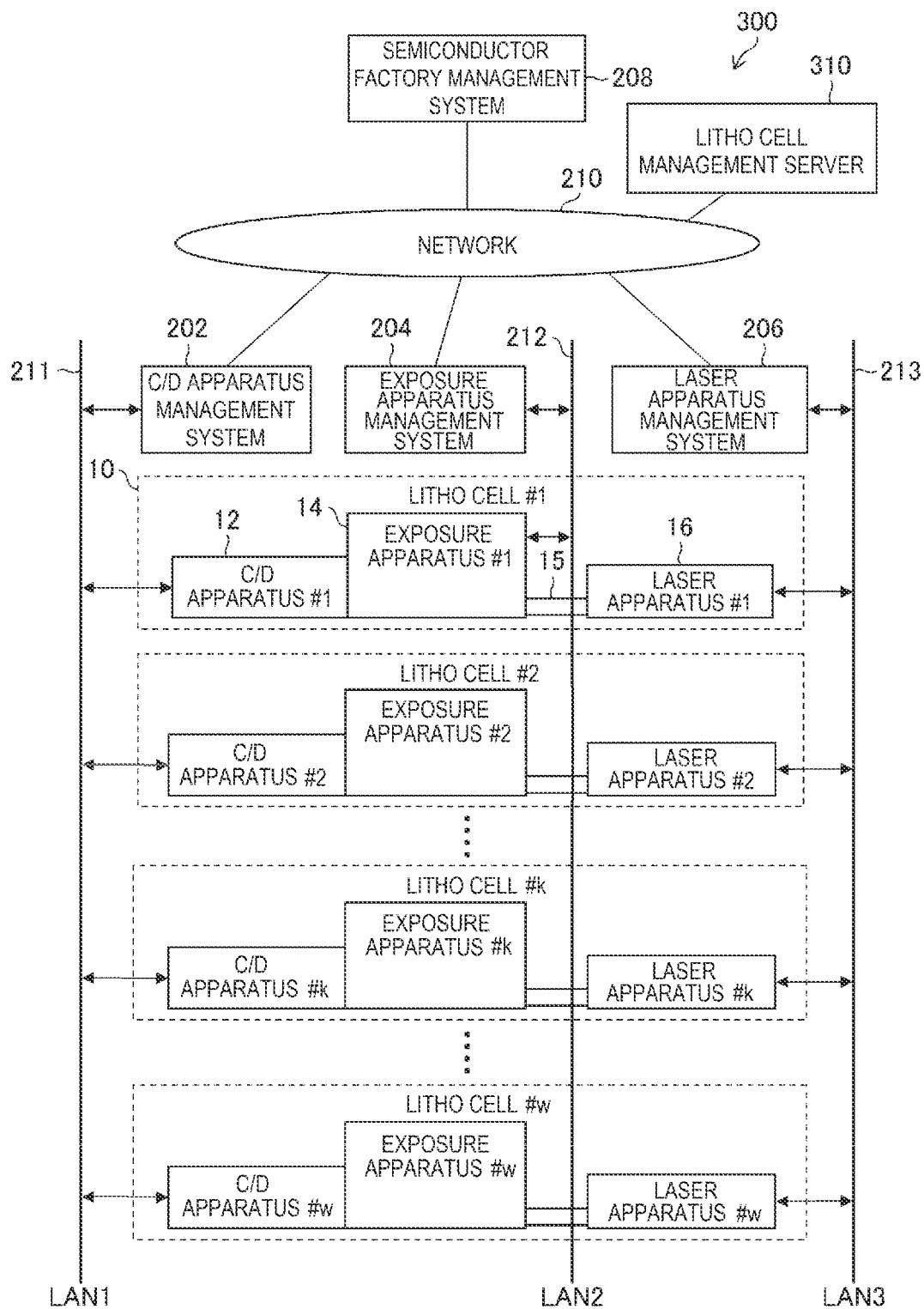
FIG. 6 shows the configuration of a lithography system according to a first embodiment.

FIG. 6 shows the configuration of a lithography system according to a first embodiment. A difference between FIGS. 5 and 6 will be described. A lithography system 300 in a semiconductor factory shown in FIG. 6 has the configuration of the lithography system 200 shown in FIG. 5 to which a litho cell management server 310 is added. The litho cell management server 310 is connected to the network 210.

The litho cell management server 310 is connected to the C/D apparatus management system 202, the exposure apparatus management system 204, the laser apparatus management system 206, and the semiconductor factory management system 208 via the network 210.

The litho cell management server 310 is configured to be capable of transmitting and receiving data and signals to and from each of the C/D apparatus management system 202, the exposure apparatus management system 204, the laser apparatus management system 206, and the semiconductor factory management system 208.

Figure 7:
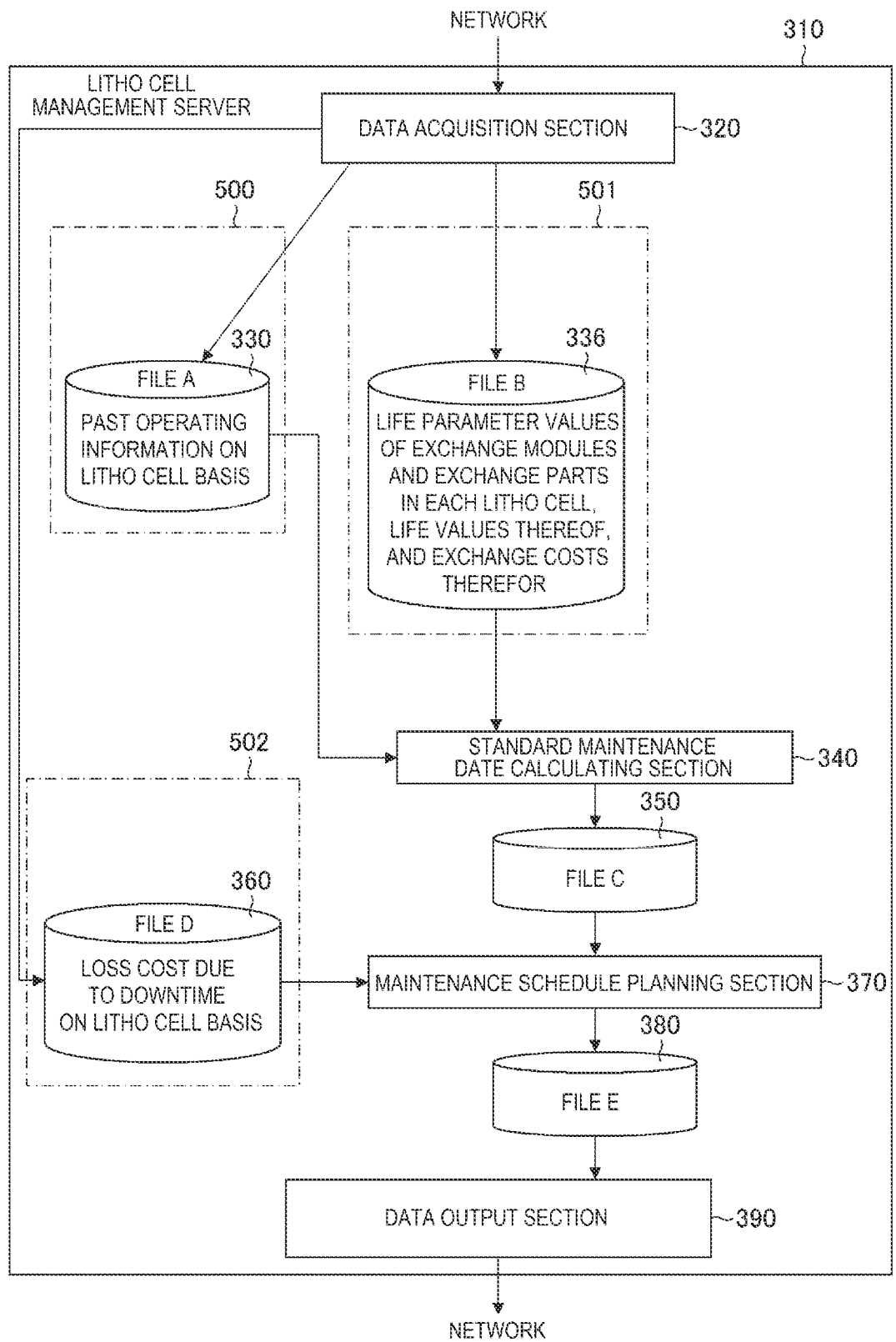
FIG. 7 is a block diagram showing the functions of a litho cell management server.

FIG. 7 is a block diagram showing the functions of the litho cell management server 310. The litho cell management server 310 is configured to calculate an optimum maintenance date for any of exchange modules and exchange parts in each litho cell based on operating information 500 on a litho cell basis, maintenance information 501 on the exchange modules and the exchange parts, and loss cost information 502 on cost lost due to a downtime in each litho cell and optimize a maintenance schedule. The litho cell management server 310 has the functions of creating and storing files A to E shown below and reading and writing information from and to the files A to E.

The file A is a file configured to save the past operating information on a litho cell basis. The file B is a file configured to save the maintenance information on the exchange modules and the exchange parts. The file C is a file configured to save a standard maintenance date and maintenance period. The file D is a file configured to save the loss cost information due to a downtime in each litho cell. The file E is a file configured to save an optimum maintenance schedule for the exchange modules and the exchange parts in each litho cell.

The operating information 500 is configured to contain the file A. The maintenance information 501 is configured to contain the file B. The file B may save, for example, life parameter values of the exchange modules and the exchange parts in each litho cell, life values of the exchange modules and the exchange parts, and exchange costs for the exchange modules and the exchange parts. The loss cost information 502 is configured to contain the file D.

The litho cell management server 310 includes a data acquisition section 320, a storage 330 configured to store the file A, a storage 336 configured to store the file B, a standard maintenance date calculating section 340, and a storage 350 configured to store the file C. The litho cell management server 310 further includes a storage 360 configured to store the file D, a maintenance schedule planning section 370, a storage 380 configured to store the file E, and a data output section 390. The storages 330, 336, 350, 360, and 380 are each formed of a storage device, such as a hard disk drive and/or a semiconductor memory. The storages 330, 336, 350, 360, and 380 may be formed of separate storage devices separate from one another or may be formed as part of the storage region of one or more storage devices.

In the present disclosure, the C/D apparatus management system 202, the exposure apparatus management system 204, the laser apparatus management system 206, the semiconductor factory management system 208, and the litho cell management server 310 can each be achieved by the combination of hardware formed of one or more computers and software installed thereon. Further, part or entirety of the processing functions of the management systems and the litho cell management server 310 may be achieved by using an integrated circuit represented by an FPGA and an ASIC.

6.2 Operation 6.2.1 Operation of Litho Cell Management Server

The operation of the litho cell management server 310 shown in FIG. 7 will be described. The data acquisition section 320 is configured to acquire three types of information groups shown below over the network 210 and organize the data on a litho cell basis.

[Information group 1] The data acquisition section 320 is configured to acquire information on the operating situation of each of the C/D apparatuses #1 to #w and the maintenance information on the exchange modules and the exchange parts therein via the C/D apparatus management system 202.

[Information group 2] The data acquisition section 320 is configured to acquire information on the operating situation of each of the exposure apparatuses #1 to #w and the maintenance information on the exchanges module and the exchange parts therein via the exposure apparatus management system 204.

[Information group 3] The data acquisition section 320 is configured to acquire information on the operating situation of each of the laser apparatuses #1 to #w and the maintenance information on the exchange modules and the exchange parts therein via the laser apparatus management system 206.

The data acquisition section 320 is configured to write information onto the files A and B based on the acquired information groups 1 to 3. The file A is configured to regularly save log data on the operating situations with the past operating information on the operation of each of the litho cells #1 to #w rearranged based on the information on the operating situations from the information groups 1, 2, and 3.

The file B is configured to regularly save data on the maintenance information with the maintenance information on the exchange modules and the exchange parts in each of the litho cells #1 to #w rearranged based on the information on the maintenance information from the information groups 1, 2, and 3.

The data acquisition section 320 is further configured to acquire information on the loss cost due to a downtime in each litho cell from the semiconductor factory management system 208 over the network 210 and write information onto the file D based on the acquired information.

The file D is configured to save data acquired from the semiconductor factory management system 208 and representing the loss cost due to a downtime in each of the litho cells #1 to #w.

The standard maintenance date calculating section 340 is configured to calculate a standard maintenance date for any of the exchange modules and the exchange parts in each litho cell based on the data in the files A and B and save the calculated value and the maintenance period in the file C.

The maintenance schedule planning section 370 is configured to optimize the maintenance schedule based on the data in the files A, B, C, and D. The optimization is intended, for example, to identify a maintenance date optimized from an evaluation viewpoint of maintenance cost minimization. The maintenance date optimized by the maintenance schedule planning section 370 is presented as a recommended maintenance date.

The maintenance schedule planning section 370 is configured to output data containing the recommended maintenance date for any of the exchange modules and the exchange parts in each litho cell determined by the optimization process and the maintenance period to the file E. The file E is configured to save the optimized recommended maintenance date for any of the exchange modules and the exchange parts in each litho cell and the maintenance period. The maintenance schedule planning section 370 may be configured to output the data in the file E to the data output section 390.

The data output section 390 is configured to output the data in the file E to the C/D apparatus management system 202, the exposure apparatus management system 204, the laser apparatus management system 206, the semiconductor factory management system 208, and the display terminals thereof that are not shown over the network 210. The litho cell management server 310 may include a display apparatus configured to display the information saved in the file E. The data output section 390 is configured to output the result of creation of the maintenance schedule plan optimized by the maintenance schedule planning section 370.

6.2.2 Example of Table Data Contained in File A

FIG. 8 is a table showing an example of table data contained in the file A. The file A is a file configured to save the operating information on the operation of the litho cell #k (k=1, 2, ..., w). The file A is configured to regularly save log data on the operating situations with the maintenance information on the maintenance of the litho cells #1 to #k to #w rearranged based on the maintenance information from the apparatuses in the litho cells.

The table data in the file A contains a date and time D when data on the litho cell #k are acquired, the number of processed wafers Wn counted from the start of data acquisition, and the number of processed wafers per day Wnday, the number of exposure pulses Nex and the number of exposure pulses per day Nexday in the exposure apparatus (k) counted from the start of the data acquisition, the number of oscillation pulses Np and the number of oscillation pulses per day Npday in the laser apparatus (k) counted from the start of the data acquisition, and pulse energy Ep of the pulsed laser light outputted from the laser apparatus.

The operating situation parameters per day are calculated by using the expressions below.

$$Wnday(k,i-1)=\{Wn(k,i)-Wn(k,i-1)\}/\{D(k,i)-D(k,i-1)\} \quad (1)$$

$$Nexday(k,i-1)=\{Nex(k,i)-Nex(k,1)\}/\{D(k,i)-D(k,i-1)\} \quad (2)$$

$$Npday(k,i-1)=\{Np(k,i)-Np(k,i-1)\}/\{D(k,i)-D(k,i-1)\} \quad (3)$$

It is assumed that data is acquired regularly, for example, everyday (every 24 hours). The data acquisition cycle is preferably longer than or equal to 1/24 days but shorter than or equal to 1 day.

The parameter values Wnday(k), Nexday(k), and Npday (k) used to calculate the operating situation per day are each averaged over the range from i=m-h to i=m-1, and the averages are written into the file A.

The variable i is an integer representing the data number and greater than or equal to 1. The variable h is a positive integer and is a numeral ranging from m-1 to 1.

When h=m-1 is satisfied, the parameter values are each the average calculated over the range from i=1 to i=m-1.

When h=1 is satisfied, the parameter values are each the value for i=m-1.

The value of h is determined as required, and the averages are determined accordingly.

When the future operating rate at which the litho cell #k operates roughly coincides with the recent operating rate, data acquired in upcoming days may be averaged. For example, the parameter values for h being greater than or equal to 2 but smaller than or equal to 7 may be averaged.

Figure 9:
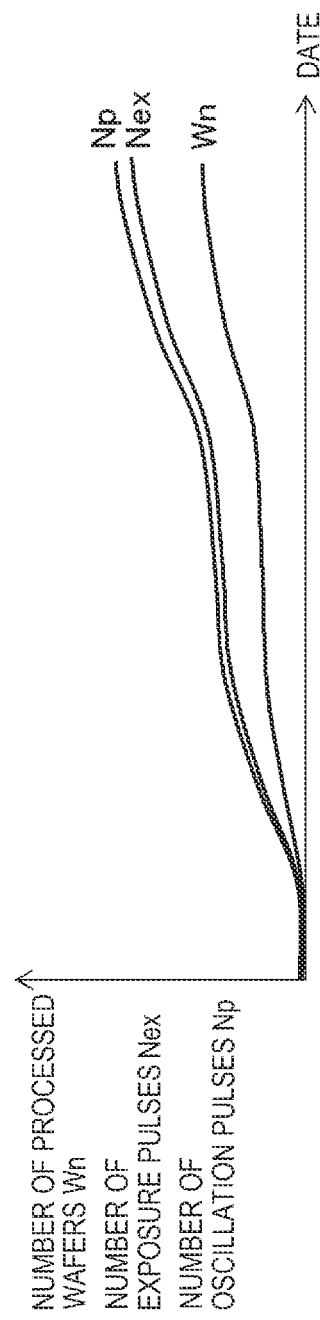
FIG. 9 shows graphs illustrating time-course changes in the number of processed wafers Wn, the number of exposure pulses Nex, and the number of oscillation pulses Np.
Figure 10:
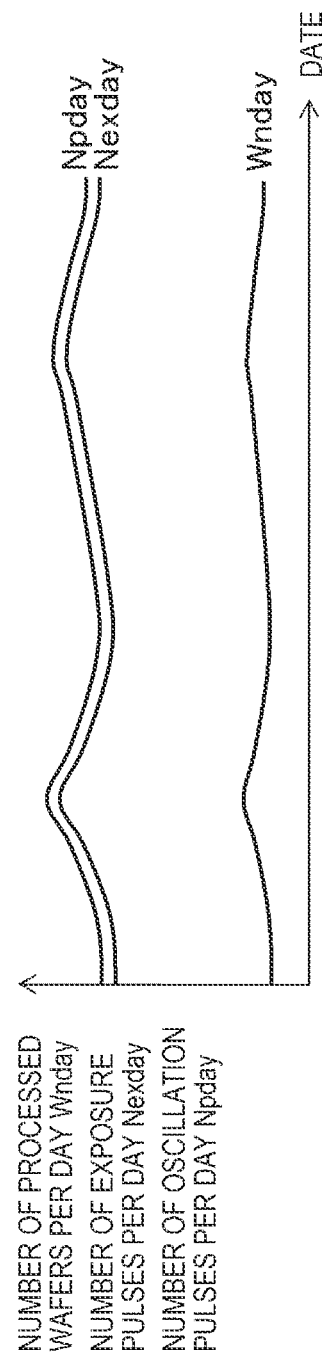
FIG. 10 shows graphs illustrating time-course changes in the number of processed wafers per day Wnday, the number of exposure pulses per day Nexday, and the number of oscillation pulses per day Npday.
Figure 11:
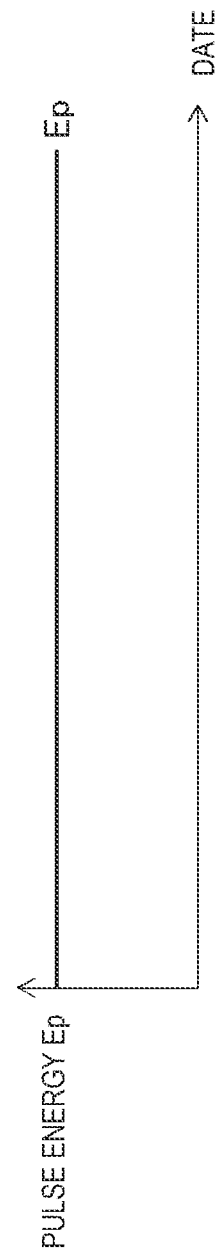
FIG. 11 shows a graph illustrating a time-course change in pulse energy Ep of pulsed laser light outputted from the laser apparatus.

FIGS. 9, 10, and 11 show examples of graphs representing the data saved in the file A of FIG. 8. FIG. 9 shows graphs as a result of plotting the number of processed wafers Wn, the number of exposure pulses Nex, and the number of oscillation pulses Np along the vertical axis versus the data acquisition date along the horizontal axis.

The graphs representing the number of processed wafers Wn, the number of exposure pulses Nex, and the number of oscillation pulses Np show almost the same tendency. The number of exposure pulses Nex is, however, slightly smaller than the number of oscillation pulses Np in the laser apparatus. The reason for this is that the laser apparatus 16 performs adjustment oscillation with no pulsed laser light entering the exposure apparatus 14 until the pulse energy and the wavelength each fall within an acceptable range of a target value.

FIG. 10 shows time-course changes in the number of processed wafers per day Wnday, the number of exposure pulses per day Nexday, and the number of oscillation pulses per day Npday.

The operating parameters are each used to calculate the maintenance date for any of the exchange modules and the exchange parts in each litho cell. The graphs shown in FIG. 10 can be taken as graphs representing time-course changes in the operating rate at which the litho cell #k operates.

FIG. 11 shows a graph illustrating a time-course change in the pulse energy Ep of the pulsed laser light outputted from the laser apparatus 16. The pulse energy Ep is basically a fixed value when any of the exposure conditions, such as the resist and the reticle 74, is not changed.

When the resist to be used is changed so that the resist sensitivity changes, or even when the same resist is used but the mask pattern of the reticle 74 is changed, necessary pulse energy is changed in some cases. In this example, data on the pulse energy Ep of the pulsed laser light outputted from the laser apparatus 16 is acquired.

A change in the pulse energy Ep of the pulsed laser light changes in some cases the number of pulses that cause any of the exchange modules and the exchange parts in the laser apparatus 16 and the exposure apparatus 14 to reach the life.

<Others>

In the examples shown in FIGS. 8 to 10, it is assumed that the number of processed wafers Wcdn in the C/D apparatus #k in the litho cell #k and the number of processed wafers Wexn in the exposure apparatus #k in the litho cell #k are roughly equal to each other and are set to be the number of processed wafers Wn in the litho cell #k. That is, it is assumed that the relationship "Wn≈Wcdn≈Wexn" is satisfied.

The example shown in FIG. 11 shows a case where the pulse energy of the pulsed laser light outputted from the laser apparatus 16 does not change, but not necessarily. When the resist to be used is changed so that the resist sensitivity changes, or even when the same resist is used but the mask pattern of the reticle 74 is changed, necessary pulse energy is changed in some cases. In this example, data on the pulse energy of the pulsed laser light outputted from the laser apparatus 16 is acquired.

A change in the pulse energy of the pulsed laser light changes in some cases the number of pulses that cause any of the exchange modules and the exchange parts in the laser apparatus 16 and the exposure apparatus 14 to reach the life. Although will be described later, the case can be handled by saving the life-determining number of pulses with respect to the pulse energy in the file B in advance.

6.2.3 Example of Table Data (1) Contained in File B

FIG. 12 is a table showing an example of table data (1) contained in the file B and shows an example of data on the maintenance information on the maintenance of the exchange modules and the exchange parts in each of the apparatuses in each litho cell.

For the exchange modules and the exchange parts in each of the apparatuses in each litho cell, the following values are saved as the table data: the life parameter; a life value Life(k,l,m); a standard maintenance period Tmhs(k,l,m); an exchange cost Cexc(k,l,m); a life parameter value Pra(k,l,m); a date and time Dme(k,l,m) when the life parameter is measured; and a remaining life parameter value Prarl (k,l,m). Reference character k represents the litho cell number, reference character l represents the apparatus number, and m represents the exchange module or exchange part number.

The life parameter is categorized into the following four.

[Category 1] Parameter depending on the operation period for which exchange module or exchange part has operated The category-1 parameter corresponds, for example, to the operation period for which the air has passed through the chemical filter since it was exchanged.

[Category 2] Parameter depending on the number of wafers processed by exchange module or exchange part The category-2 parameter corresponds, for example, to the number of wafers having been processed since the substrate rotating module in the C/D apparatus was exchanged.

[Category 3] Parameter depending on the number of exposure pulses experienced by exchange module or exchange part The category-3 parameter corresponds, for example, to the number of exposure pulses having been counted since any of the exchange parts in the illumination optical system of the exposure apparatus was exchanged.

[Category 4] Parameter depending on the number of oscillation pulses experienced by exchange module or exchange part The category-4 parameter corresponds, for example, to the number of oscillation pulses having been counted since the laser chamber in the laser apparatus was exchanged.

An exchange cost Cplife(k,l,m) per unit life in FIG. 12 is calculated by using the expression below.

$$C\text{plife}(k,l,m) = C\text{exc}(k,l,m)/\text{Life}(k,l,m) \quad (4)$$

It is assumed that the maintenance period includes not only the maintenance period for each apparatus alone but a period for which the litho cell produces no wafer when the exchange module or the exchange part is exchanged. That is, the maintenance period represents a downtime expected when the maintenance is performed.

The remaining life parameter value Prarl(k,l,m) is calculated by using the expression below.

$$\text{Prarl}(k,l,m) = \text{Life}(k,l,m) - \text{Pra}(k,l,m) \quad (5)$$

<Others>

In the example shown in FIG. 12, the life of each of the drain recovery module and the substrate rotating module in the C/D apparatus is calculated on the assumption that the life roughly depends on the number of processed wafers for simplification.

The life parameter is not limited to the category-1 to category-4 parameters. For example, the life parameter may be the amount of resist used per certain unit. Any quantity may be used as long as the life parameter and the amount of change per day can be monitored.

6.2.4 Example of Table Data (2) Contained in File B

FIG. 13 is a table showing an example of table data (2) contained in the file B. FIG. 13 shows a table data on the maintenance period required when a plurality of exchange modules or exchange parts are maintained on the same day. When a plurality of types of maintenance are performed in the same apparatus on the same day, the maintenance period shortens in some cases.

For example, the maintenance period shortens when at least two exchange modules out of the line-narrowing module (LNM), the laser chamber (CH), the monitoring module (MM), and the front mirror (FM) in the same laser apparatus 16 are exchanged simultaneously (on the same day). When such same-day exchange is performed, the maintenance period shortens because the step of checking the laser performance before and after the module exchange only needs to be carried out once.

The same applies to the maintenance of the C/D apparatus 12, the exposure apparatus 14, and other apparatuses as well as the maintenance of the laser apparatus 16. Further, in addition to the maintenance of a single apparatus, when a plurality of exchange modules and exchange parts in the C/D apparatus 12 and the exposure apparatus 14 are exchanged, so that the maintenance period for the litho cell 10 as a whole shortens, table data on the combination of the plurality of exchange modules and exchange parts is stored.

Data on the combination described above are stored as the table data in the file B, and the values in the table data are used to calculate the maintenance period required to perform the same-day exchange based on the combination described above.

6.2.5 Example of Table Data (3) Contained in File B

FIG. 14 is a table showing an example of table data (3) contained in the file B. FIG. 14 shows an example of the table data on the life values in a case where the pulse energy of the pulsed laser light outputted from the laser apparatus 16 varies.

In general, when the energy of the pulsed laser light increases, the life of a part relating to a module in the laser apparatus 16 or an optical system in the exposure apparatus 14 shortens in some cases.

A maintenance schedule plan can be laid down by monitoring the pulse energy Ep of the pulsed laser light and using the life values in the table data shown in FIG. 14.

<Others>

In general, the life of an optical element varies depending on whether one-photon absorption or two-photon absorption is employed.

In one-photon absorption, the life of an optical element is expressed, for example, by the expression below.

$$\text{Life parameter} = (Ep(k)/10) \cdot \text{the number of oscillation pulses} \quad (6)$$

In two-photon absorption, the life of an optical element is expressed, for example, by the expression below.

$$\text{Life parameter} = (Ep(k)/10)^2 \cdot \text{the number of oscillation pulses} \quad (7)$$

A life parameter value Pra(k,3,m) for the laser apparatus 16 may be calculated by using Expression (6) or (7) described above.

Life parameter values Pra(k,2,2) and Pra(k,2,3) for the exposure apparatus 14 may also be calculated by using Expression (6) or (7) described above with the number of oscillation pulses replaced with the number of exposure pulses.

Figure 15:
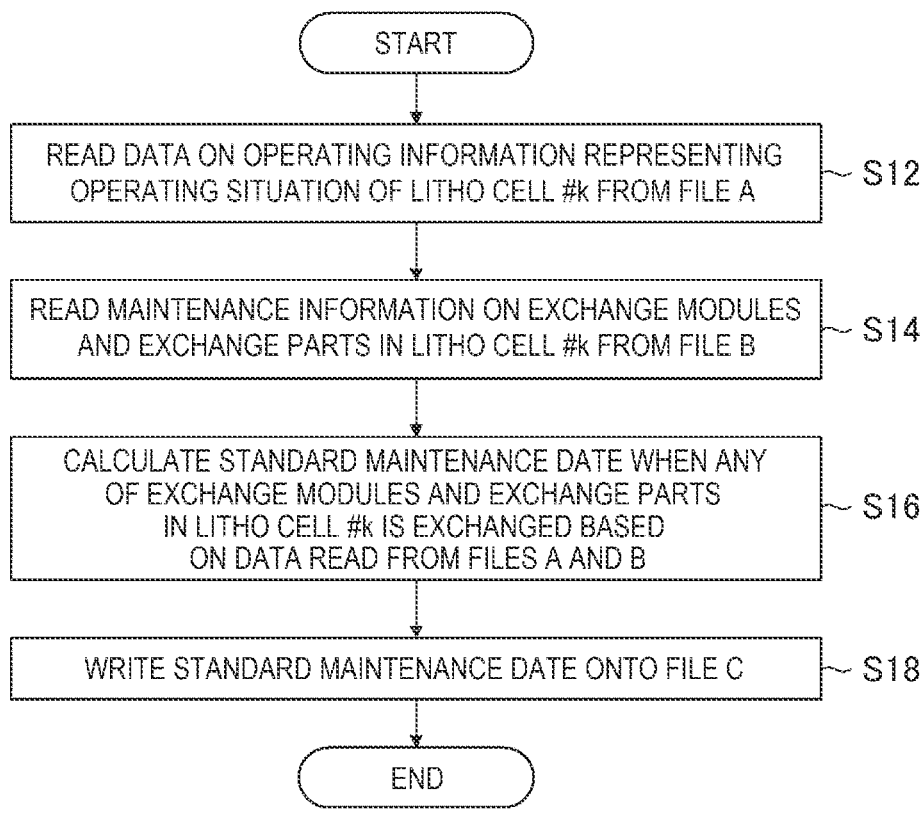
FIG. 15 is a flowchart showing an example of the contents of the processes carried out by a standard maintenance date calculating section.

6.2.6 Example of Processes Carried Out by Standard Maintenance Date Calculating Section FIG. 15 is a flowchart showing an example of the contents of the processes carried out by the standard maintenance date calculating section 340.

In step S12, the standard maintenance date calculating section 340 reads data on the operating information representing the operating situation of the litho cell #k from the file A. For example, the standard maintenance date calculating section 340 reads Wnday(k), Nexday(k), and Npday (k), which are the parameter values representing the operating situations per day shown in FIG. 8, from the file A.

In step S14, the standard maintenance date calculating section 340 reads the maintenance information on the exchange modules and the exchange parts in the litho cell #k from the file B. For example, the standard maintenance date calculating section 340 reads the maintenance information, such as that shown in FIG. 12, from the file B. The standard maintenance date calculating section 340 further reads the remaining life parameter value Prarl(k,l,m) and the date and time Dme(k,l,m) when the life parameter is acquired.

In step S16, the standard maintenance date calculating section 340 calculates a standard maintenance date Dmds (k,l,m) when any of the exchange modules and the exchange parts in the litho cell #k is exchanged based on the data read from the files A and B.

The standard maintenance date Dmds(k,l,m) is calculated in accordance with any of the expressions [a] to [d] below.

[a] When the life parameter is a period, $$Dmds(k,l,m)=Dme(k,l,m)+Prarl(k,l,m) \qquad (8)$$

[b] When the life parameter is the number of processed wafers, $$Dmds(k,l,m)=Dme(k,l,m)+Prarl(k,l,m)/Wnday(k) \qquad (9)$$

[c] When the life parameter is the number of exposure pulses, $$Dmds(k,l,m)=Dme(k,l,m)+Prarl(k,l,m)/Nexday(k) \qquad (10)$$

[d] When the life parameter is the number of oscillation pulses, $$Dmds(k,l,m)=Dme(k,l,m)+Prarl(k,l,m)/Npday(k) \qquad (11)$$

In step S18, the standard maintenance date calculating section 340 writes data containing the standard maintenance date Dmds(k,l,m) calculated in step S16 onto the file C. The standard maintenance date calculating section 340 writes the standard maintenance date Dmds(k,l,m) and the standard maintenance period Tmhs(k,l,m), the latter of which is provided in the case of standalone exchange, onto the file C.

6.2.7 Specific Examples of Files C and D

FIG. 16 is a table showing an example of table data contained in the file C. The file C is configured to save the life parameter on an exchange module basis or exchange part basis, the standard maintenance period, the standard maintenance date, and the exchange cost per unit life.

FIG. 17 is a table showing an example of the table data contained in the file D. The file D is configured to save the loss cost per unit period due to a downtime on a litho cell basis. The loss cost due to a downtime is hereinafter referred to as a "downtime cost."

Figure 18:
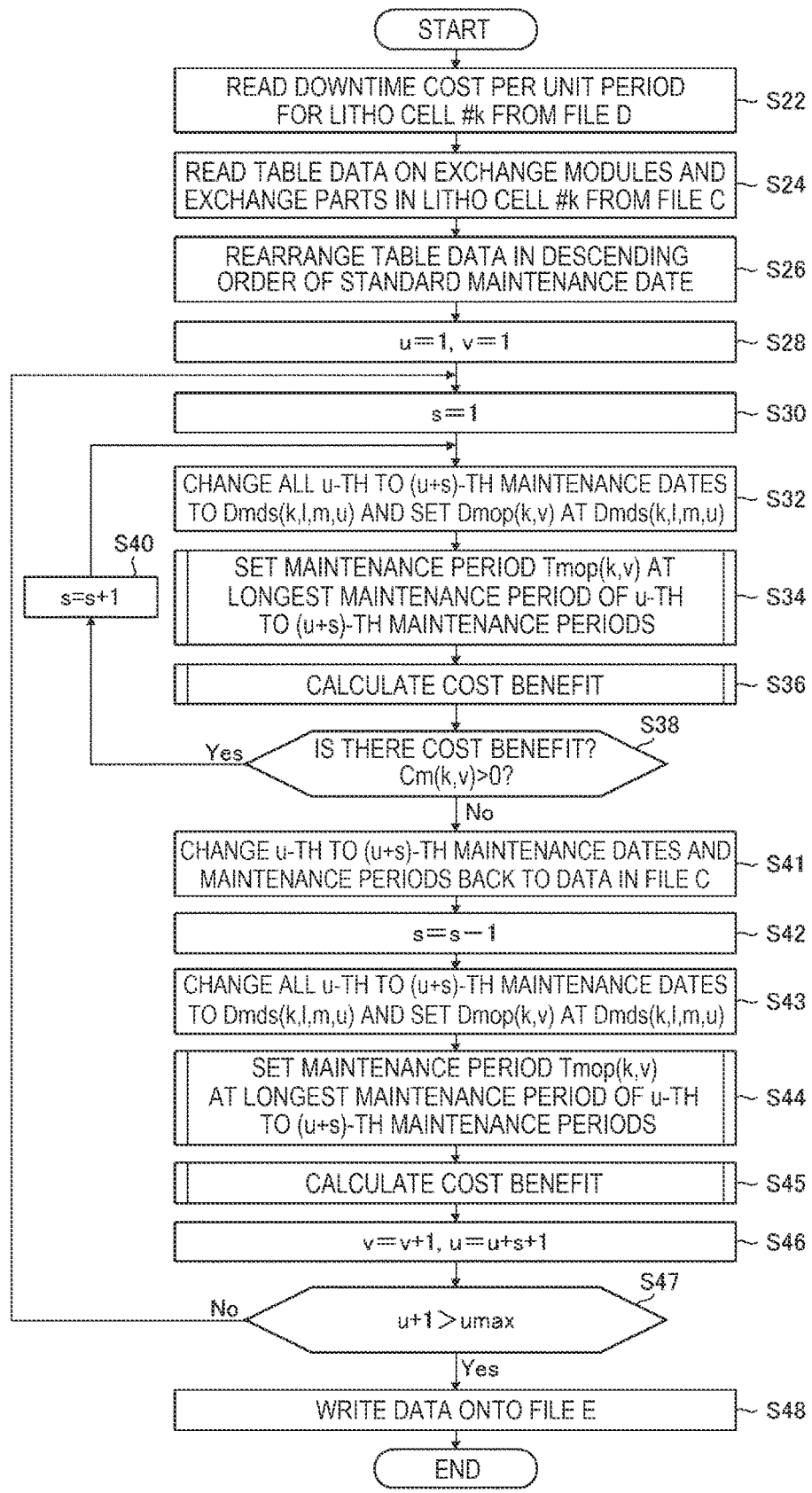
FIG. 18 is a flowchart showing an example of the contents of the processes carried out by a maintenance schedule planning section.

6.2.8 Example of Processes Carried Out by Maintenance Schedule Planning Section FIG. 18 is a flowchart showing an example of the contents of the processes carried out by the maintenance schedule planning section 370.

In step S22, the maintenance schedule planning section 370 reads the downtime cost per unit period for the litho cell #k from the file D.

In step S24, the maintenance schedule planning section 370 reads the table data on the exchange modules and the exchange parts in the litho cell #k from the file C.

In step S26, the maintenance schedule planning section 370 rearranges the table data in descending order of the standard maintenance date. The rearranged table data is referred to as "sorted table data."

In step S28, the maintenance schedule planning section 370 initializes variables u and v to "one", which is an initial value.

In step S30, the maintenance schedule planning section 370 initializes a variable s to "one", which is an initial value.

In step S32, the maintenance schedule planning section 370 changes all the maintenance dates when the u-th to (u+s)-th exchange modules or exchange parts in the sorted table data are exchanged to a maintenance date Dmds(k,l, m,u) when the u-th exchange module or exchange part is exchanged and sets Dmop(k,v) at the value of the maintenance date Dmds(k,l,m,u).

In step S34, the maintenance schedule planning section 370 sets a maintenance period Tmop(k,v) at the longest maintenance period of the u-th to (u+s)-th maintenance periods.

In step S36, the maintenance schedule planning section 370 calculates a cost benefit.

Figure 19:
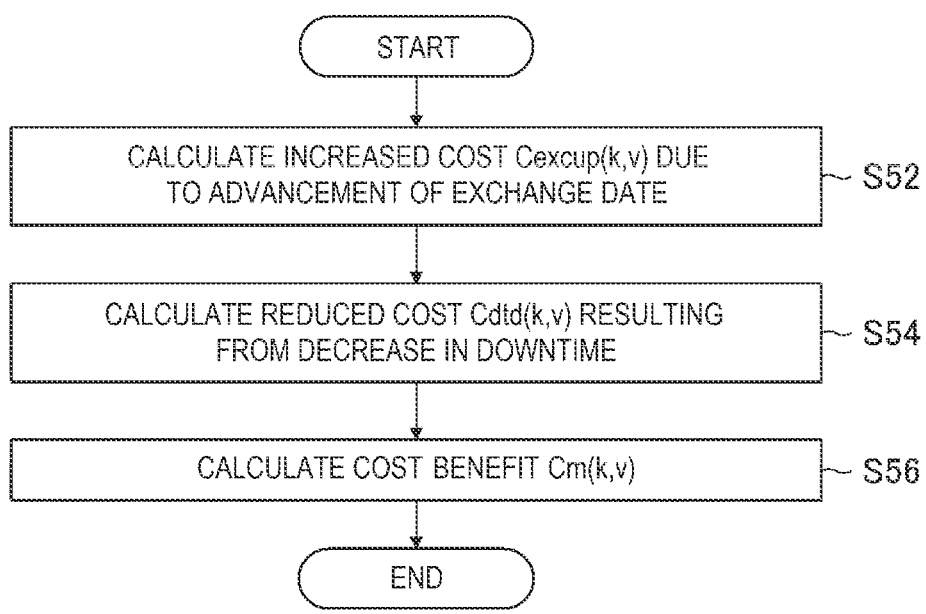
FIG. 19 is a flowchart showing an example of the process of calculating a cost benefit.

FIG. 19 is a flowchart showing an example of the process of calculating the cost benefit. The flowchart shown in FIG. 19 is applied to step S36 in FIG. 18.

In step S52 in FIG. 19, the maintenance schedule planning section 370 calculates an increased cost Cexcup(k,v) due to advancement of the exchange date.

The increased cost Cexcup(k,v) is calculated by the expression below.

$$Cexcup(k,v)=\Sigma\{Cplife(k,l,m,q)\cdot Parad(Dmds\sim Dmop)\} \qquad (12)$$

Σ in the expression represents the sum from q=u to q=u+s.

Cplife(k,l,m,q) is an exchange cost per unit life required to exchange the q-th exchange module or exchange part in the sorted table data.

Parad(Dmds~Dmop) is defined as the value of the life parameter of the q-th exchange module or exchange part that decreases due to the advancement of the maintenance date from the standard maintenance date Dmds to the newly set Dmop.

The value in this case is the product of the life parameter value that decreases per day and the number of advanced days.

Parad(Dmds~Dmop) is calculated in accordance with any of expressions [e] to [h] below.

[e] When the life parameter is a period, $$Parad(Dmds\sim Dmop)=\{Dmds(k,l,m,u)-Dmop(k,v)\} \qquad (13)$$

[f] When the life parameter is the number of processed wafers, $$Parad(Dmds\sim Dmop)=\{Dmds(k,l,m,u)-Dmop(k,v)\}\cdot Wnday(k) \qquad (14)$$

[g] When the life parameter is the number of exposure pulses, $$Parad(Dmds\sim Dmop)=\{Dmds(k,l,m,u)-Dmop(k,v)\}\cdot Nexday(k) \qquad (15)$$

[h] When the life parameter is the number of oscillation pulses, $$Parad(Dmds\sim Dmop)=\{Dmds(k,l,m,u)-Dmop(k,v)\}\cdot Npday(k) \quad (16)$$

In step S54, the maintenance schedule planning section 370 calculates a reduced cost Cdtd(k,v) resulting from a decrease in the downtime.

The reduced cost Cdtd(k,v) is calculated by the expression below.

$$Cdtd(k,v)=\{\Sigma Tmhs(k,l,m,q)-Tmop(k,v)\}\cdot Cdt(k) \quad (17)$$

Cdt(k) represents the downtime cost per unit period on a litho cell basis (see FIG. 17).

In step S56, the maintenance schedule planning section 370 calculates a cost benefit Cm(k,v) based on the increased cost Cexcup(k,v) determined in step S52 and the reduced cost Cdtd(k,v) determined in step SM.

The cost benefit Cm(k,v) is calculated by the expression below.

$$Cm(k,v)=Cdtd(k,v)-Cexcup(k,v) \quad (18)$$

Upon determination of the cost benefit Cm(k,v) in step S56, the flowchart shown in FIG. 19 is terminated, and the main procedure in FIG. 18 is resumed.

In step S38 in FIG. 18, the maintenance schedule planning section 370 evaluates whether or not there is a cost benefit.

When Cm(k,v) determined in step S36 satisfies Cm(k,v)>0, the maintenance schedule planning section 370 proceeds to step S40, increments the value of the variable s, and returns to step S32.

When Cm(k,v)≤0 is satisfied in the evaluation process in step S38, the maintenance schedule planning section 370 proceeds to step S41.

In step S41, the maintenance schedule planning section 370 changes the u-th to (u+s)-th maintenance dates and maintenance periods back to the data in the file C.

In step S42, the maintenance schedule planning section 370 decrements the value of the variable s and proceeds to step S43.

In step S43, the maintenance schedule planning section 370 changes all the maintenance dates when the u-th to (u+s)-th exchange modules or exchange parts are exchanged to the maintenance date Dmds(k,l,m,u) when the u-th exchange module or exchange part is exchanged and sets Dmop(k,v) at the value of the maintenance date Dmds(k,l,m,u). The process in step S43 is the same as the process in step S32.

In step S44, the maintenance schedule planning section 370 sets the maintenance period Tmop(k,v) at the longest maintenance period of the u-th to (u+s)-th maintenance periods. The process in step S44 is the same as the process in step S34.

In step S45, the maintenance schedule planning section 370 calculates the cost benefit. The process in step S45 is the same as the process in step S36.

Thereafter, in step S46, the maintenance schedule planning section 370 increments the value of the variable v, adds s+1 to the variable u, and newly sets the value of the variable u at u+s+1. After the values v and u are updated in step S46, the maintenance schedule planning section 370 evaluates in step S47 whether or not u+1>umax is satisfied. The constant umax is the total number of exchange modules and exchange parts.

When the result of the evaluation in step S47 is No, the maintenance schedule planning section 370 returns to step S30. The maintenance schedule planning section 370 repeats steps S30 to S47 until the value u reaches umax.

When the result of the evaluation process in step S47 is Yes, the maintenance schedule planning section 370 proceeds to step S48 and writes the data onto the file E. After step S48, the flowchart shown in FIG. 18 is terminated.

6.2.9 Specific Example of File E

FIG. 20 is a table showing an example of table data contained in the file E. The table data in the file E contains the following data: the standard maintenance date for each consumable in each litho cell; the standard maintenance period required to exchange each consumable alone; the exchange cost per unit life; the optimum maintenance date optimized on a litho cell basis; the increased cost due to advancement of the exchange date; the maintenance period; the downtime-reduction reduced cost; and the cost benefit.

Figure 21:
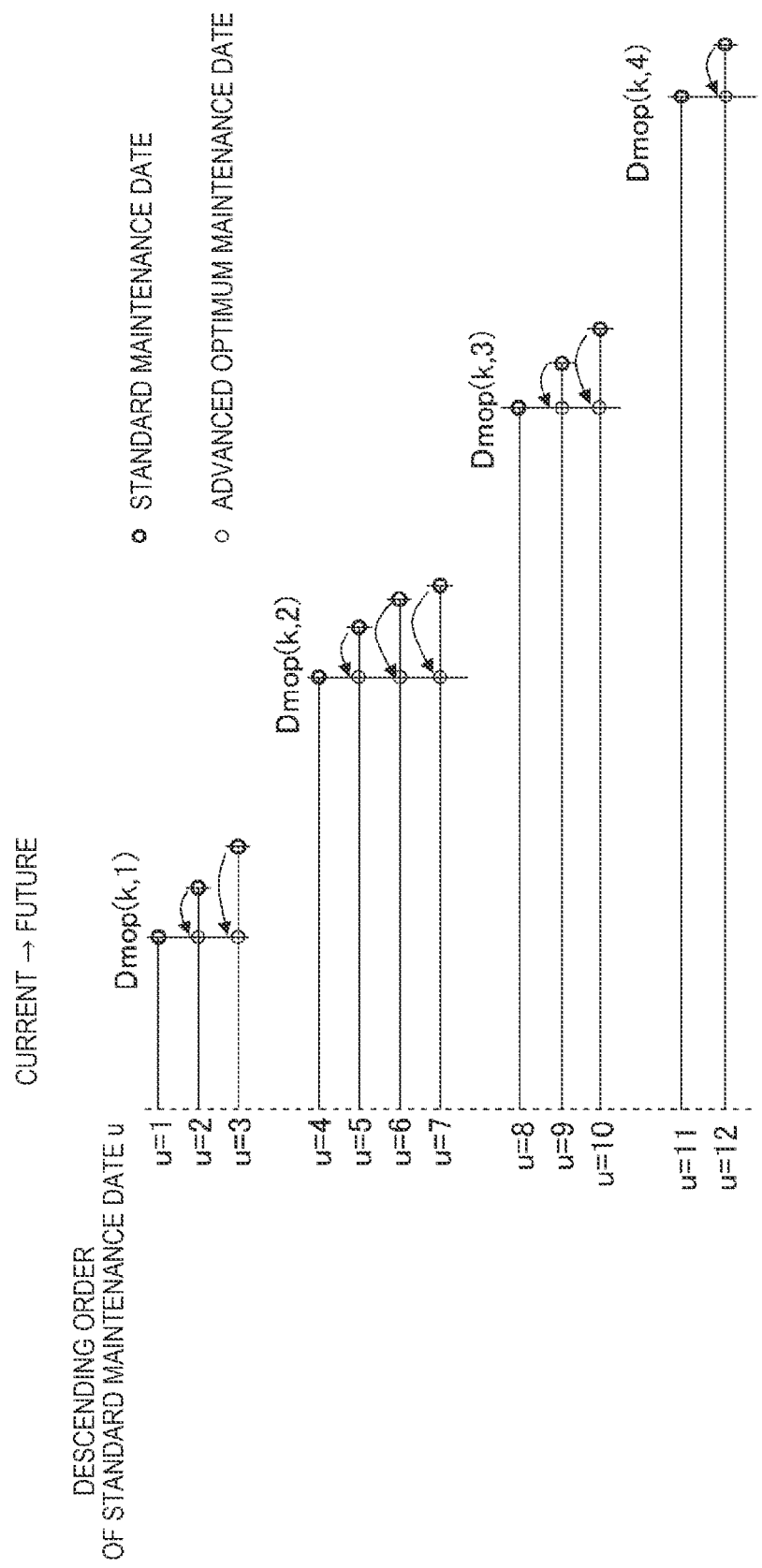
FIG. 21 is a descriptive diagram diagrammatically showing the relationship between a standard maintenance date and an advanced optimum maintenance date.

FIG. 21 is a descriptive diagram diagrammatically showing the relationship between the standard maintenance date and the advanced optimum maintenance date. FIG. 21 reflects the contents of the table data shown in FIG. 20.

In FIG. 21, for example, it is recommended that the maintenance dates for the u=2 and u=3 consumables are advanced from the standard maintenance dates therefor and the maintenance of each of the u=1 to 3 consumables is performed on the same date as the standard maintenance date for the u=1 consumable.

Similarly, it is recommended that the maintenance dates for the u=5 to 7 consumables are advanced from the standard maintenance dates therefor and the maintenance of each of the u=4 to 7 consumables is performed on the same date as the standard maintenance date for the u=4 consumable.

Further, it is similarly recommended that the maintenance dates for the u=9 and u=10 consumables are advanced from the standard maintenance dates therefor and the maintenance of each of the u=9 and u=10 consumables is performed on the same date as the standard maintenance date for the u=8 consumable.

Moreover, it is similarly recommended that the maintenance date for the u=12 consumable is advanced from the standard maintenance date therefor and the maintenance of the u=12 consumable is performed on the same date as the standard maintenance date for the u=11 consumable.

6.3 Effects and Advantages

According to the first embodiment, the maintenance schedule of the consumables in each litho cell is optimized based on the operating information on the operating situation on a litho cell basis, the maintenance information on the consumables in each litho cell, and the loss cost due to the maintenance downtime on a litho cell basis. According to the first embodiment, the maintenance cost and the downtime can be reduced as compared with a case where maintenance is performed on an apparatus basis irrespective of the litho cell unit.

6.4 Others

The litho cell management server 310 is an example of the "maintenance management apparatus" in the present disclosure. The combination of the data acquisition section 320 and the storage 330 in the first embodiment is an example of the "operating information processing section" in the present disclosure. The combination of the data acquisition section 320 and the storage 336 is an example of the "maintenance information processing section" in the present disclosure. The standard maintenance date calculating section 340 is an example of the "standard maintenance timing calculating section" in the present disclosure. The processes carried out by the litho cell management server 310 are an example of the "maintenance management method" in the present disclosure. The data on the operating information saved in the file A is an example of the "operating data" in the present disclosure.

7. Second Embodiment

7.1 Configuration

Figure 22:
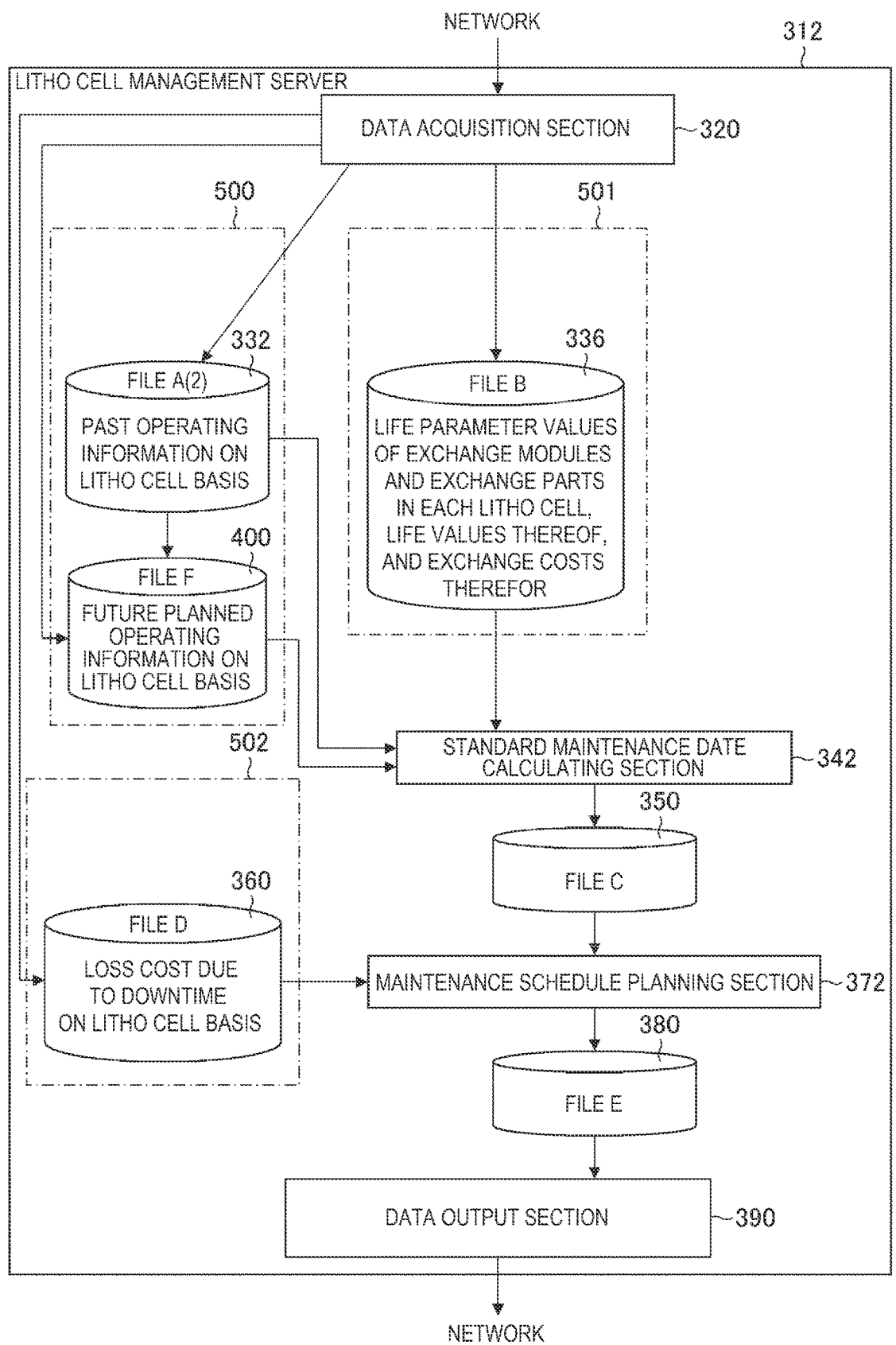
FIG. 22 is a block diagram showing the functions of a litho cell management server according to a second embodiment.

FIG. 22 is a block diagram showing the functions of a litho cell management server according to a second embodiment. In place of the litho cell management server 310 described with reference to FIG. 7, a litho cell management server 312 shown in FIG. 22 can be used. Differences from the litho cell management server 310 described with reference to FIG. 7 will be described.

In the second embodiment, future planned operating information on a litho cell basis is added as the operating information 500 on a litho cell basis. The operating information 500 handled by the litho cell management server 312 shown in FIG. 22 contains a file A(2) and a file F. The litho cell management server 312 has the functions of creating and storing the file A(2) containing table data different from the table data shown in FIG. 7 by way of example and reading and writing information from and to the file A(2). A file that is created in the second embodiment and saves the past operating information on a litho cell basis is referred to as the file A(2). An example of the table data contained in the file A(2) will be described later with reference to FIG. 23.

The litho cell management server 312 includes a storage 332 configured to store the file A(2).

The litho cell management server 312 has an added function of creating and storing the file F and reading and writing information from and to the file F. The file F is a file configured to save the future planned operating information on a litho cell basis. The litho cell management server 312 includes a storage 400 configured to store the file F.

The litho cell management server 312 further includes a standard maintenance date calculating section 342 and a maintenance schedule planning section 372 as shown in FIG. 22 in place of the standard maintenance date calculating section 340 and the maintenance schedule planning section 370 in FIG. 7.

7.2 Operation

7.2.1 Operation of Litho Cell Management Server

The data acquisition section 320 in the litho cell management server 312 shown in FIG. 22 is configured to acquire data on the date and the number of wafers to be processed on that date from the semiconductor factory management system 208 and save the data in the file F. The number of wafers to be processed on each date is called the "planned number of wafers to be processed on each day." The data acquisition section 320 is configured to calculate the planned number of wafers to be processed on the current day and afterward, the planned number of exposure pulses on each day, the planned number of exposure pulses on the current day and afterward, the planned number of oscillation pulses on each day, and the planned number of oscillation pulses on the current day and afterward based on the data on the date and the planned number of wafers to be processed on each day and save the results of the calculation in the file F.

The values described above are calculated based on the number of exposure pulses per wafer Nexwef(k) and the number of oscillation pulses per wafer Npwef(k) saved in the file A(2). An example of table data containing the number of exposure pulses per wafer Nexwef(k) and the number of oscillation pulses per wafer Npwef(k) will be described later (see FIG. 23).

The standard maintenance date calculating section 342 is configured to calculate the standard maintenance date based on the data in the files A(2), B, and F.

The maintenance schedule planning section 372 is configured to optimize the maintenance schedule based on the data in the files C and D.

7.2.2 Example of Table Data Contained in File A(2)

FIG. 23 is a table showing an example of the table data contained in the file A(2). The file A(2) used in the second embodiment contains information "the number of exposure pulses per wafer" and "the number of oscillation pulses per wafer" in place of "the number of exposure pulses per day" and "the number of oscillation pulses per day" in the table data according to the first example described with reference to FIG. 8.

The data acquisition section 320 is configured to calculate the number of exposure pulses per wafer Nexwef and the number of oscillation pulses per wafer Npwef in accordance with the calculation expressions below and save the table data containing the determined values.

$$Nexwef(k,i-1) = \{Nex(k,i) - Nex(k,i-1)\}/Wnday(k,i-1) \quad (19)$$

$$Npwef(k,i-1) = \{Np(k,i) - Np(k,i-1)\}/Wnday(k,i-1) \quad (20)$$

Nexwef(k) is the average of Nexwef(k,1), Nexwef(k,2), ..., Nexwef(k,i-1), ..., Nexwef(k,j-1).

Npwef(k) is the average of Npwef(k,1), Npwef(k,2), ..., Npwef(k,i-1), ..., Npwef(k,j-1).

<Others>

The data acquisition section 320 may be configured to plot the data along the vertical axis representing Nex versus the horizontal axis representing Wn, convert the plotted data into an approximate straight line by using the least squares method, and set the gradient of the straight line as Nex(k).

The data acquisition section 320 may be configured to plot the data along the vertical axis representing Np versus the horizontal axis representing Wn, convert the plotted data into an approximate straight line by using the least squares method, and set the gradient of the straight line as Np(k).

7.2.3 Example of Table Data Contained in File F

FIG. 24 is a table showing an example of table data contained in the file F. FIG. 24 shows an example of data on the planned operating information on the planned operation of the litho cell #k.

The data acquisition section 320 is configured to acquire a date DATEpl and the planned number of wafers to be processed on the current day Wplpd from the semiconductor factory management system 208 and save the acquired data in the file F.

The data acquisition section 320 is configured to calculate the planned number of wafers to be processed on the current day and afterward Wplpdsu, the planned number of exposure pulses on each day Nexplpd, the planned number of exposure pulses on the current day and afterward Nexplsu, the planned number of oscillation pulses on each day Npplpd, and the planned number of oscillation pulses on the current day and afterward Npplsu based on the acquired data and save the results of the calculation in the file F.

The data acquisition section 320 is configured to calculate the values described above in accordance with the expressions below based on the number of exposure pulses per wafer Nexwef(k) and the number of oscillation pulses per wafer Npwef(k) saved in the file A(2) described with reference to FIG. 23.

$$Wplpdsu(k,f)=Wplpd(k,1)+Wplpd(k,2)+ Wplpd(k,3)+ \ldots +Wplpd(k,f) \quad (21)$$

$$Nexplpd(k,f)=Wplpd(k,f) \cdot Nexwef(k) \quad (22)$$

$$Nexplsu(k,f)=Nexplpd(k,1)+Nexplpd(k,2)+ Nexplpd(k,3)+ \ldots +Nexplpd(k,f) \quad (23)$$

$$Npplpd(k,f)=Wplpd(k,f) \cdot Npwef(k) \quad (24)$$

$$Npplsu(k,f)=Npplpd(k,1)+Npplpd(k,2)+ Npplpd(k,3)+ \ldots +Npplpd(k,f) \quad (25)$$

The data on the planned operating information saved in the file F is an example of the "planned operating data" in the present disclosure.

Figure 25:
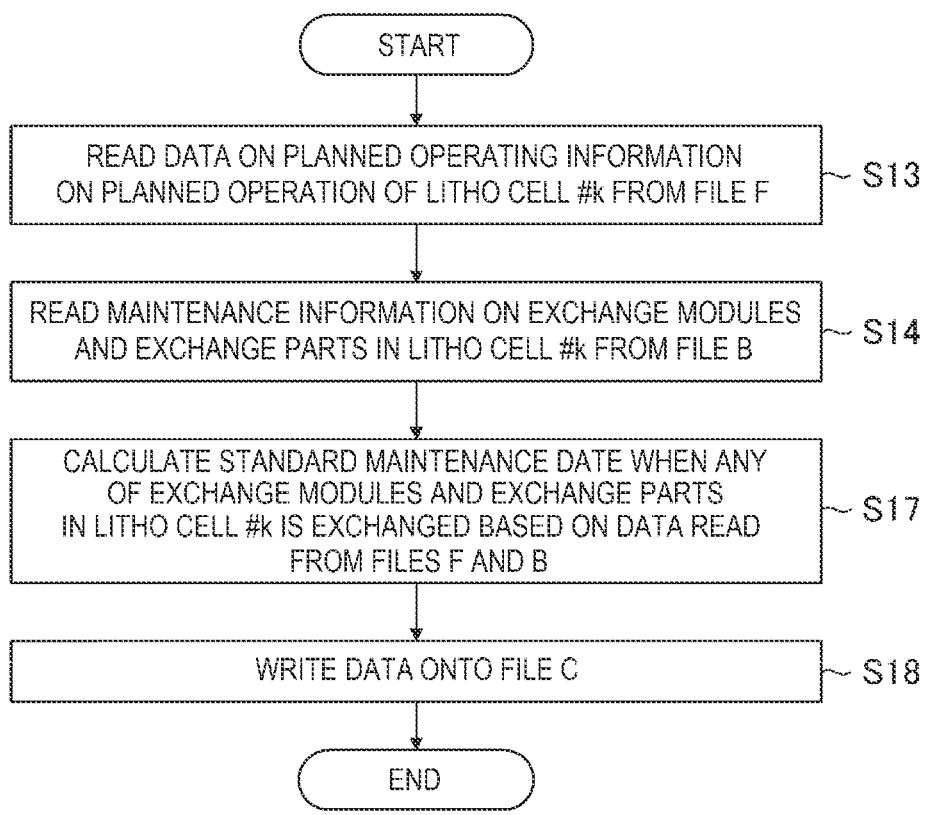
FIG. 25 is a flowchart showing an example of the contents of the processes carried out by a standard maintenance date calculating section shown in FIG. 22.

7.2.4 Example of Processes Carried Out by Standard Maintenance Date Calculating Section FIG. 25 is a flowchart showing an example of the contents of the processes carried out by the standard maintenance date calculating section 342. In FIG. 25, steps common to those in FIG. 15 have the same step numbers and will not be redundantly described.

In place of the flowchart in FIG. 15 or combined with the flowchart in FIG. 15, the flowchart shown in FIG. 25 can be applied. In step S13, the standard maintenance date calculating section 342 reads data on the planned operating information on the planned operation of the litho cell #k from the file F. For example, the standard maintenance date calculating section 342 reads the planned operating information on a litho cell basis, such as that shown in FIG. 24, from the file F.

The process in step S14 is the same as that in step S14 in FIG. 15. In step S14, the standard maintenance date calculating section 342 reads the maintenance information on the exchange modules and the exchange parts in the litho cell #k from the file B. For example, the standard maintenance date calculating section 342 reads the maintenance information, such as that shown in FIG. 12, from the file B. The standard maintenance date calculating section 342 further reads the remaining life parameter value Prarl(k,l,m) and the date and time Dme(k,l,m) when the life parameter is acquired.

In step S17, the standard maintenance date calculating section 342 calculates a standard maintenance date when any of the exchange modules and the exchange parts in the litho cell #k is exchanged based on the data read from the files F and B.

The standard maintenance date Dmds(k,l,m) is set at a date when the number of wafers to be processed on the current day and afterward Wplpdsu(k,f), the number of exposure pulses on the current day and afterward Nexplsu (k,f), or the number of oscillation pulses on the current day and afterward Npplsu(k,f) is smaller than or equal to the remaining life parameter value Prarl(k,l,m) but is maximized.

In step S18, the standard maintenance date calculating section 342 writes the standard maintenance date Dmds(k, l,m) and the standard maintenance period Tmds(k,l,m), the latter of which is provided in the case of standalone exchange, onto the file C.

7.2.5 Example of Processes Carried Out by Maintenance Schedule Planning Section

Figure 26:
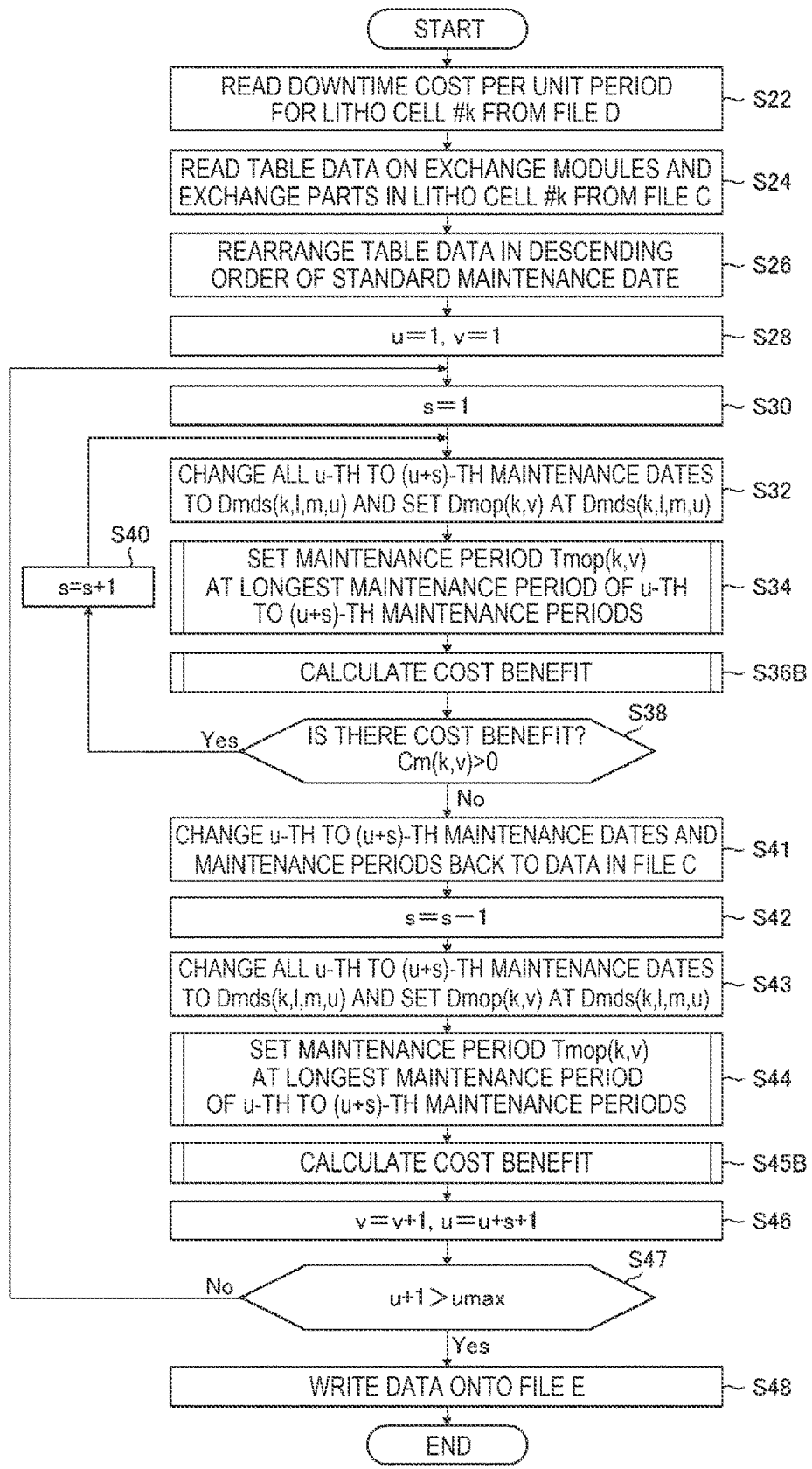
FIG. 26 is a flowchart showing an example of the contents of the processes carried out by a maintenance schedule planning section shown in FIG. 22.

FIG. 26 is a flowchart showing an example of the contents of the processes carried out by the maintenance schedule planning section 372. In FIG. 26, steps common to those in FIG. 18 have the same step numbers and will not be redundantly described. The flowchart shown in FIG. 26 includes steps S36B and S45B in place of steps S36 and S45 in FIG. 18.

In step S36B, the maintenance schedule planning section 372 calculates the cost benefit by using the data obtained from the file F.

Figure 27:
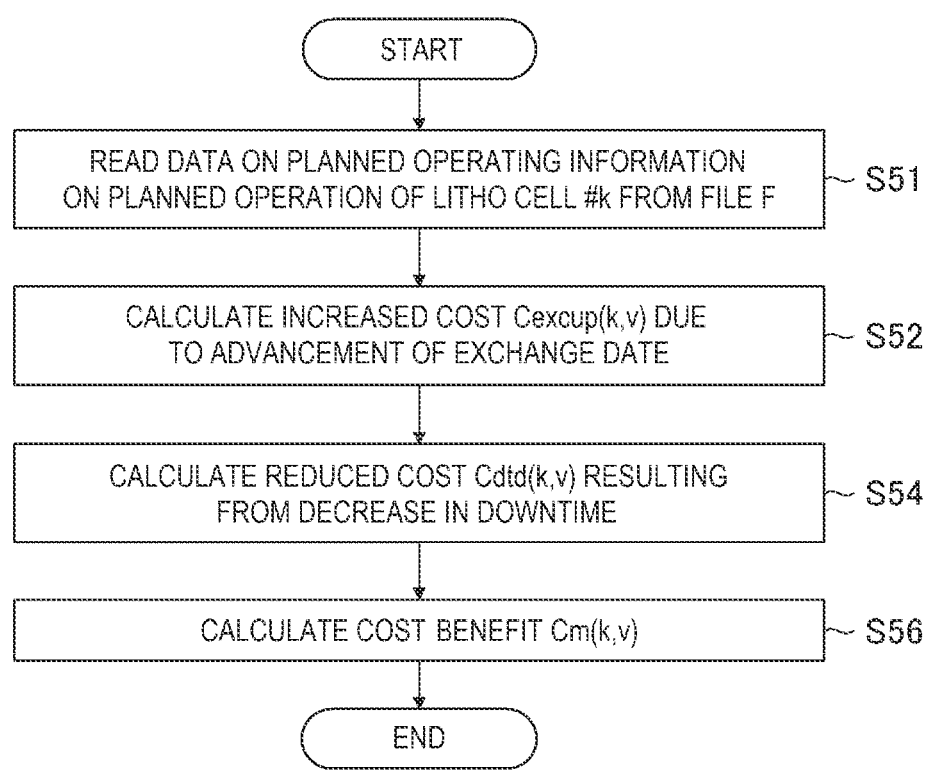
FIG. 27 is a flowchart showing an example of the process of calculating the cost benefit.

FIG. 27 is a flowchart showing an example of the process of calculating the cost benefit. The flowchart in FIG. 27 is applied to steps S36B and S45B in FIG. 26. In FIG. 27, steps common to those in FIG. 19 have the same step numbers and will not be redundantly described.

The flowchart shown in FIG. 27 includes step S51 before step S52. In step S51, the maintenance schedule planning section 372 reads data on the planned operating information on the planned operation of the litho cell #k from the file F.

In step S52, the maintenance schedule planning section 372 can calculate the value of Parad (Dmds~Dmop) from the data in the file F. The maintenance schedule planning section 372 calculates the increased cost Cexcup(k,v) by using the Parad (Dmds~Dmop) calculated from the data in the file F.

The contents of the other processes are the same as that in the flowchart in FIG. 19.

7.3 Effects and Advantages

According to the second embodiment, the standard maintenance date is calculated based on the past operating information on a litho cell basis and the future planned operating information on a litho cell basis, whereby the standard maintenance date is estimated with further improved accuracy as compared with the first embodiment.

According to the second embodiment, an optimum maintenance schedule is calculated based on the standard maintenance date calculated with the improved estimation accuracy and the future planned operating information, whereby the maintenance schedule is optimized with further improved accuracy.

8. Third Embodiment 8.1 Configuration

Figure 28:
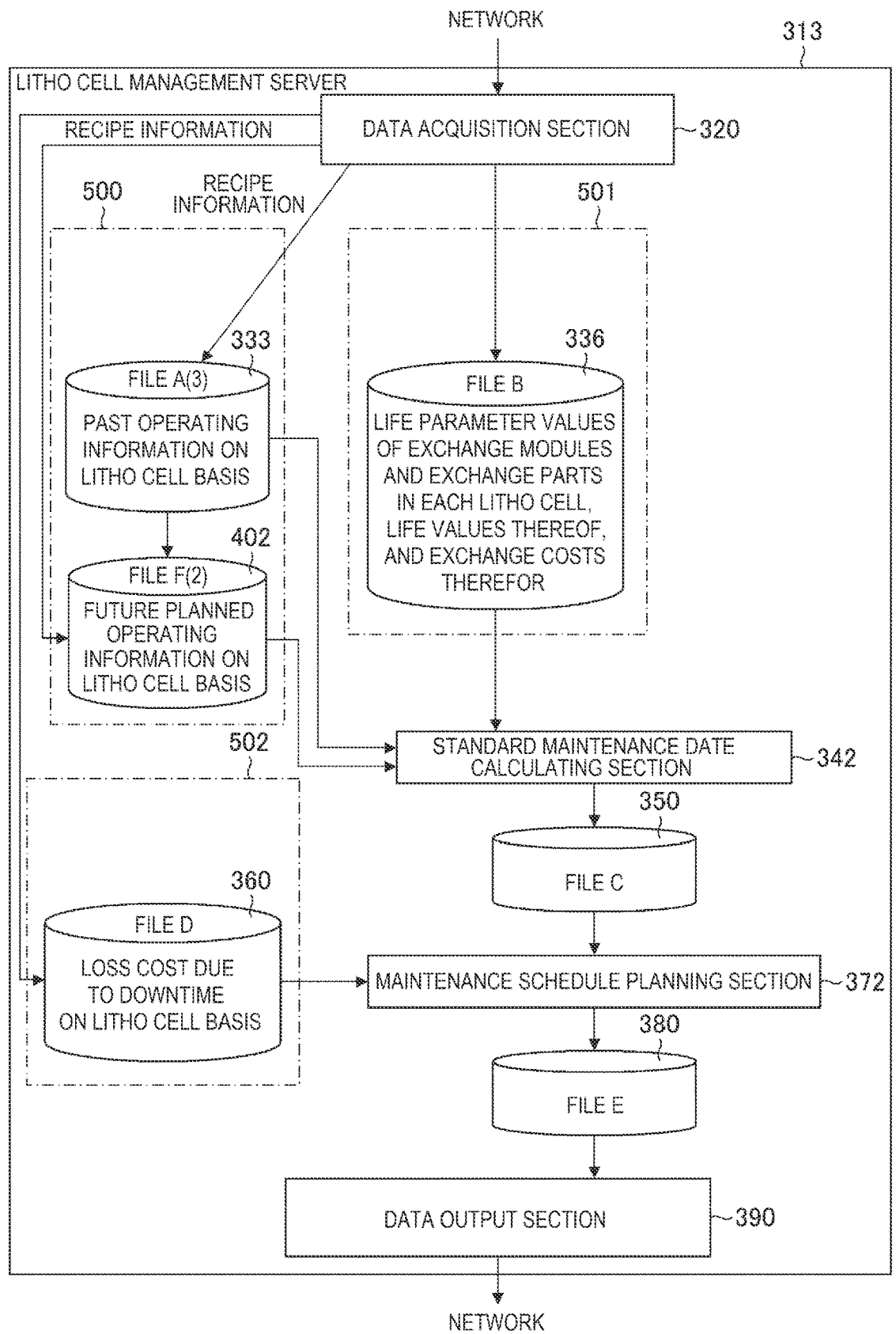
FIG. 28 is a block diagram showing the functions of a litho cell management server according to a third embodiment.

FIG. 28 is a block diagram showing the functions of a litho cell management server 313 according to a third embodiment. Differences from the litho cell management server 312 according to the second embodiment described with reference to FIG. 22 will be described.

In the third embodiment, recipe information is added to the operating information 500 on a litho cell basis. The operating information 500 handled by the litho cell management server 313 shown in FIG. 28 contains a file A(3) and a file F(2). The litho cell management server 313 has the functions of creating and storing the file A(3) containing table data different from the table data shown in FIG. 8 by way of example and reading and writing information from and to the file A(3). A file that is created in the third embodiment and saves the past operating information on a litho cell basis is referred to as the file A(3). The file A(3) contains the recipe information. An example of the table data contained in the file A(3) will be described later with reference to FIG. 29. The litho cell management server 313 includes a storage 333 configured to store the file A(3).

The litho cell management server 313 further has the functions of creating and storing the file F(2) containing table data different from the table data shown in FIG. 24 by way of example and reading and writing information from and to the file F(2). A file that is created in the third embodiment and saves the future operating information on a litho cell basis is referred to as the file F(2). The file F(2)

contains the recipe information. An example of the table data contained in the file F(2) will be described later with reference to FIG. 30. The litho cell management server 313 includes a storage 402 configured to store the file F(2).

The litho cell management server 313 further includes the standard maintenance date calculating section 342 and the maintenance schedule planning section 372 as shown in FIG. 28 in place of the standard maintenance date calculating section 340 and the maintenance schedule planning section 370 in FIG. 7.

8.2 Operation 8.2.1 Operation of Litho Cell Management Server

The data acquisition section 320 in the litho cell management server 313 shown in FIG. 28 is configured to acquire the recipe information from the semiconductor factory management system 208 and save the recipe information in the file A(3). The data acquisition section 320 is configured to save the recipe information, the average number of processed wafers corresponding to each recipe, the average number of exposure pulses corresponding to each recipe, and the average number of oscillation pulses corresponding to each recipe in the file A(3).

The data acquisition section 320 is configured to acquire the date, the planned number of wafers to be processed on that date, and the recipe information from the semiconductor factory management system 208 and save the acquired information in the file F(2).

The data acquisition section 320 is configured to calculate the planned number of wafers to be processed on the current day and afterward, the planned number of exposure pulses on each day, the planned number of exposure pulses on the current day and afterward, the planned number of oscillation pulses on each day, and the planned number of oscillation pulses on the current day and afterward based on the average number of processed wafers corresponding to each recipe, the average number of exposure pulses corresponding to each recipe, and the average number of oscillation pulses corresponding to each recipe and save the results of the calculation in the file F(2).

The standard maintenance date calculating section 342 is configured to calculate the standard maintenance date based on the data in the file F(2).

The maintenance schedule planning section 372 is configured to optimize the maintenance schedule based on the data in the file F(2).

8.2.2 Example of Table Data Contained in File A(3)

FIG. 29 is a table showing an example of table data contained in the file A(3). The file A(3) used in the third embodiment contains the data below in addition to the contents of the table data shown in FIG. 23 by way of example.

That is, the table data in the file A(3) contains the following added information: recipe information Lcip; the average number of processed wafers per day corresponding to each recipe Wndaylc; the average number of exposure pulses per wafer corresponding to each recipe Nexweflc; and the average number of oscillation pulses per wafer corresponding to each recipe Npweflc.

In the present specification, the "recipe" is defined as an exposure condition corresponding to each resist material and each mask pattern. Since a change in the resist material changes the resist sensitivity, the number of exposure pulses per wafer and the number of oscillation pulses in the laser apparatus change. A change in the mask pattern changes the optimum amount of exposure per wafer and the optimum number of oscillation pulses per wafer change. For example, the optimum amount of exposure and the optimum number of oscillation pulses differ between a line-and-space mask pattern and a contact-hole mask pattern.

FIG. 29 shows a case where there are three types of recipe, a recipe a, a recipe b, and a recipe c. The three types of recipe information in the litho cell #k are expressed by Lcip(k,a), Lcip(k,b), and Lcip(k,c).

The data acquisition section 320 of the litho cell management server 313 is configured to receive the recipe information Lcip, for example, from the semiconductor factory management system 208 and save the received data in the file A(3).

The data acquisition section 320 is configured to calculate the average number of processed wafers per day corresponding to each recipe Wndaylc, the average number of exposure pulses per wafer corresponding to each recipe Nexweflc, and the average number of oscillation pulses per wafer corresponding to each recipe Npweflc and save the results of the calculation in the file A(3).

8.2.3 Example of Table Data Contained in File F(2)

FIG. 30 is a table showing an example of table data contained in the file F(2). FIG. 30 shows an example of data on the planned operating information on the planned operation of the litho cell #k in the file F(2). The file F(2) used in the third embodiment contains the data below in addition to the contents of the table data shown in FIG. 24 by way of example.

That is, the file F(2) contains the recipe information Lcip and information on the number of pulses (Nexpld, Nexplsu, Npplpd, and Npplus) based on the recipe information.

The data acquisition section 320 of the litho cell management server 313 is configured to receive the recipe information Lcip relating to the future operating plan, for example, from the semiconductor factory management system 208 and save the received information in the file F(2).

The data acquisition section 320 is configured to calculate the planned number of exposure pulses on each day Nexplpd and the planned number of oscillation pulses on each day Npplpd based on the average numbers of exposure pulses per wafer corresponding to the recipes (Nexweflc(k,a), Nexweflc(k,b), and Nexweflc(k,c)) and the average numbers of oscillation pulses per wafer corresponding to the recipes (Npwefic(k,a), Npwefic(k,b), and Npwefic(k,c)) saved in the file A(3) in accordance with the calculation expressions below.

$$Nexplpd(k,1{\sim}4)=Wplpd(k,1{\sim}4){\cdot}Nexweflc(k,b) \quad (26)$$

$$Nexplpd(k,5{\sim}f)=Wplpd(k,5{\sim}f){\cdot}Nexweflc(k,a) \quad (27)$$

$$Nexplpd(k,f+1{\sim}g)=Wplpd(k,f+1{\sim}g){\cdot}Nexweflc(k,c) \quad (28)$$

<Others>

In the above description, the three types of recipe a, b, and c have been presented by way of example, but the number of recipes is not limited to three and only needs to be at least two.

In the above description, a recipe is unchanged for one day as the past operating information. When the recipe is changed even on the same day, the detailed date and time when the recipe is changed may be saved in the file A(3), and the calculation described above may be performed based on conversion per day.

Further, in the above description, a recipe is unchanged for one day as the planned operating information. When the recipe is changed even on the same day, the detailed date and time when the recipe is changed may be saved in the file F(2), and the calculation described above may be performed in more detail.

8.3 Effects and Advantages

According to the third embodiment, the standard maintenance date is calculated based on the past operating information on a litho cell basis, the future planned operating information on a litho cell basis, and the recipe information, whereby the standard maintenance date is estimated with further improved accuracy.

According to the third embodiment, an optimum maintenance schedule is calculated based on the standard maintenance date calculated based on the recipe information and the future planned operating information, whereby the maintenance schedule is optimized with further improved accuracy.

9. Fourth Embodiment

9.1 Configuration

Figure 31:
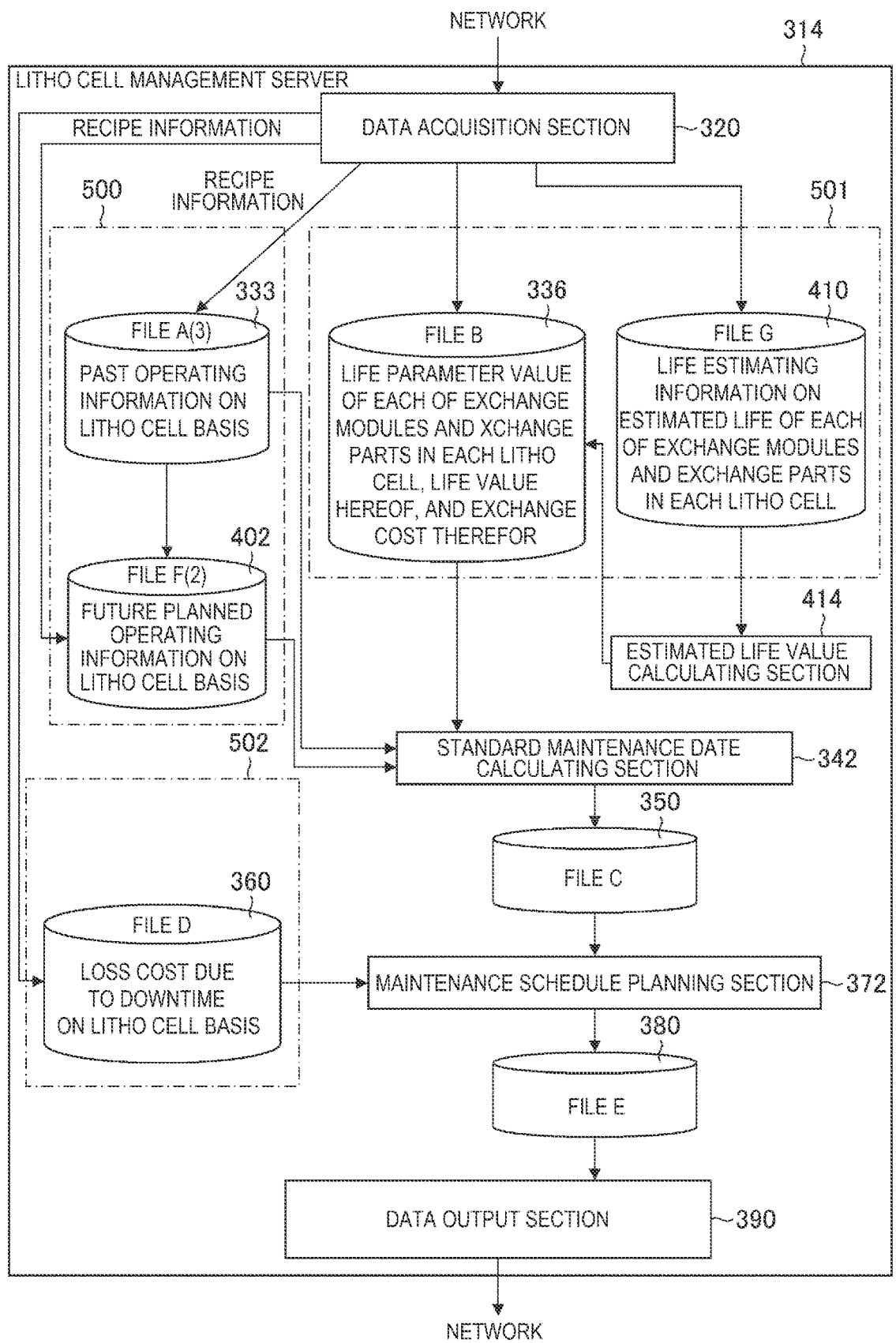
FIG. 31 is a block diagram showing the functions of a litho cell management server according to a fourth embodiment.

FIG. 31 is a block diagram showing the functions of a litho cell management server 314 according to a fourth embodiment. Differences from the litho cell management server 313 according to the third embodiment described with reference to FIG. 28 will be described.

In the fourth embodiment, as the maintenance information 501 on the exchange modules and the exchange parts, life estimating information on the estimated life of each of the exchange modules and the exchange parts in each litho cell basis is added. The litho cell management server 314 shown in FIG. 31 has an added function of creating and storing a file G and reading and writing information from and to the file G. The file G is a file configured to save the life estimating information on the estimated life of each of the exchange modules and the exchange parts in each litho cell. The litho cell management server 314 includes a storage 410 configured to store the file G and an estimated life value calculating section 414. The maintenance information 501 handled by the litho cell management server 314 contains the files B and G.

9.2 Operation

9.2.1 Operation of Litho Cell Management Server

The data acquisition section 320 of the litho cell management server 314 shown in FIG. 31 is configured to regularly acquire the life estimating information on the estimated life of each of the exchange modules and the exchange parts in each litho cell from the C/D apparatus management system 202, the exposure apparatus management system 204, and the laser apparatus management system 206.

The life estimating information is information used to estimate the life of each of the exchange modules and the exchange parts. The life estimating information may contain, for example, a life parameter value of each of the exchange modules and the exchange parts in each litho cell, log data on a monitoring parameter configured to monitor the life, and a threshold of the monitoring parameter.

The data acquisition section 320 is configured to save the life parameter value of each of the exchange modules and the exchange parts in each litho cell, the log data on the monitoring parameter configured to monitor the life, and the threshold of the monitoring parameter in the file G. The life monitoring parameter may be a parameter configured to correlate with the life of an exchange module or an exchange part. The combination of the data acquisition section 320 and the storage 410 in the fourth embodiment is an example of the "life estimating information acquisition section" in the present disclosure.

The estimated life value calculating section 414 is configured to calculate the life parameter value, which causes the life monitoring parameter to be expected to reach the threshold of the monitoring parameter, based on the trend of the life monitoring parameter grasped from the log data saved in the file G. An "estimated life parameter value" provided from the result of the calculation is called an estimated life value. The estimated life value calculating section 414 is configured to write data on the estimated life value determined by the calculation as a life value Life(k, l,m) onto the file B.

9.2.2 Example of Log Data Contained in File G

FIG. 32 is a table showing an example of the log data contained in the file G. As the life parameter for the chemical filter, which is an exchange part of the C/D apparatus, the operation period after the exchange is applied. A life parameter value Pra for the chemical filter is a value representing the operation period after the exchange. The life monitoring parameter for the chemical filter is the concentration of impurities in the air having passed through the chemical filter. A life monitoring parameter value Cw for the chemical filter is a measured value of the concentration of the impurities in the air having passed through the chemical filter. When the life monitoring parameter value Cw for the chemical filter reaches a threshold Cwth, it can be determined that the impurity removal performance of the chemical filter has lowered so that the life of the chemical filter has been reached.

The exchange parts of the illumination optical system of the exposure apparatus are primarily mirrors and other optical parts. As the life parameter for an exchange part of the illumination optical system, the number of exposure pulses after the exchange is applied. The life parameter value Pra for an exchange part of the illumination optical system is a value representing the number of exposure pulses after the exchange. The life monitoring parameter for an exchange part of the illumination optical system is the transmittance of the light passing through the illumination optical system. A life monitoring parameter value Til for an exchange part of the illumination optical system is a value representing the transmittance of the light passing through the illumination optical system. When the life monitoring parameter value reaches a threshold Tilth, it can be determined that the exchange part of the illumination optical system has been degraded so that the life of the part has been reached.

As the life parameter for the laser chamber, which is an exchange part of the laser apparatus, the number of oscillation pulses after the exchange is applied. The life parameter value Pra for the laser chamber is a value representing the number of oscillation pulses after the exchange. The life monitoring parameter for the laser chamber is the gas pressure in the laser chamber. A life monitoring parameter value Pch for the laser chamber is a measured value of the gas pressure in the laser chamber. When the life monitoring parameter value Pch for the laser chamber reaches a threshold Pchth, it can be determined that the laser chamber has been degraded and has reached the life.

<Others>

The example of the file G shown in FIG. 32 is an example of the life estimating information on the estimated life of each of the exchange modules and the exchange parts. Also in the case of another exchange module or another exchange part, log data on the life parameter and the life monitoring parameter may be saved in the file G as long as the life can be estimated.

Figure 33:
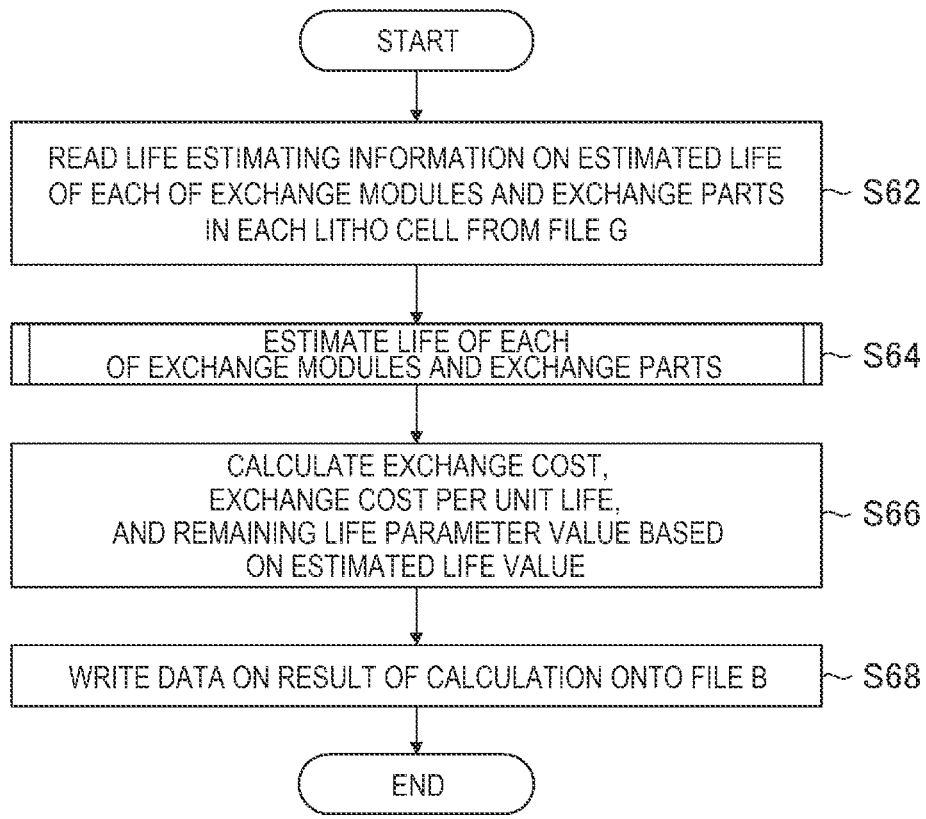
FIG. 33 is a flowchart showing an example of the contents of the processes carried out by an estimated life value calculating section.

9.2.3 Example of Processes Carried Out by Estimated Life Value Calculating Section FIG. 33 is a flowchart showing an example of the contents of the processes carried out by the estimated life value calculating section 414. In step S62, the estimated life value calculating section 414 reads the life estimating information on the estimated life of each of the exchange modules and the exchange parts in each litho cell from the file G. For example, the estimated life value calculating section 414 reads the life parameter value of each of the exchange modules and the exchange parts in each litho cell, the log data on the life monitoring parameter configured to monitor the life, and the threshold of the monitoring parameter, such as those shown in FIG. 32 by way of example, from the file G.

In step S64 in FIG. 33, the estimated life value calculating section 414 estimates the life of each of the exchange modules and the exchange parts based on the read data. The estimated life value calculating section 414 calculates an estimated life value based on the trend of the life monitoring parameter grasped from the log data saved in the file G. The estimated life value may be a value at which the life monitoring parameter value reaches the threshold of the monitoring parameter. A specific example of the content of the process in step S64 will be described later with reference to FIG. 34.

In step S66, the estimated life value calculating section 414 calculates the exchange cost Cexc(k,l,m), the exchange cost Cplife(k,l,m) per unit life, and the remaining life parameter value Prarl(k,l,m) based on the estimated life value determined in step S64.

In step S68, the estimated life value calculating section 414 writes the data determined by the calculation in step S66 onto the file B to update the data. At this point, initial data may be saved in a memory that is not shown, and data on the comparison before and after the update may be displayed.

Figure 34:
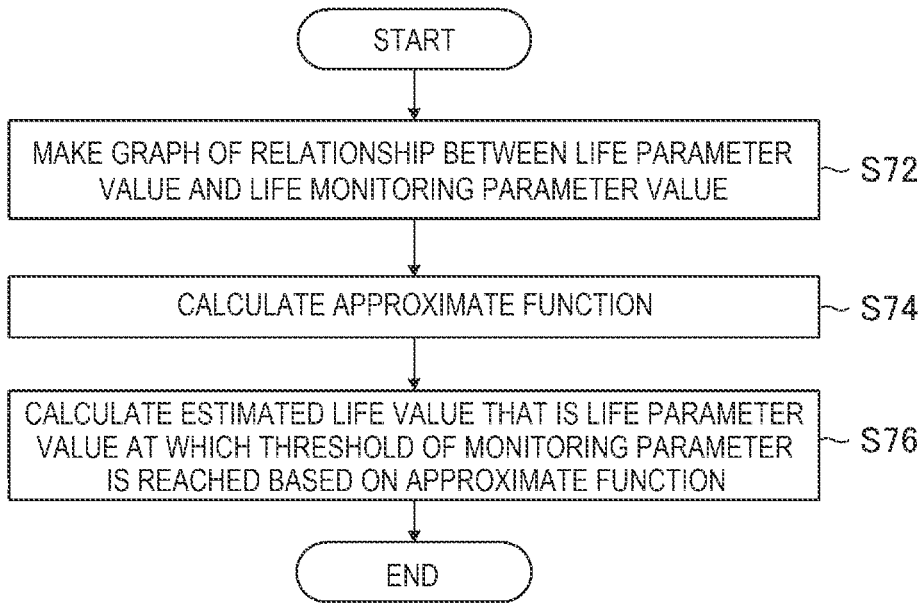
FIG. 34 is a flowchart showing an example of the process of estimating the life of each of exchange modules and exchange parts.

FIG. 34 is a flowchart showing an example of the process of estimating the life of each of the exchange modules and the exchange parts. The flowchart in FIG. 34 is applied to step S64 in FIG. 33. In step S72 in FIG. 34, the estimated life value calculating section 414 makes a graph of the relationship between the life parameter value and the life monitoring parameter value. The resultant graph is classified into either the pattern 1 shown in FIG. 35 or the pattern 2 shown in FIG. 36.

Figure 35:
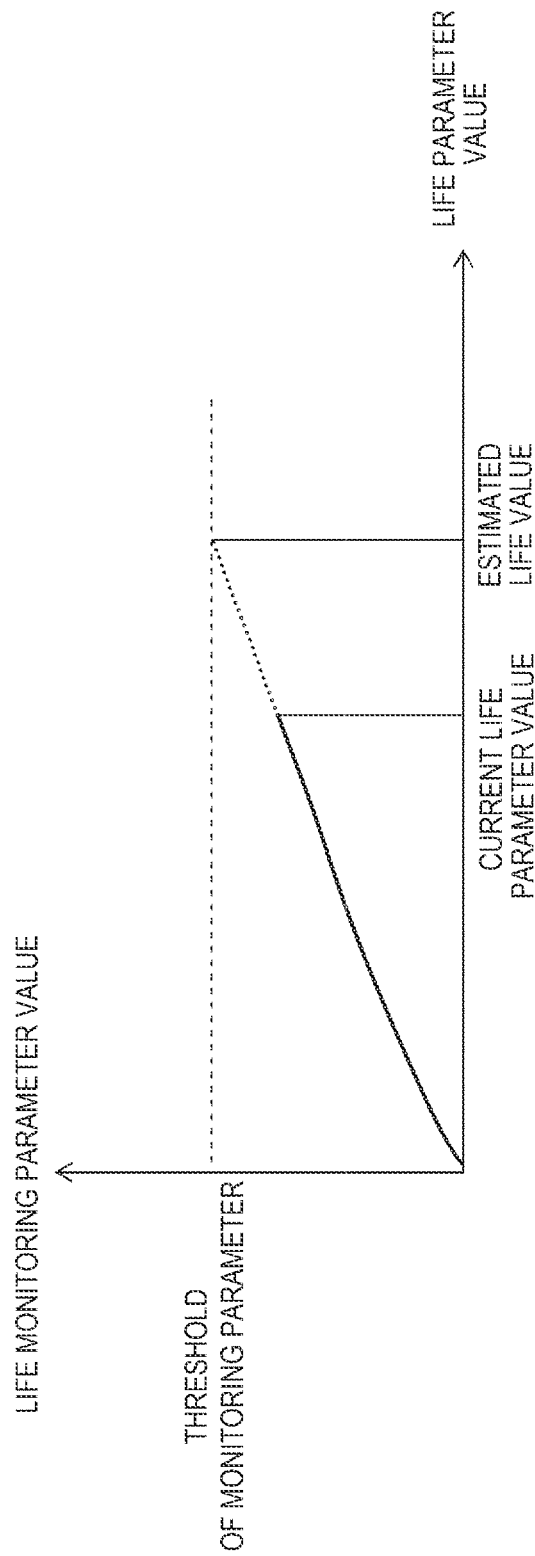
FIG. 35 shows an example of the graphed relationship between a life parameter value and a life monitoring parameter value.

FIG. 35 shows an example of the graphed relationship between the life parameter value and the life monitoring parameter value. The graph of the pattern 1 shown in FIG. 35 is characterized in that the greater the life parameter value, the greater the life monitoring parameter value. The relationship between the life parameter value and the life monitoring parameter value of each of the chemical filter in the C/D apparatus and the laser chamber in the laser apparatus described with reference to FIG. 32 corresponds to the pattern 1.

Figure 36:
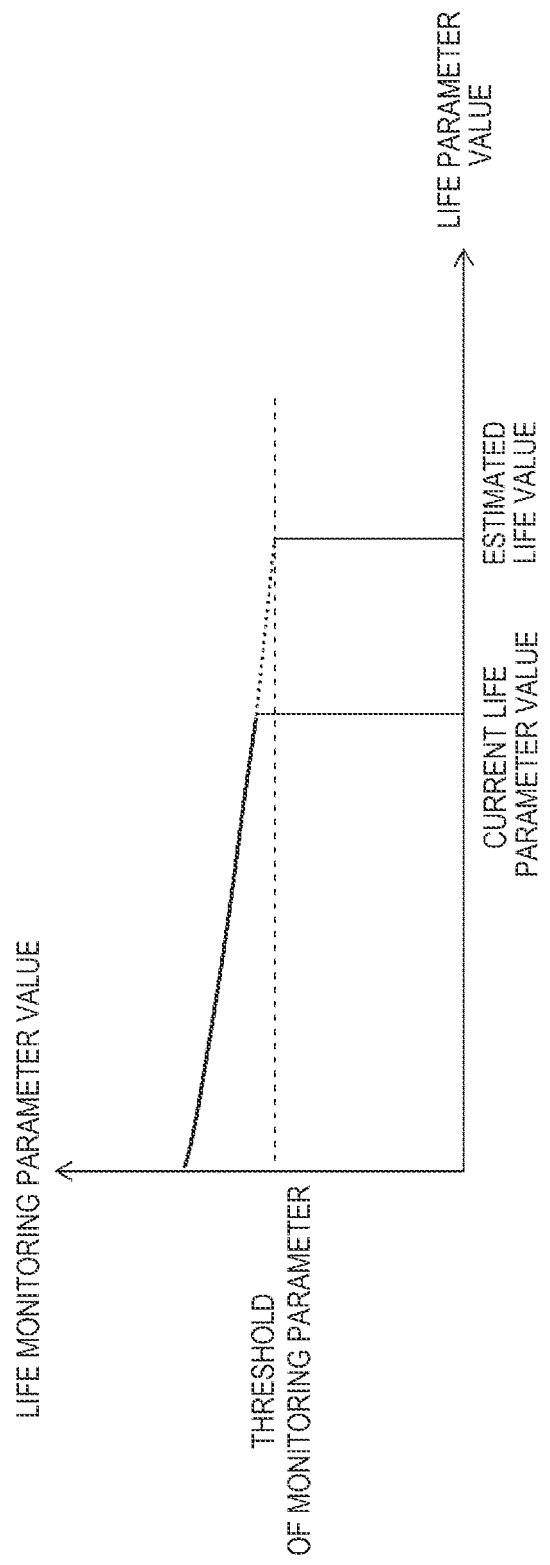
FIG. 36 shows another example of the graphed relationship between the life parameter value and the life monitoring parameter value.

FIG. 36 shows another example of the graphed relationship between the life parameter value and the life monitoring parameter value. The graph of the pattern 2 shown in FIG. 36 is characterized in that the greater the life parameter value, the smaller the life monitoring parameter value. The relationship between the life parameter value and the life monitoring parameter value of an exchange part of the illumination optical system in the exposure apparatus described with reference to FIG. 32 corresponds to the pattern 2.

The estimated life value calculating section 414 makes a graph of the relationship between the life parameter value and the life monitoring parameter value of each of the exchange modules and the exchange parts.

In step S74 in FIG. 34, the estimated life value calculating section 414 calculates an approximate function based on the graphed relationships. Examples of the approximate function may include an aspect in which values close to the current life parameter values are used to perform linear approximation or an aspect in which measured values are used to perform polynomial approximation.

In step S76, the estimated life value calculating section 414 calculates an estimated life value that is the life parameter value at which the life monitoring parameter value reaches the threshold of the monitoring parameter based on the approximate function.

After step S76, the estimated life value calculating section 414 returns to the flowchart in FIG. 33.

<Others>

The life of each of the exchange modules and the exchange parts may instead be estimated by machine learning. The estimated life value may be calculated by mechanically learning known data, automatically deriving a pattern or a rule, and creating an estimation model. In this case, the life estimation accuracy is improved.

9.3 Effects and Advantages

According to the fourth embodiment, in which the estimated life value is calculated from the life estimating information on the estimated life of each of the exchange modules and the exchange parts in each litho cell and the maintenance schedule is optimized based on the estimated life value, the following effects and advantages are provided.

(a) The maintenance schedule is optimized with further improved accuracy in consideration of individual differences in the lives of the exchange modules and the exchange parts.

(b) When the life of any of the exchange modules and the exchange parts is shorter than a default life value, the maintenance of the exchange module or the exchange part at an unplanned timing is suppressed.

(c) When the life of any of the exchange modules and the exchange parts is longer than the default life value, the maintenance cost is lower than that in the third embodiment.

10. Fifth Embodiment

10.1 Configuration

Figure 37:
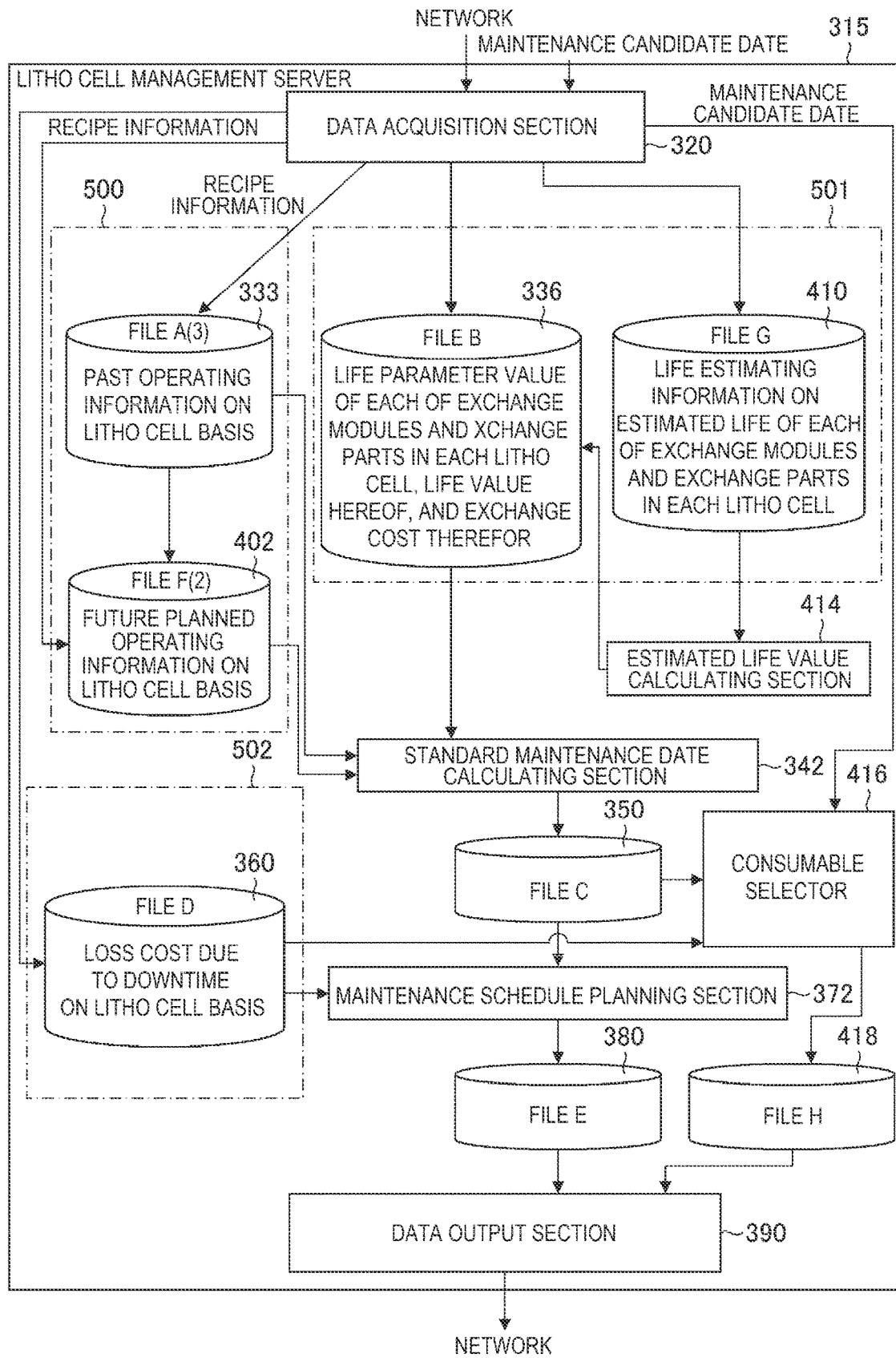
FIG. 37 is a block diagram showing the functions of a litho cell management server according to a fifth embodiment.

FIG. 37 is a block diagram showing the functions of a litho cell management server 315 according to a fifth embodiment. Differences from the litho cell management server 314 according to the fourth embodiment described with reference to FIG. 31 will be described.

In the fifth embodiment, information on a maintenance candidate date is added as the information acquired by the data acquisition section 320. The litho cell management server 315 shown in FIG. 37 includes a consumable selector 416 and a storage 418 configured to store a file H.

The file H is a file containing the item type of the exchange module or the exchange part selected as a consumable recommended to be exchanged on a specified maintenance candidate date and the maintenance period for the selected exchange module or the exchange part. The file H is created by the consumable selector 416.

10.2 Operation

10.2.1 Operation of Litho Cell Management Server

The data acquisition section 320 of the litho cell management server 315 shown in FIG. 37 is configured to be capable of receiving a maintenance candidate date when the litho cell #k is maintained, for example, from the semiconductor factory management system 208 via the network 210. The data acquisition section 320 is configured to send the maintenance candidate date received via the network 210 to the consumable selector 416.

The consumable selector 416 is configured to optimize the selection of a consumable (any of exchange modules and exchange parts) to be exchanged on the maintenance candidate date based on the maintenance candidate date and the data in the files C and D. In the optimization, for example, the consumable to be exchanged is so selected that the maintenance cost is minimized.

The litho cell management server 315 is configured to save data containing the result of the selection of any of the exchange modules and the exchange parts in the litho cell #k and the maintenance period for the selected exchange module or the exchange part in the file H.

The data output section 390 is configured to read the data saved in the file H and output the read data to the semiconductor factory management system 208 or a display terminal that is not shown via the network 210.

10.2.2 Example of Processes Carried Out by Consumable Selector

Figure 38:
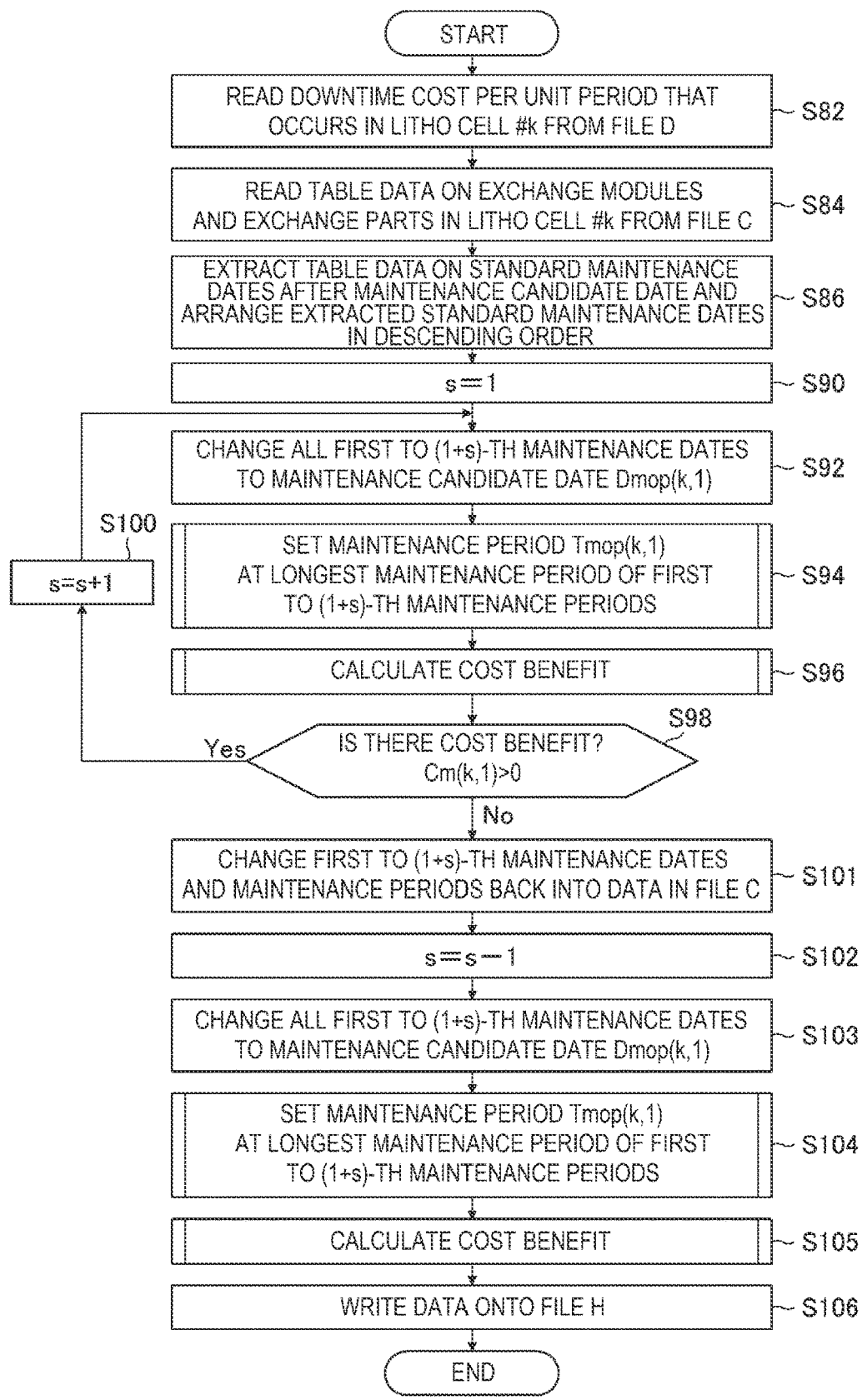
FIG. 38 is a flowchart showing an example of the contents of the processes carried out by a consumable selector.

FIG. 38 is a flowchart showing an example of the contents of the processes carried out by the consumable selector 416.

In step S82, the consumable selector 416 reads a downtime cost per unit period that occurs in the litho cell #k from the file D.

In step S84, the consumable selector 416 reads the table data on the exchange modules and the exchange parts in the litho cell #k from the file C.

In step S86, the consumable selector 416 extracts the table data on the standard maintenance dates after the maintenance candidate date and arranges the extracted standard maintenance dates in the descending order.

In step S90, the consumable selector 416 initializes the value of the variable s to "1", which is an initial value.

In step S92, the consumable selector 416 changes all the first to (1+s)-th maintenance dates representing when the exchange modules or the exchange parts are exchanged, contained in the table data, and rearranged in the descending order in step S86 to a maintenance candidate date Dmop(k, 1).

In step S94, the consumable selector 416 sets a maintenance period Tmop(k,1) at the longest maintenance period of the first to (1+s)-th maintenance periods.

In step S96, the consumable selector 416 calculates the cost benefit.

Figure 39:
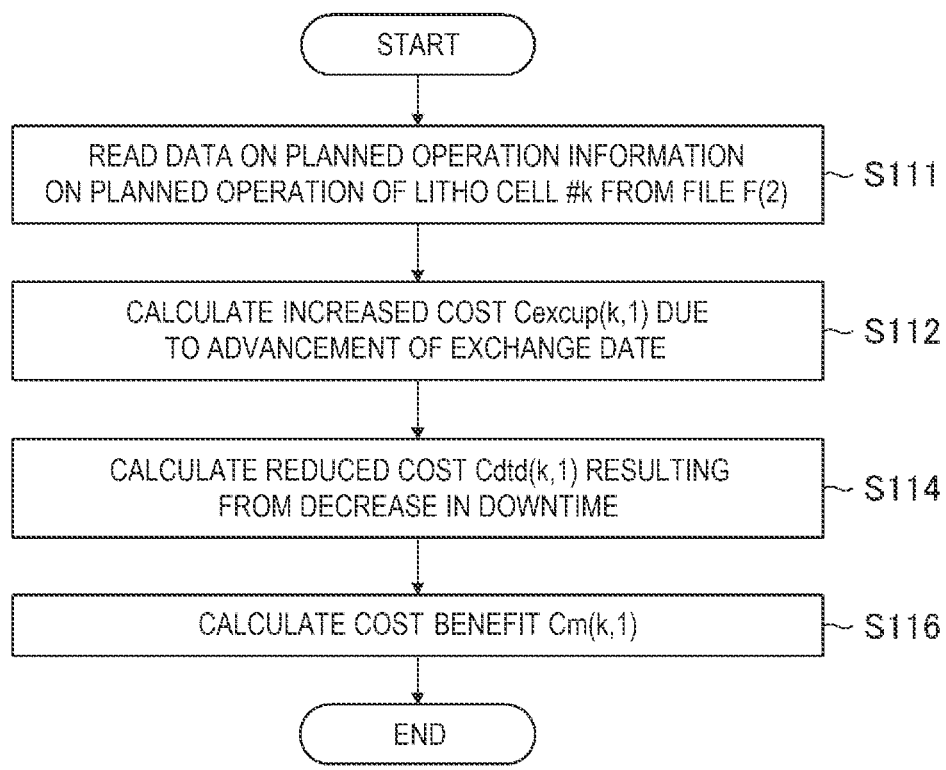
FIG. 39 is a flowchart showing an example of the process of calculating the cost benefit.

FIG. 39 is a flowchart showing an example of the process of calculating the cost benefit. The flowchart in FIG. 39 is applied to step S96 in FIG. 38.

In step S111 in FIG. 39, the consumable selector 416 reads data on the planned operating information of the litho cell #k from the file F(2).

In step S112, the consumable selector 416 calculates an increased cost Cexcup(k,l) due to the advancement of the exchange date.

The increased cost Cexcup(k,1) is calculated by using the expression below.

$$Cexcup(k,1) = \Sigma\{Cplife(k,l,m,q) \cdot Parad(Dmds \sim Dmop)\} \qquad (29)$$

$\Sigma$ in the expression represents the sum from q=1 to q=1+s.

In step S114, the consumable selector 416 calculates a reduced cost Cdtd(k,1) resulting from a decrease in the downtime.

The reduced cost Cdtd(k,1) is calculated by using the expression below.

$$Cdtd(k,1) = \{\Sigma Tmds(k,l,m,q) - Tmop(k,1)\} \cdot Cdt(k) \qquad (30)$$

In step S116, the maintenance schedule planning section 372 calculates a cost benefit Cm(k,1) based on the increased cost Cexcup(k,1) determined in step S112 and the reduced cost Cdtd(k,1) determined in step S114.

The cost benefit Cm(k,1) is calculated by using the expression below.

$$Cm(k,1) = Cdtd(k,1) - Cexcup(k,1) \qquad (31)$$

When the cost benefit Cm(k,1) is determined in step S116, the consumable selector 416 terminates the flowchart in FIG. 39 and returns to the main procedure in FIG. 38.

In step S98 in FIG. 38, the consumable selector 416 evaluates whether or not there is a cost benefit. When Cm(k,1) determined in step S96 satisfies Cm(k,1)>0, the consumable selector 416 proceeds to step S100, increments the value of the variable s, and returns to step S92.

When Cm(k,1)≤0 is satisfied in the evaluation process in step S98, the consumable selector 416 proceeds to step S101.

In step S101, the consumable selector 416 changes the first to (1+s)-th maintenance dates and maintenance periods back into the data in the file C.

In step S102, the consumable selector 416 decrements the value of the variable s and proceeds to step S103.

In step S103, the consumable selector 416 changes all the first to (1+s)-th maintenance dates of the exchange modules or exchange parts to the maintenance candidate date Dmop (k,1). The process in step S103 is the same as the process in step S92.

In step S104, the consumable selector 416 sets the maintenance period Tmop(k,1) at the longest maintenance period of the first to (1+s)-th maintenance periods. The process in step S104 is the same as the process in step S94.

In step S105, the consumable selector 416 calculates the cost benefit. The process in step S105 is the same as the process in step S96.

Thereafter, in the following step S106, the consumable selector 416 writes the data onto the file H. After step S106, the flowchart shown in FIG. 38 is terminated.

10.2.3 Example of Table Data Contained in File H

FIG. 40 is a table showing an example of table data contained in the file H. The file H contains information on the item group of the exchange module or the exchange part to be exchanged on the specified maintenance candidate date, the increased cost due to the advancement of the exchange date, the maintenance period, the downtime-reduction reduced cost, and the cost benefit. The term "exchange date" is synonymous with the maintenance date.

Figure 41:
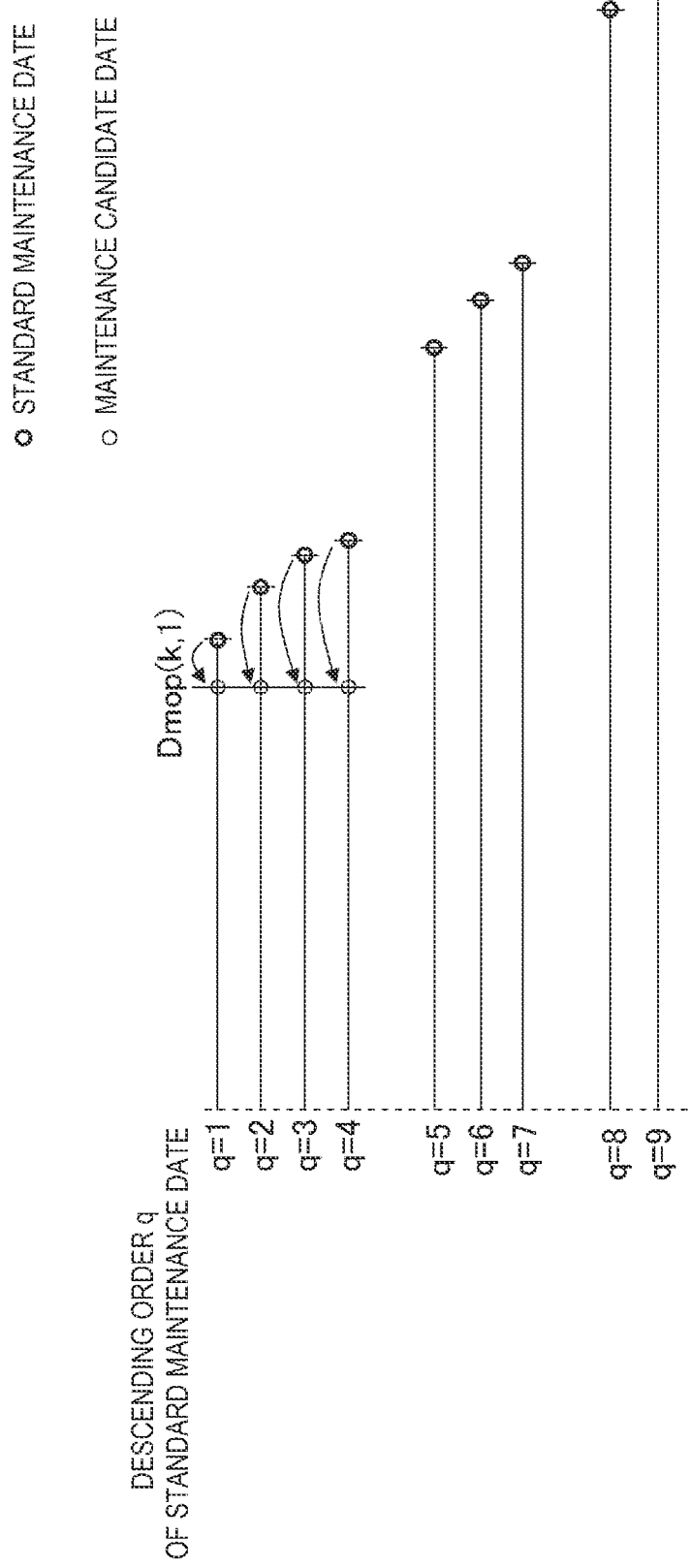
FIG. 41 is a descriptive diagram diagrammatically showing the relationship between the standard maintenance date and the optimum maintenance date advanced to a maintenance candidate date.

FIG. 41 is a descriptive diagram diagrammatically showing the relationship between the standard maintenance date and the optimum maintenance date advanced to the maintenance candidate date. FIG. 41 reflects the contents of the table data shown in FIG. 40.

FIG. 41 shows that the exchange dates when the q=1 to 4 exchange modules or exchange parts are exchanged are advanced from the standard maintenance date to the maintenance candidate date Dmop(k,1).

10.3 Effects and Advantages

According to the fifth embodiment, in which the selection of any of the exchange modules and the exchange parts can be optimized based on the maintenance candidate date when the litho cell #k is maintained, the following effects and advantages are provided.

(a) When the maintenance cannot be performed on the maintenance date planned by the maintenance schedule planning section 372, the selection of any of the exchange modules and the exchange parts can be optimized based on a candidate date when the maintenance can be performed.

(b) When the litho cell #k is planned to be suspended due to some kind of failure, the suspension date is inputted as the maintenance candidate date, and any of the exchange modules and the exchange part is then selected, whereby the cost can be reduced.

11. Sixth Embodiment

11.1 Configuration

Figure 42:
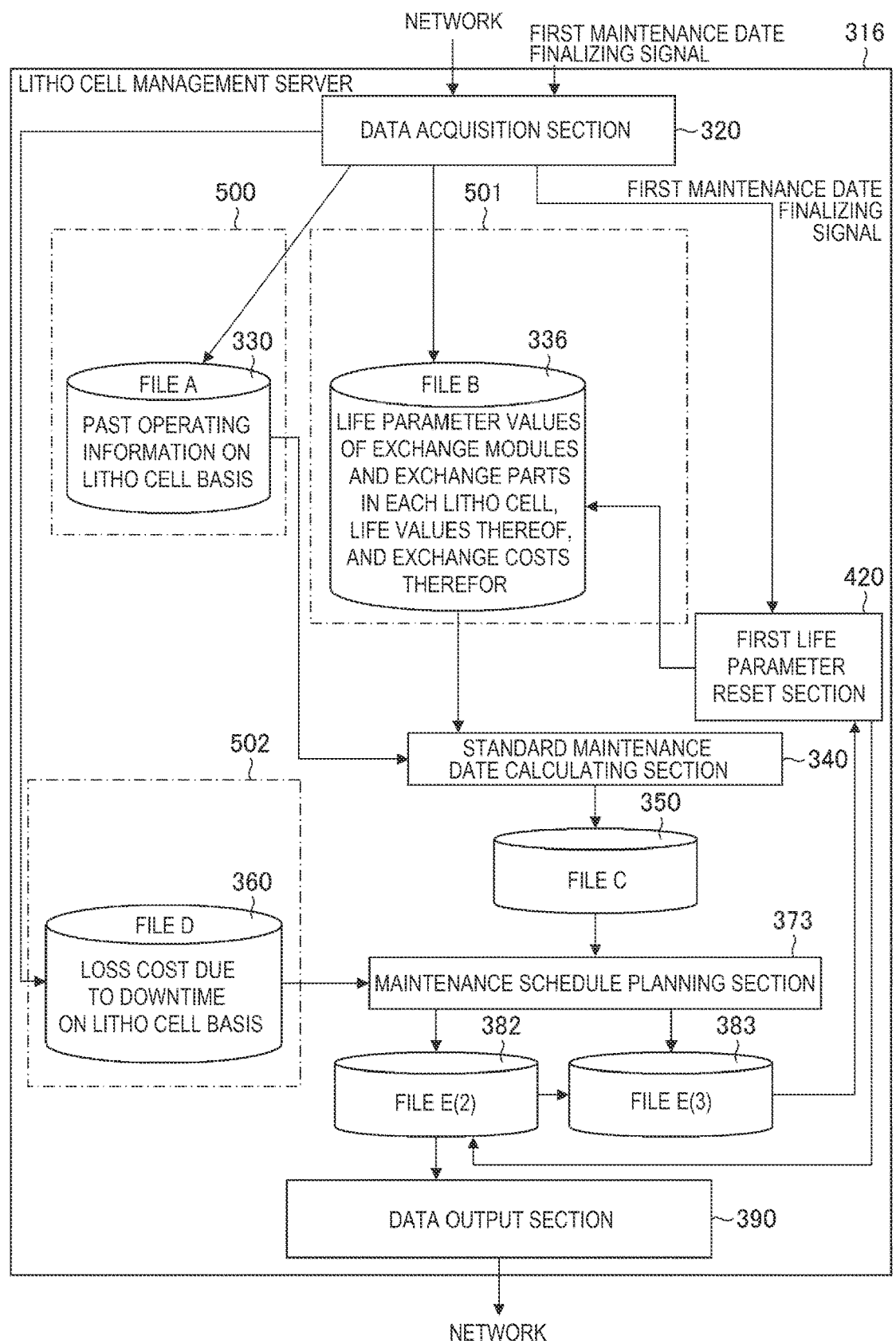
FIG. 42 is a block diagram showing the functions of a litho cell management server according to a six embodiment.

FIG. 42 is a block diagram showing the functions of a litho cell management server 316 according to a sixth embodiment. Differences from the litho cell management server 310 according to the first embodiment described with reference to FIG. 7 will be described.

The litho cell management server 316 according to the sixth embodiment includes a first life parameter reset section 420 added to the configuration in FIG. 7. The litho cell management server 316 according to the sixth embodiment further includes a maintenance schedule planning section 373 in place of the maintenance schedule planning section 370 in FIG. 7. A file configured to save information on the optimized maintenance schedule created by the maintenance schedule planning section 373 is referred to as a file E(2). A file that is a copy of the file E(2) is referred to as a file E(3). An example of table data contained in the file E(2) will be described later with reference to FIG. 44.

The litho cell management server 316 includes a storage 382 configured to store the file E(2) and a storage 383 configured to store the file E(3).

11.2 Operation

11.2.1 Operation of Litho Cell Management Server

The maintenance schedule planning section 373 shown in FIG. 42 is configured to optimize the maintenance schedule, as in the processes carried out by the maintenance schedule planning section 370 in FIG. 7. The result of the calculation is saved in the file E(2). The data output section 390 is configured to transmit the data in the file E(2) to the display terminal that is not shown or the semiconductor factory management system 208.

After the maintenance schedule plan optimized by the maintenance schedule planning section 373 is created, whether or not the plan is executed is evaluated, and a signal configured to finalize a first maintenance date can be inputted to the litho cell management server 316 from the display terminal that is not shown or the semiconductor factory management system 208.

The first maintenance date refers to a v=1 maintenance date that comes earliest after the current date and time. The "first maintenance date" in a case where the maintenance schedule plan based on the table data described with reference to FIG. 20 is presented is Dmop(k,1). The signal configured to finalize the first maintenance date is called a "first maintenance date finalizing signal."

The litho cell management server 316 is configured to receive input of the first maintenance date finalizing signal. When the first maintenance date finalizing signal is inputted via the data acquisition section 320, the first life parameter reset section 420 finalizes the first maintenance date and resets the life parameter of the exchange module or the exchange part determined to be exchanged on the first maintenance date.

Figure 43:
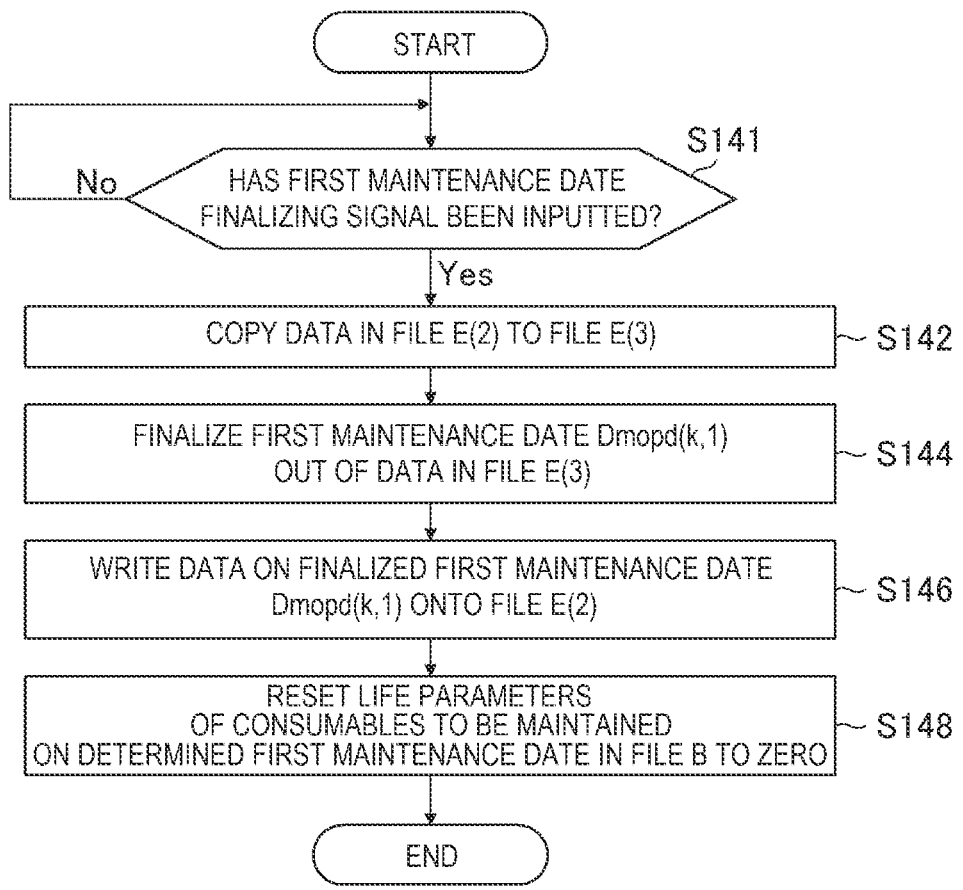
FIG. 43 is a flowchart showing an example of the contents of the processes carried out by a first life parameter reset section.

FIG. 43 is a flowchart showing an example of the contents of the processes carried out by the first life parameter reset section 420.

In step S141, the first life parameter reset section 420 evaluates whether or not the first maintenance date finalizing signal has been inputted from the display terminal that is not shown or the semiconductor factory management system 208.

When the first maintenance date finalizing signal has not been inputted, the first life parameter reset section 420 repeats step S141 and waits for input of the first maintenance date finalizing signal.

When the first maintenance date finalizing signal is inputted, the first life parameter reset section 420 proceeds to step S142.

In step S142, the first life parameter reset section 420 copies the data in the file E(2) containing the previously created maintenance plan to the file E(3). For example, the table data in the file E(3) at this stage may be the table data in the file E shown in FIG. 20.

In step S144, the first life parameter reset section 420 finalizes a first maintenance date Dmopd(k,1) out of the data in the file E(3). For example, the first maintenance date Dmopd(k,1) is so finalized as to be equal to Dmop(k,1) in FIG. 20.

In step S146, the first life parameter reset section 420 writes data on the finalized first maintenance date Dmopd(k,1) onto the file E(2). That is, the first life parameter reset section 420 finalizes the first maintenance date Dmopd(k,1) in such a way that the first maintenance date Dmopd(k,1) is equal to the Dmop(k,1) out of the data in the file E(2) and writes data on the exchange module or the exchange part determined to be exchanged on the first maintenance date Dmopd(k,1) onto the file E(2). FIG. 44 shows an example of table data in the file E(2) into which the first life parameter reset section 420 has written the data.

Upon the finalization of the first maintenance date, the increased cost due to the advancement of the exchange date, the maintenance period, the downtime-reduction reduced cost, and the cost benefit are finalized for a group of the exchange module or the exchange part to be exchanged on the first maintenance date.

FIG. 44 shows an example in which the first maintenance date Dmopd(k,1) has been finalized for top three exchange modules or exchange parts in the descending order of the maintenance date. Upon the finalization of the first maintenance date Dmopd(k,1), the increased cost due to the advancement of the exchange date Cexcupd(k,1), the maintenance period Tmopd(k,1), the downtime-reduction reduced cost Cdtdd(k,1), and the cost benefit Cmd(k,1) are finalized for the part group to be maintained on the determined maintenance date, as shown in FIG. 44.

In step S148 in FIG. 43, the first life parameter reset section 420 resets the life parameters of the consumables to be maintained on the determined first maintenance date out of the data in the file B to zero.

When the life parameters of the consumables to be exchanged on the determined first maintenance date in the file B is reset to zero, the standard maintenance date calculating section 340 sets the life parameters of the consumables to be exchanged on the determined first maintenance date at zero, recalculates the standard maintenance date, and save the data in the file C, as in the processes in FIG. 6.

The maintenance schedule planning section 373 optimizes the maintenance schedule and saves the result of the calculation in the file E(2), as in the processes carried out by the maintenance schedule planning section 370 in FIG. 7.

The data output section 390 transmits the data in the file E(2) to the display terminal that is not shown or the semiconductor factory management system 208.

Figure 45:
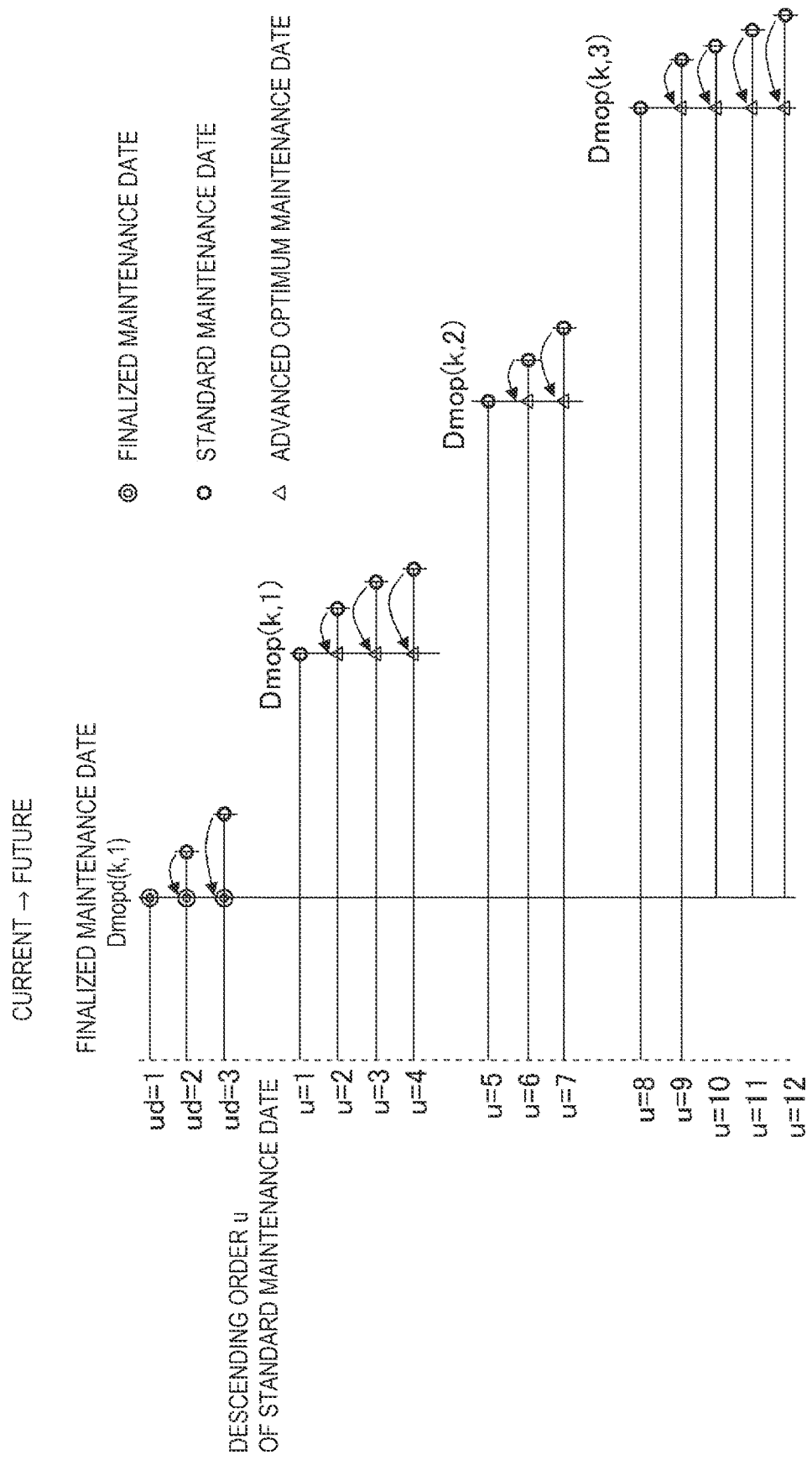
FIG. 45 is a conceptual view of a maintenance schedule plan that reflects the table data in FIG. 44.

FIG. 45 is a conceptual view of a maintenance schedule plan that reflects the table data in FIG. 44. In FIG. 45, the maintenance dates for the ud=2 and ud=3 consumables have been advanced from the standard maintenance dates, and the maintenance date for the consumables has been so finalized as to be the same as the standard maintenance date for the ud=1 consumable. Upon the finalization of the first maintenance date, the maintenance schedule plans following the first maintenance date are recalculated, and maintenance schedule plans for the u=1 to 12 consumables are newly presented.

In the example shown in FIG. 45, the maintenance dates for the ud=1 to 3 consumables are finalized, followed by the calculation of the next standard maintenance dates, and the maintenance dates for the u=10 to 12 consumables are added. It is then recommended that the maintenance dates for the u=10 to 12 consumables are advanced from the standard maintenance date therefor to the same date as the standard maintenance date for the u=8 consumable.

11.3 Effects and Advantages

According to the sixth embodiment, after a first maintenance date in a created maintenance schedule plan is finalized, the maintenance schedule plan after the first maintenance date can be laid out again, whereby the maintenance schedule is created with improved accuracy.

11.4 Others

The sixth embodiment has been described with reference to the case where a first maintenance date is finalized, but not necessarily. For example, after a first maintenance date is finalized, a second maintenance date may be finalized to lay out a maintenance schedule plan. Instead, a signal configured to finalize a first maintenance date to a v-th maintenance date may be received, and the maintenance dates for the first to the v-th consumables are sequentially calculated to lay out a maintenance schedule plan.

12. Example of Optimization of Maintenance Schedule Plan

Figure 46:
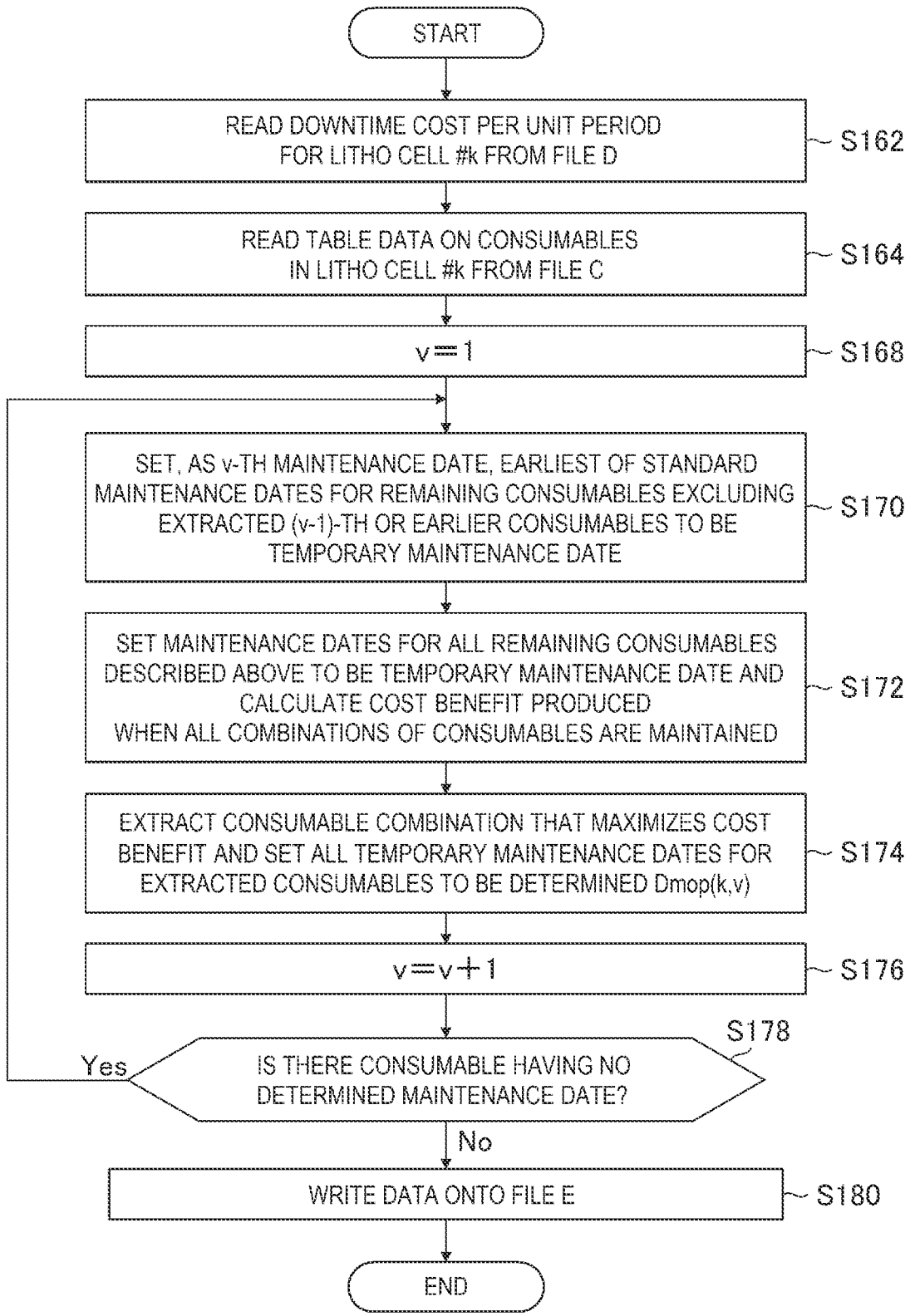
FIG. 46 is a flowchart showing an example of the process of creating a maintenance schedule plan from the viewpoint of cost minimization.

FIG. 46 is a flowchart showing an example of the process of creating a maintenance schedule plan from the viewpoint of cost minimization. The flowchart shown in FIG. 46 may be executed by any of the maintenance schedule planning sections 370, 372, and 373. The following description will be made of a case where the maintenance schedule planning section 370 executes the flowchart shown in FIG. 46.

In step S162, the maintenance schedule planning section 370 reads a downtime cost per unit period for the litho cell #k from the file D.

In step S164, the maintenance schedule planning section 370 reads the table data on the exchange modules and the exchange parts in the litho cell #k from the file C.

In step S168, the maintenance schedule planning section 370 initializes the variable v to "one", which is an initial value.

In step S170, the maintenance schedule planning section 370 sets, as the v-th maintenance date, the earliest of the standard maintenance dates for the remaining consumables excluding the extracted (v−1)-th and earlier consumables to be a temporary maintenance date. In the case where v=1 is satisfied, the earliest of the standard maintenance dates for all the consumables in the litho cell #k is assumed to be the maintenance date (temporary maintenance date). The earliest of the standard maintenance dates for the consumables is then assumed to be the maintenance date, and the cost benefit for each of the combinations of all the consumables described above is calculated.

That is, in step S172, the maintenance schedule planning section 370 sets the maintenance dates for all the remaining consumables described above to be the temporary maintenance date and calculates the cost benefit produced when all the combinations of the consumable are maintained.

For all the remaining consumables, the cost benefit is calculated based on the difference between the downtime-reduction reduced cost resulting from the maintenance period shortened by exchanging the combined consumables together and the increased cost due to the advancement to the temporary maintenance date. The process of calculating the cost benefit in step S172 is carried out, for example, in the same procedure as that in the flowchart in FIG. 19.

In step S174 in FIG. 46, the maintenance schedule planning section 370 extracts a consumable combination that maximizes the cost benefit from the result of the calculation in step S172 and sets all the temporary maintenance dates for the extracted consumables to be the determined optimum maintenance date Dmop(k,v). The v-th optimum maintenance date is thus determined.

Thereafter, in step S176, the maintenance schedule planning section 370 increments the value of v and proceeds to step S178.

In step S178, the maintenance schedule planning section 370 evaluates whether or not there is a consumable having no determined maintenance date.

When the result of the evaluation in step S178 is Yes, that is, when there is a consumable having no determined maintenance date, the maintenance schedule planning section 370 returns to step S170 and repeats the processes in steps S170 to S178.

When the result of the evaluation in step S178 is No, that is, when all the maintenance dates for the consumables are determined, the maintenance schedule planning section 370 proceeds to step S180.

In step S180, the maintenance schedule planning section 370 writes data on the maintenance schedule plan including the optimum maintenance date for each of consumables determined in step S174 onto the file E.

After step S180, the flowchart in FIG. 46 is terminated.

13. Specific Example of Monitoring Parameter

FIG. 47 is a table showing an example of the monitoring parameter used to estimate the life of each consumable. For example, in the case of the substrate rotating module in the C/D apparatus 12, the rotational speed of the substrate may be monitored, and a life parameter value at which the rotational speed of the motor is greater than the threshold of the monitoring parameter may be determined.

In the case of the drain recovery module in the C/D apparatus 12, the amount of consumed resist may be monitored, and a life parameter value at which the amount of consumed resist is greater than the threshold of the monitoring parameter may be determined.

In the case of exchange parts of the wafer transporting line in the C/D apparatus 12 and the exposure apparatus 14, the number of transported wafers may be monitored. The number of wafers transported to each portion in the C/D apparatus 12 and the exposure apparatus 14 may be monitored, and a life parameter value at which the number of transported wafers is greater than the threshold of the monitoring parameter may be determined.

In the case of exchange parts in the projection optical system in the exposure apparatus 14, the transmittance of light passing through the projection optical system 78 may be monitored based on the values detected with the first optical sensor 71 and the second optical sensor 82, and a life parameter value at which the transmittance of light passing through the projection optical system 78 is greater than the threshold of the monitoring parameter may be determined.

In the case of exchange parts in the illumination optical system in the exposure apparatus 14, the transmittance of light passing through part of the exchange parts provided in the illumination optical system 66, for example, the fly-eye lens 67 may be monitored based on the pulse energy of the pulsed laser light that enters the exposure apparatus 14 and the value detected with the first optical sensor 71, and a life parameter value at which the transmittance is greater than the threshold of the monitoring parameter may be determined.

In the case of the LNM in the laser apparatus 16, the spectral linewidth or the wavelength stability may be monitored, and a life parameter value at which the spectral linewidth or the wavelength stability is greater than the threshold of the monitoring parameter may be determined.

In the case of the laser chamber in the laser apparatus 16, the gas pressure in the laser chamber, the charging voltage, or the energy stability may be monitored, and a life parameter value at which the charging voltage Vhv or the energy stability is greater than the threshold of the monitoring parameter may be determined.

In the case of the front mirror in the laser apparatus 16, the beam profile may be monitored, the ratio of the degraded area of the beam profile to the entire area of the beam profile may be employed as the monitoring parameter, and a life parameter value at which the ratio is greater than the threshold of the monitoring parameter may be determined.

In the case of the monitoring module in the laser apparatus 16, degradation in the sensitivity of the optical sensors may be employed as the monitoring parameter, and a life parameter value at which the degradation is greater than the threshold of the monitoring parameter may be determined.

14. Example of Reduction in Downtime in a Case where a Plurality of Consumables in the Same Apparatus are Exchanged on the Same Day

14.1 Example of Flowchart

Figure 48:
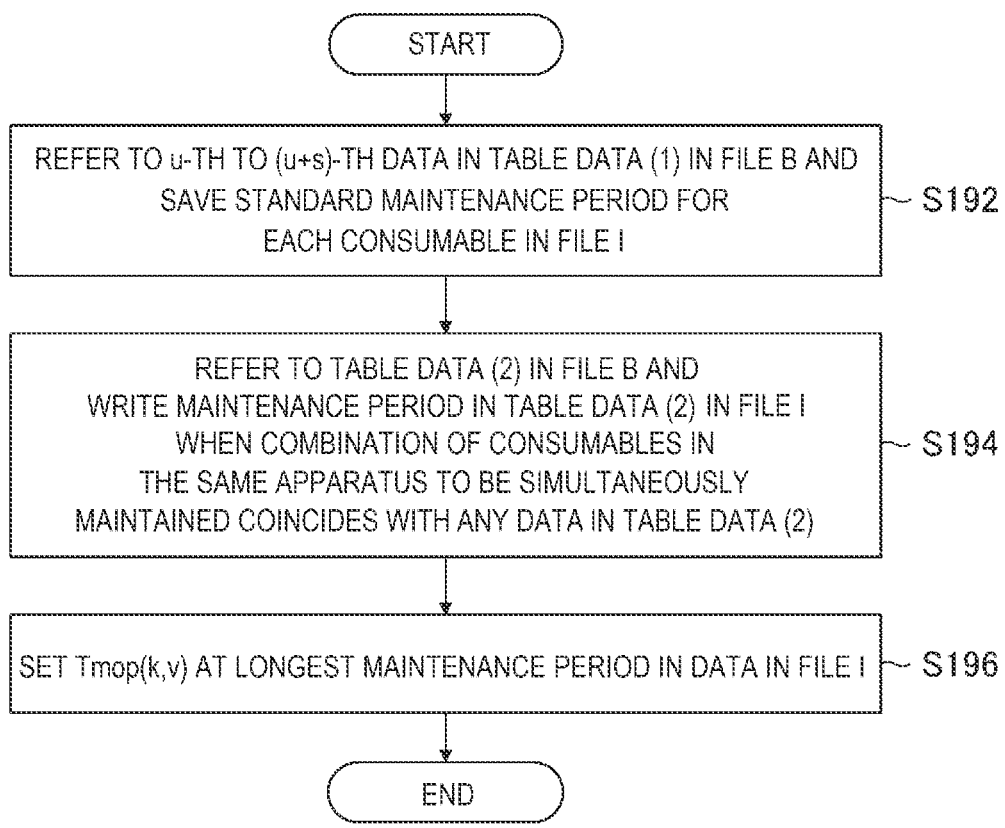
FIG. 48 is a flowchart showing an example of the contents of the processes carried out by a maintenance schedule planning section.

FIG. 48 is a flowchart showing an example of the contents of the processes carried out by the maintenance schedule planning section. The flowchart shown in FIG. 48 is applied to step S34 in FIGS. 18 and 26. An example of the processes carried out by the maintenance schedule planning section 370 will be described below.

In step S192 in FIG. 48, the maintenance schedule planning section 370 refers to the u-th to (u+s)-th data in the table data (1) in the file B shown in FIG. 12 and saves the standard maintenance period for each consumable in a file I. The litho cell management server 310 includes a storage that is not shown but is configured to store the file I.

In step S194 in FIG. 48, the maintenance schedule planning section 370 refers to the table data (2) in the file B shown in FIG. 13 and writes the maintenance period in the table data (2) onto the file I when the combination of consumables in the same apparatus to be simultaneously maintained coincides with any data in the table data (2) in the file B.

In step S196, Tmop(k,v) is set at the longest maintenance period in the data in the file I.

After step S196, the maintenance schedule planning section 370 returns to the flowchart in FIG. 18 or 26.

14.2 Effects and Advantages

According to the flowchart shown in FIG. 48, the cost benefit can be calculated based on data on the maintenance period that can be shortened by using the combination of consumables in the same apparatus to be simultaneously maintained. As a result, the maintenance schedule is planned with improved accuracy.

14.3 Others

Also in the calculation of the cost benefit in step S172 in FIG. 46, the calculation process in the flowchart shown in FIG. 48 may be carried out.

15. Another Form of Lithography System

15.1 Configuration

Figure 49:
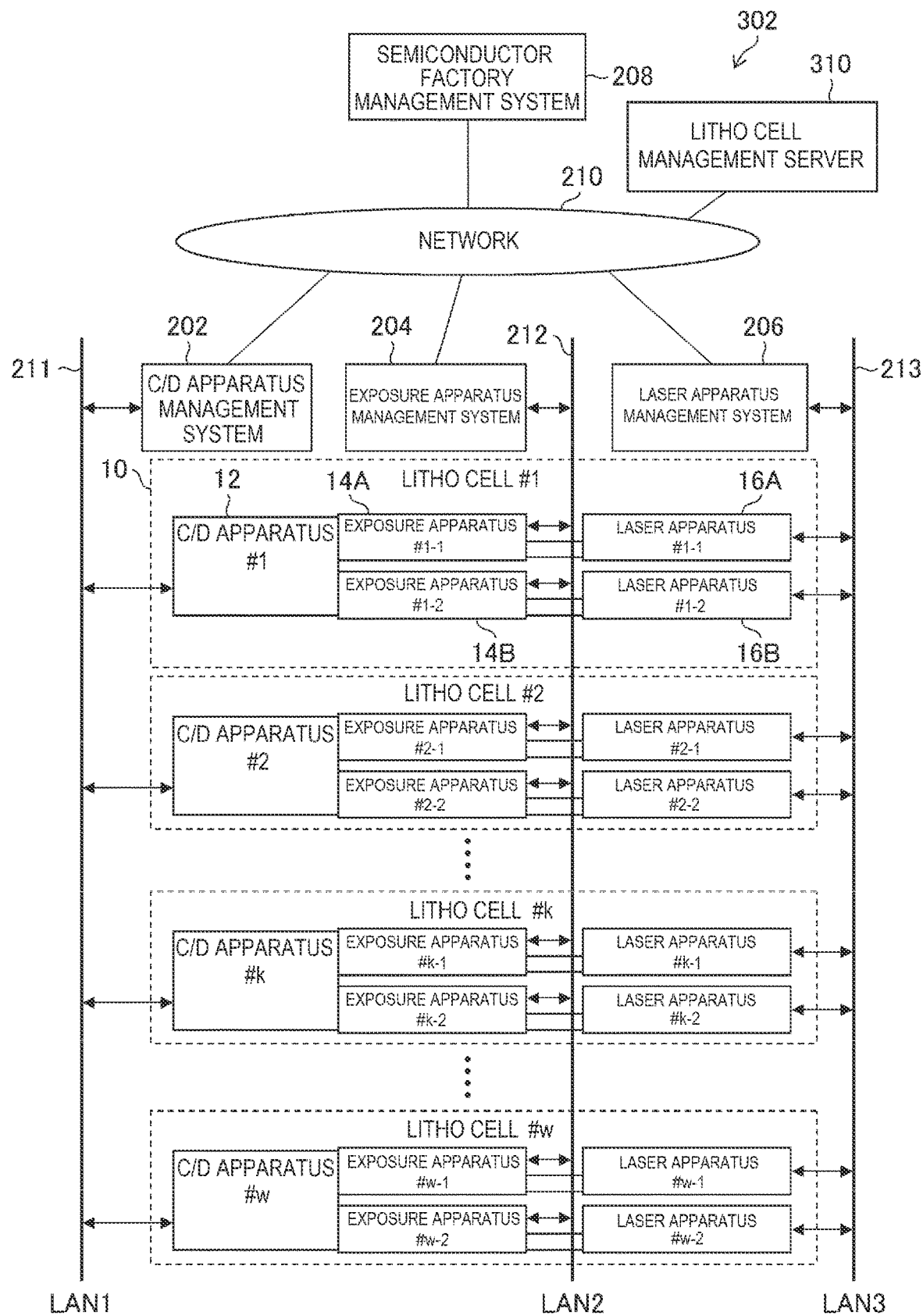
FIG. 49 is a block diagram showing another example of the form of the lithography system.

FIG. 49 is a block diagram showing another example of the form of the lithography system. Differences between FIG. 49 and FIG. 6 will be described. A lithography system 302 shown in FIG. 49 includes one C/D apparatus 12, two exposure apparatuses 14A and 14B, and two laser apparatuses 16A and 16B as the components of the litho cell 10.

In FIG. 49, the two exposure apparatuses in the litho cell #k are referred to as exposure apparatuses #k-1 and #k-2. Similarly, the two laser apparatuses in the litho cell #k are referred to as laser apparatuses #k-1 and #k-2.

15.2 Operation

The litho cell management server 310 in FIG. 49 is configured to collect information on each apparatus and optimize the maintenance schedule on a litho cell basis.

15.3 Effects and Advantages

Even when any of the components of an apparatus that forms the litho cell 10 is changed, the maintenance schedule can be optimized on a litho cell basis, as shown in FIG. 49.

15.4 Others

In FIG. 6, the description has been made of the form in which the litho cell 10 is formed of one C/D apparatus, one exposure apparatus, and one laser apparatus, and in FIG. 49, the description has been made of the form in which the litho cell 10 is formed of one C/D apparatus, two exposure apparatuses, and two laser apparatuses, but not necessarily. For example, the components of one litho cell 10 as a unit may be at least one C/D apparatus 12, at least one exposure apparatus 14, and at least one laser apparatus 16.

16. Seventh Embodiment

16.1 Overview of Form in which Maintenance Schedule Plan is Optimized on a Line Basis The above description has been made of the case where information is collected and the maintenance schedule plan is optimized on a litho cell basis, and the maintenance schedule plan may be optimized on a "line" basis. The term "line" means a manufacturing line. In a large-scale semiconductor factory, a plurality of lines are juxtaposed in some cases. The manufacturing lines are each formed of at least one litho cell.

Figure 50:
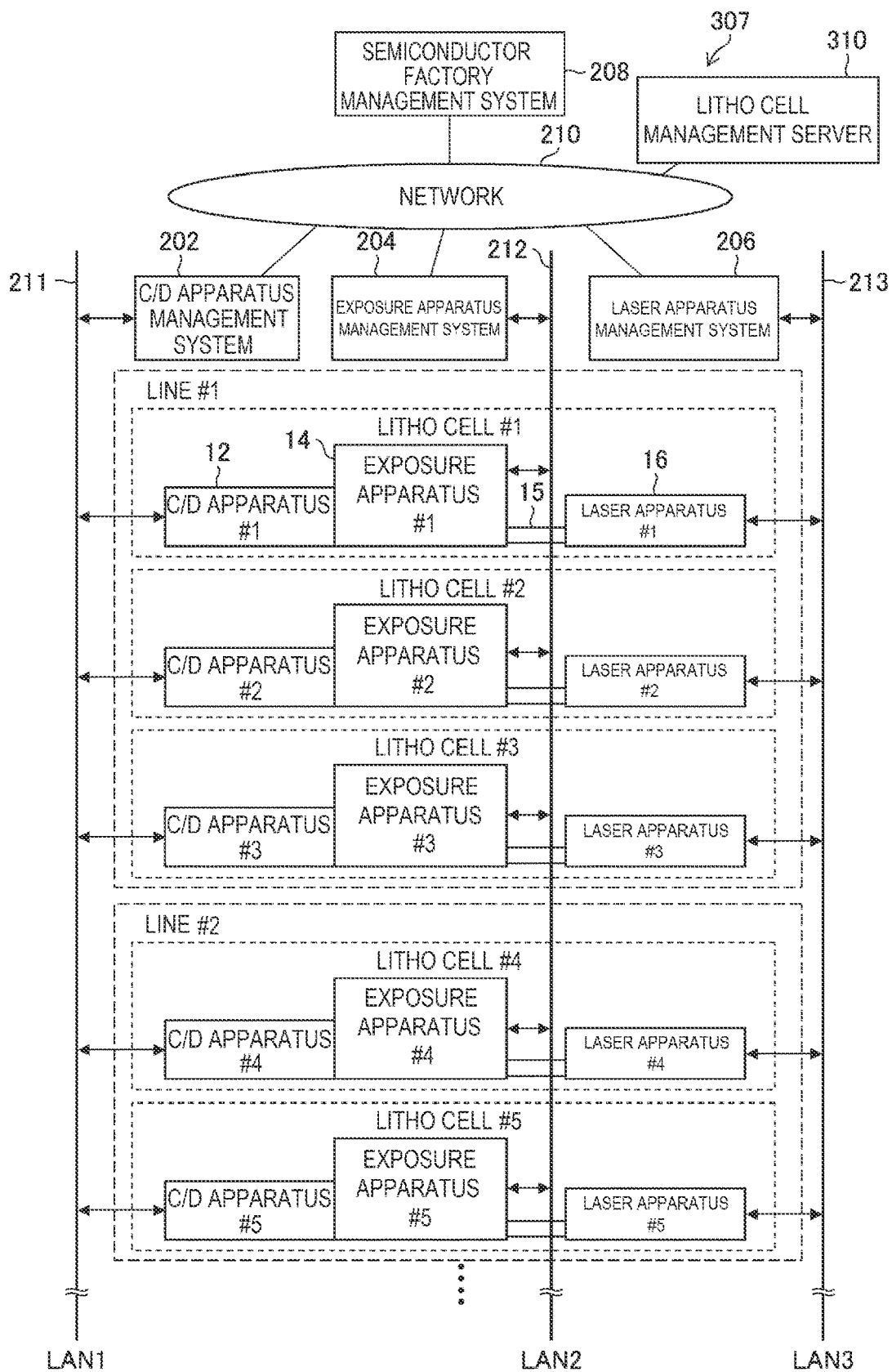
FIG. 50 shows another example of the form of the lithography system in a semiconductor factory.

FIG. 50 shows another example of the form of the lithography system in a semiconductor factory. A lithography system 307 shown in FIG. 50 includes a plurality of lines. Two lines are shown for simplicity of the description. A line #1 is formed of three litho cells #1 to #3. A line #2 is formed of two litho cells #4 and #5. The lines may be configured to process wafers for different types of semiconductor. For example, wafers for a first semiconductor are processed in the line #1, and wafers for a second semiconductor are processed in the line #2.

Wafers are processed in the line #1 with the wafers passing through the plurality of litho cells 10. Therefore, when one of the litho cells 10 in the line #1 stops processing the wafers, the entire line #1 stops manufacturing semiconductors or the number of processed wafers decreases in some cases. In this case, maintaining the plurality of litho cells 10 in the line #1 at the same timing allows cost reduction as a whole.

In view of the fact described above, in the seventh embodiment, a litho cell management server 317 is configured to receive information on the lines, for example, from the semiconductor factory management system 208 and create maintenance schedules for the consumables in the plurality of litho cells 10 on a line basis.

16.2 Configuration

Figure 51:
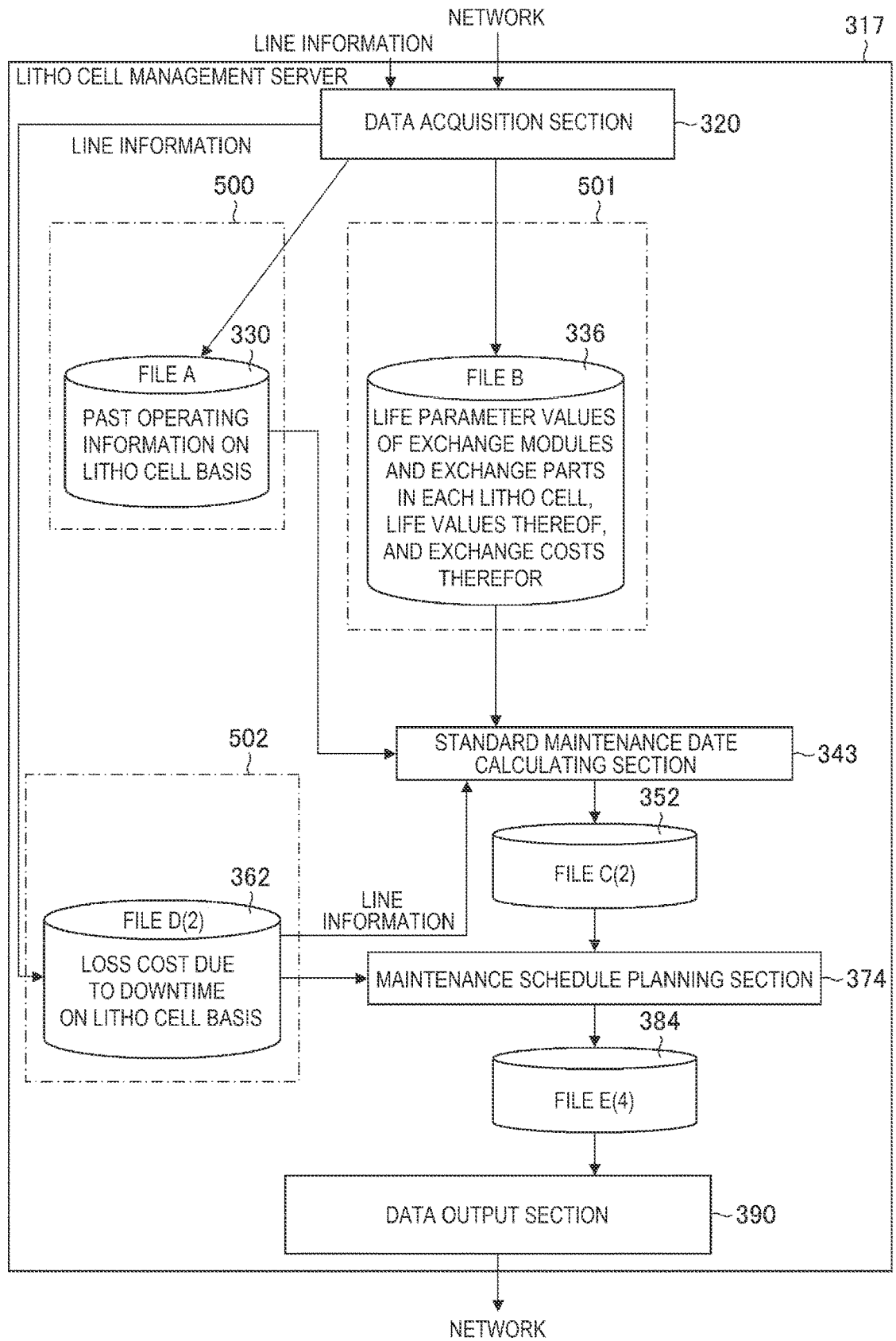
FIG. 51 is a block diagram showing the functions of a litho cell management server according to a seventh embodiment.

FIG. 51 is a block diagram showing the functions of the litho cell management server 317 according to the seventh embodiment. Differences between FIG. 51 and FIG. 7 will be described.

The litho cell management server 317 shown in FIG. 51 uses a file D(2) containing added information on the lines in place of the file D. The litho cell management server 317 includes a storage 362 configured to store the file D(2) in place of the storage 360 configured to store the file D. The litho cell management server 317 includes a standard maintenance date calculating section 343, which is configured to calculate the standard maintenance date by using data in the file D(2), in place of the standard maintenance date calculating section 340. The standard maintenance date calculating section 343 is configured to calculate the standard maintenance date for the exchange modules or the exchange parts (consumables) in a plurality of litho cells in a line #α combined with one another. The symbol "α" in the "line #α" is the line number. The symbol α is an integer that can range from 1 to β. The symbol β is the total number of lines.

The standard maintenance date calculating section 343 is configured to create a file C(2) containing data on the plurality of litho cells in the line #α in place of the file C. The litho cell management server 317 includes a storage 352 configured to store the file C(2) in place of the storage 350 configured to store the file C.

The litho cell management server 317 includes a maintenance schedule planning section 374 in place of the maintenance schedule planning section 370. The maintenance schedule planning section 374 is configured to plan a maintenance schedule for the consumables in the plurality of litho cells in the line #α combined with one another by using the data in the file C(2) and the data in the file D(2).

The maintenance schedule planning section 374 is configured to create a file E(4) containing data on the plurality of litho cells in the line #α in place of the file E. The litho cell management server 317 includes a storage 384 configured to store the file E(4) in place of the storage 380 configured to store the file E.

16.3 Operation

The data acquisition section 320 of the litho cell management server 317 is configured to acquire information on the lines from the semiconductor factory management system 208 and write the information on the lines as added information onto the file D(2).

FIG. 52 shows an example of table data in the file D(2). The file D(2) contains added information on the line number as the information on the lines and information on the loss cost due to the downtime per unit period that occurs in the plurality of litho cells in each of the lines, as compared with the table data in the file D shown in FIG. 17.

The standard maintenance date calculating section 343 shown in FIG. 51 is configured to calculate the standard maintenance dates for the consumables in the plurality of litho cells 10 in each line #α combined with one another and save the result of the calculation in the file C(2).

Figure 53:
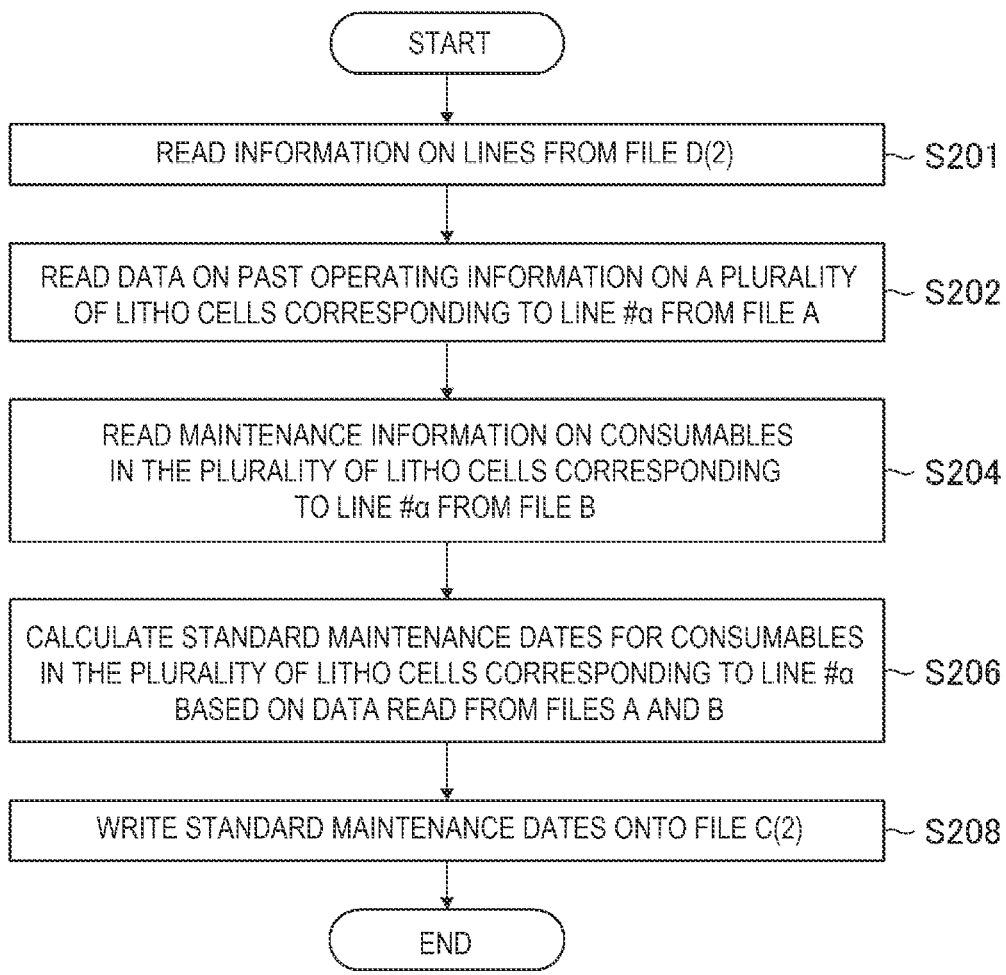
FIG. 53 is a flowchart showing an example of the contents of the processes carried out by a standard maintenance date calculating section.

FIG. 53 is a flowchart showing an example of the contents of the processes carried out by the standard maintenance date calculating section 343.

In step S201, the standard maintenance date calculating section 343 reads the information on the lines from the file D(2).

In step S202, the standard maintenance date calculating section 343 reads data on the past operating information on the plurality of litho cells corresponding to the line #α from the file A.

In step S204, the standard maintenance date calculating section 343 reads the maintenance information on the consumables in the plurality of litho cells corresponding to the line #α from the file B.

In step S206, the standard maintenance date calculating section 343 calculates the standard maintenance dates for the consumables in the plurality of litho cells corresponding to the line #α based on the data read from the files A and B.

In step S208, the standard maintenance date calculating section 343 writes the standard maintenance dates for the consumables in the line #α determined in step S206 onto the file C(2). After step S208, the flowchart in FIG. 53 is terminated.

The maintenance schedule planning section 374 is configured to optimize the maintenance schedule for the consumables in the plurality of litho cells in the line #α combined with one another and save the result of the calculation in the file E(4), as in the processes carried out by the maintenance schedule planning section 370 in FIG. 5. The maintenance schedule planning section 374 is configured to be capable of evaluating the cost benefit on a line basis and optimizing the maintenance schedule for each consumable.

The data output section 390 transmits the data in the file E(4) to the display terminal that is not shown or the semiconductor factory management system 208.

16.4 Effects and Advantages

According to the seventh embodiment, the maintenance schedule for all consumables provided in the plurality of litho cells in the same line relating to the series of wafer processing can be planned on a line basis, whereby the downtime is reduced, and the cost is reduced.

16.5 Variations

In each of the first to sixth embodiments, the processes to be carried out on a litho cell basis can be extended to processes carried out on a line basis. For example, in the seventh embodiment, the standard maintenance date may be calculated by using the data in the file F in addition to the data in the file A, as in the second embodiment. Further, in the seventh embodiment, the recipe information may be added, as in the third embodiment.

17. Eighth Embodiment

17.1 Configuration

Figure 54:
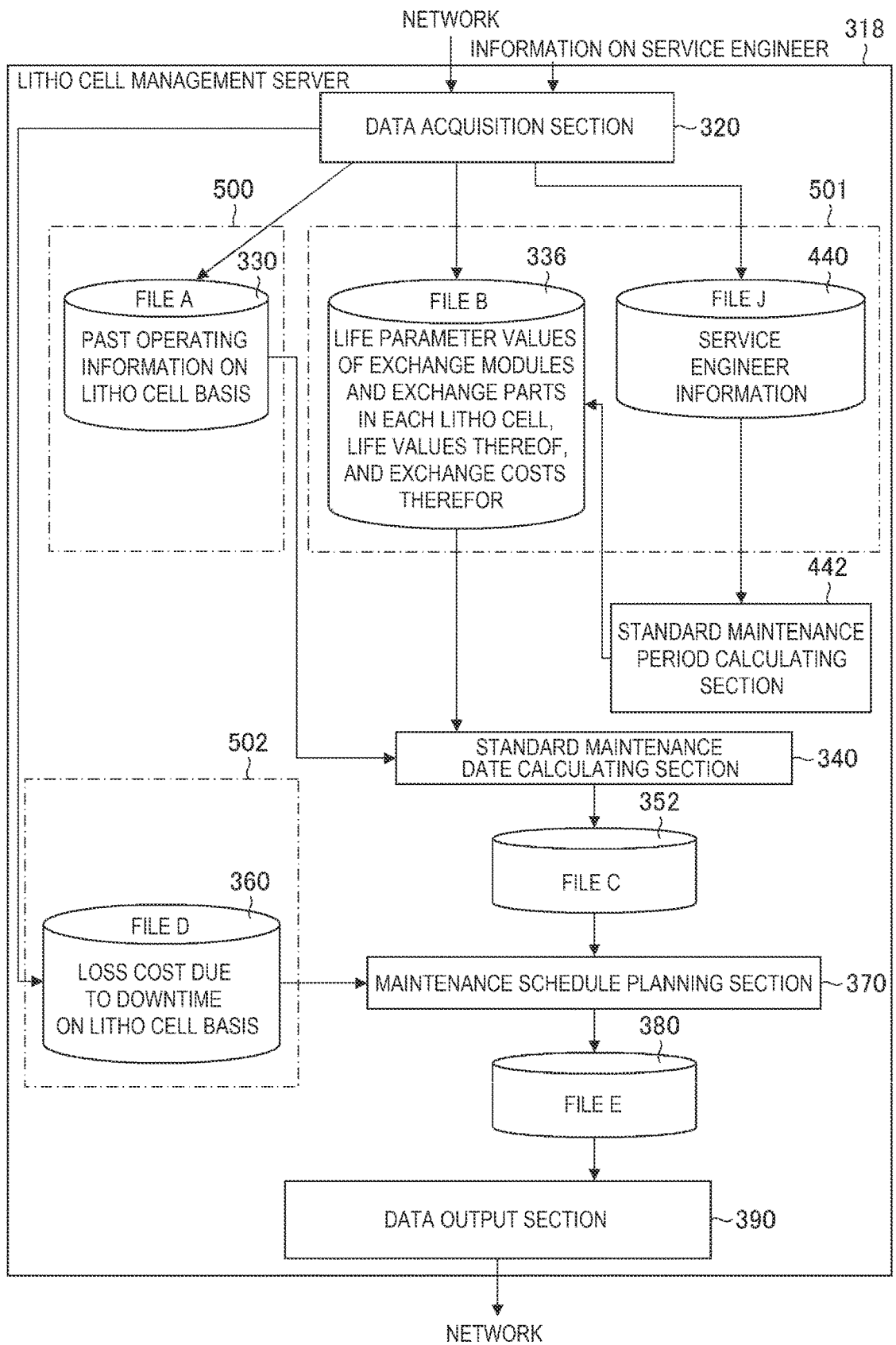
FIG. 54 is a block diagram showing the functions of a litho cell management server according to an eighth embodiment.

FIG. 54 is a block diagram showing the functions of a litho cell management server according to an eighth embodiment. Differences between FIG. 54 and FIG. 7 will be described. A litho cell management server 318 shown in FIG. 54 has an added function of calculating the standard maintenance period by using information on a service engineer who is responsible for certain maintenance work. The information on a service engineer is called "service engineer information." A file configured to save the service engineer information is called a "file J."

The litho cell management server 318 has the functions of creating and storing the file J and reading and writing information from and to the file J. The litho cell management server 318 includes a storage 440 configured to store the file J and a standard maintenance period calculating section 442 configured to calculate the standard maintenance period based on the service engineer information in the file J.

17.2 Operation

The data acquisition section 320 of the litho cell management server 318 is configured to acquire the service engineer information associated with each apparatus from the C/D apparatus management system 202, the exposure apparatus management system 204, and the laser apparatus management system 206 and write the acquired service engineer information onto the file J.

FIG. 55 shows an example of table data in the file J. A plurality of service engineers are registered for each of the C/D apparatus, the exposure apparatus, and the laser apparatus. In FIG. 55, identification reference characters #1, #2, . . . , #12 are used to identify the service engineers. The service engineers #1 to #4 are registered for the C/D apparatus. The service engineers #5 to #8 are registered for the exposure apparatus, and the service engineers #9 to #12 are registered for the laser apparatus. The case where four service engineers are registered for each of the apparatuses is presented by way of example, and the number of service engineers is not limited to a specific number.

A maintenance period coefficient γ and a maintenance possible region range L are assigned to each of the service engineers #1 to #12. The maintenance period coefficient γ assigned to the service engineer #k is referred to as γ(#k), and the maintenance possible region range L assigned to the service engineer #k is referred to as L(#k). The maintenance period coefficient γ is a coefficient representing the ratio of the maintenance period to an average maintenance period. The "average maintenance period" refers to an average maintenance period required for a service engineer having a standard skill to perform certain maintenance work. The maintenance period required for a service engineer to perform maintenance work is expressed by the product of a standard maintenance period and the maintenance period coefficient on a service engineer basis. For example, γ=1 represents that the maintenance period required for the service engineer is the average maintenance period. The maintenance period coefficient γ is a value representing the skill of each individual service engineer. The smaller the γ, the higher the skill, whereas the greater the γ, the lower the skill.

The maintenance possible region range L is configured to save information representing the range of a region where each service engineer can perform maintenance. When the maintenance possible region range L coincides with the region where a semiconductor factory is located, the service engineer associated with the maintenance possible region range L can perform maintenance in the semiconductor factory.

The standard maintenance period calculating section 442 shown in FIG. 54 is configured to select a service engineer who maintains each apparatus based on the table data in the file J and the region where the semiconductor factory is located. Since different service engineers are responsible for different regions, only certain service engineers can maintain consumables in the region where the semiconductor factory has been built. A service engineer who is responsible for actual work can thus be selected.

The standard maintenance period calculating section 442 is configured to calculate the standard maintenance period associated with the selected service engineer based on the product of the standard maintenance period in the table data in the file B and the maintenance period coefficient γ in the file J. The "average maintenance period" may be provided in the form of an initial value of the "standard maintenance period Tmhs(k,l,m)" in the file B shown in FIG. 12 by way of example.

The standard maintenance period calculating section 442 is configured to write the calculated value as the standard maintenance period onto the file B.

The following processes are the same as the processes in the first embodiment described with reference to FIG. 6.

FIG. 56 is a flowchart showing an example of the contents of the processes carried out by the standard maintenance period calculating section 442.

In step S222, the standard maintenance period calculating section 442 reads data on the service engineer information from the file J.

In step S224, the standard maintenance period calculating section 442 reads the standard maintenance periods for the consumables in the litho cell #k from the file B.

In step S226, the standard maintenance period calculating section 442 selects from the data in the file J a service engineer responsible for each apparatus in the litho cell in accordance with the region where the semiconductor factory is located.

In step S228, the standard maintenance period calculating section 442 calculates the product of the maintenance period coefficient γ associated with the service engineer in the file J and the standard maintenance period in the file B. That is, the standard maintenance period calculating section 442 calculates the standard maintenance period in the case where the selected service engineer performs the maintenance based on the product of the maintenance period coefficient γ, which is the parameter representing the skill of the service engineer, and the standard maintenance period in the file B.

In step S230, the standard maintenance period calculating section 442 writes the value calculated in step S228 as the standard maintenance period onto the file B.

The following processes are the same as the processes in the first embodiment.

17.3 Effects and Advantages

According to the eighth embodiment, in which the standard maintenance period is calculated in consideration of the parameter representing the skill of a service engineer, a maintenance schedule plan can be optimized with further higher accuracy.

17.4 Variation

As the information saved in the file J, for example, the maintenance timing range within which a service engineer performs maintenance may be saved in the file J. In this case, a service engineer whose standard maintenance date falls within the maintenance timing range may be selected, and the standard maintenance date may be calculated.

18. Combination of Embodiments

The configurations described in the first to eighth embodiments can be combined with each other as appropriate.

19. Computer Readable Medium on which Program is Recorded

A program containing instructions for causing a computer to function as the litho cell management server described in each of the embodiments described above can be recorded on an optical disk, a magnetic disk, or any other computer readable medium (tangible, non-transitory information recording medium), and the program can be provided in the form of the information recording medium. The program can be incorporated in the computer, and a processor in the computer can execute the instructions in the program to cause the computer to achieve the functions of the litho cell management server.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A maintenance management method for a lithography system, the method comprising:
    organizing operating information for each of lithography cells that are each an apparatus group formed of a set of apparatuses and form the lithography system configured to perform resist coating, exposure, and development and saving the operating information for each of the lithography cells;
    organizing maintenance information on consumables that are each a maintenance target in each of the apparatuses in the apparatus group for each of the lithography cells and saving the maintenance information on each of the consumables for each of the lithography cells;
    calculating a standard maintenance timing for each of the consumables for each of the lithography cells based on the operating information for each of the lithography cells and the maintenance information on the consumable for each of the lithography cells;
    creating a maintenance schedule plan for each of the consumables for each of the lithography cells for each of manufacturing lines, the manufacturing lines each including at least two of the lithography cells in which a same wafer is exposed, based on the standard maintenance timing for each of the consumables for each of the lithography cells, information on a downtime due to exchange of the consumable for each of the lithography cells, and information on a loss cost due to the downtime for each of the lithography cells or for each of the manufacturing lines, so as to reduce the downtime for each of the manufacturing lines; and
    outputting a result of the creation of the maintenance schedule plan.

2. The maintenance management method according to claim 1, wherein
    the operating information contains past operating data.

3. The maintenance management method according to claim 2, wherein
    the operating information contains future planned operating data.

4. The maintenance management method according to claim 1, wherein
    the lithography cell includes a coating/developing apparatus, an exposure apparatus, and a laser apparatus.

5. The maintenance management method according to claim 4, wherein
    the operating information contains a data acquisition date, and
    the operating information contains at least one of the number of processed wafers for each of the lithography cells, the number of exposure pulses in the exposure apparatus, the number of oscillation pulses in the laser apparatus, and pulse energy of pulsed laser light outputted from the laser apparatus.

6. The maintenance management method according to claim 5, wherein
    the operating information further contains recipe information representing an exposure condition corresponding to each resist material and each mask pattern.

7. The maintenance management method according to claim 1, wherein
    the maintenance information on each of the consumables for each of the lithography cells contains a life value, a standard maintenance period, an exchange cost, and a life parameter value for each of the consumables,
    the standard maintenance period is a downtime expected when the consumable is exchanged alone, and
    the life parameter value is a value of a life parameter configured to correlate with a life of the consumable.

8. The maintenance management method according to claim 7, further comprising:
    acquiring life estimating information containing information on a life monitoring parameter configured to correlate with the life of each of the consumables for each of the lithography cells;
    calculating an estimated life value of the consumable for each of the lithography cells based on the life estimating information; and
    saving data on the estimated life value as the life value.

9. The maintenance management method according to claim 7, further comprising:
    accepting input of a first maintenance date finalizing signal configured to finalize a first maintenance date in the created maintenance schedule plan; and
    resetting, based on the first maintenance date finalizing signal, the life parameter value of any of the consumables to be maintained on the finalized first maintenance date.

10. The maintenance management method according to claim 1, further comprising:
    acquiring a maintenance candidate date; and
    selecting from the consumables a consumable to be exchanged on the maintenance candidate date based on the acquired maintenance candidate date.

11. The maintenance management method according to claim 1, wherein
    the loss cost information is information on a loss cost that occurs per unit period when the lithography cell stops processing wafers.

12. The maintenance management method according to claim 1, wherein
    the loss cost information is information on a loss cost that occurs per unit period when the manufacturing line stops processing wafers.

13. The maintenance management method according to claim 1, further comprising
calculating a standard maintenance period for each of the consumables for each of the lithography cells and an exchange cost per unit life for the consumable based on the operating information for each of the lithography cells and the maintenance information on the consumable for each of the lithography cells.

14. The maintenance management method according to claim 13, wherein
the creation of the maintenance schedule plan includes creating the maintenance schedule plan for the consumables for each of the lithography cells in such a way that an increased cost due to advancement of an exchange date on which any of the consumables is exchanged to a date earlier than a standard maintenance date indicated by the standard maintenance timing to align exchange dates of a plurality of the consumables for each of the lithography cells with one another is smaller than a reduced cost resulting from a decrease in the downtime in the lithography cell.

15. The maintenance management method according to claim 1, wherein
a parameter representing a skill of a service engineer is used to calculate the standard maintenance timing.

16. The maintenance management method according to claim 1, further comprising
receiving the operating information for each of the lithography cells and the maintenance information on the consumables via a network.

17. A maintenance management apparatus for a lithography system, the apparatus comprising a processor communicatively coupled to a memory, the processor configured to:
organize operating information for each of lithography cells that are each an apparatus group formed of a set of apparatuses and form the lithography system configured to perform resist coating, exposure, and development, and to save the operating information for each of the lithography cells;
organize maintenance information on consumables that are each a maintenance target in each of the apparatuses in the apparatus group for each of the lithography cells and save the maintenance information on each of the consumables for each of the lithography cells;
calculate a standard maintenance timing for each of the consumables for each of the lithography cells based on the operating information for each of the lithography cells and the maintenance information on the consumable for each of the lithography cells;
create a maintenance schedule plan for each of the consumables for each of the lithography cells for each of manufacturing lines, the manufacturing lines each including at least two of the lithography cells in which a same wafer is exposed, based on the standard maintenance timing for each of the consumables for each of the lithography cells, information on a downtime due to exchange of the consumable for each of the lithography cells, and information on a loss cost due to the downtime for each of the lithography cells or for each of the manufacturing lines, so as to reduce the downtime for each of manufacturing lines; and
output a result of the creation of the maintenance schedule plan.

18. The maintenance management apparatus according to claim 17, wherein
the processor further calculates a standard maintenance period for each of the consumables for each of the lithography cells and an exchange cost per unit life for the consumable based on the operating information for each of the lithography cells and the maintenance information on the consumable for each of the lithography cells.

19. The maintenance management apparatus according to claim 17, wherein the processor is further configured to:
acquire life estimating information containing information on a life monitoring parameter configured to correlate with a life of each of the consumables for each of the lithography cells; and
calculate an estimated life value of the consumable for each of the lithography cells based on the life estimating information.

20. A non-transitory computer readable medium on which a program including instructions is recorded, the medium causing a processor, when the processor executes the instructions in the program, to execute functions of
organizing operating information for each of lithography cells that are each an apparatus group formed of a set of apparatuses and form a lithography system configured to perform resist coating, exposure, and development and saving the operating information for each of the lithography cells;
organizing maintenance information on consumables that are each a maintenance target in each of the apparatuses in the apparatus group for each of the lithography cells and saving the maintenance information on each of the consumables for each of the lithography cells;
calculating a standard maintenance timing for each of the consumables for each of the lithography cells based on the operating information for each of the lithography cells and the maintenance information on the consumable for each of the lithography cells;
creating a maintenance schedule plan for each of the consumables for each of the lithography cells for each of manufacturing lines, the manufacturing lines each including at least two of the lithography cells in which a same wafer is exposed, based on the standard maintenance timing for each of the consumables for each of the lithography cells, information on a downtime due to exchange of the consumable for each of the lithography cells, and information on a loss cost due to the downtime for each of the lithography cells or for each of the manufacturing lines, so as to reduce the downtime for each of manufacturing lines; and
outputting a result of the creation of the maintenance schedule plan.

* * * * *